(12) United States Patent
Lim et al.

(10) Patent No.: US 11,933,476 B2
(45) Date of Patent: Mar. 19, 2024

(54) LUMINAIRES AND COMPONENTS THEREOF

(71) Applicant: CREE LIGHTING USA LLC, Racine, WI (US)

(72) Inventors: Jin Hong Lim, Morrisville, NC (US); Mark Lackey, Racine, WI (US); Rob Sanchez, Racine, WI (US); Charles Draper, Racine, WI (US); Daniel Van Epps, Racine, WI (US); Brad Thomas, Racine, WI (US)

(73) Assignee: CREE LIGHTING USA LLC, Racine, WI (US)

( * ) Notice: Subject to any disclaimer, the term of this patent is extended or adjusted under 35 U.S.C. 154(b) by 0 days.

(21) Appl. No.: 17/639,445

(22) PCT Filed: Sep. 2, 2020

(86) PCT No.: PCT/US2020/049036
§ 371 (c)(1),
(2) Date: Mar. 1, 2022

(87) PCT Pub. No.: WO2021/046108
PCT Pub. Date: Mar. 11, 2021

(65) Prior Publication Data
US 2022/0325871 A1    Oct. 13, 2022

Related U.S. Application Data

(63) Continuation of application No. 16/786,619, filed on Feb. 10, 2020, now Pat. No. 10,976,023, and a
(Continued)

(51) Int. Cl.
*F21V 13/04* (2006.01)
*F21V 5/04* (2006.01)
(Continued)

(52) U.S. Cl.
CPC .............. *F21V 13/04* (2013.01); *F21V 5/045* (2013.01); *F21V 5/08* (2013.01); *F21V 7/0091* (2013.01);
(Continued)

(58) Field of Classification Search
CPC ............. F21Y 2105/10; F21Y 2105/12; F21Y 2105/14; F21Y 2105/16; F21Y 2105/18;
(Continued)

(56) References Cited

U.S. PATENT DOCUMENTS 8,525,862 B2    9/2013  Kang et al.
9,683,716 B2    6/2017  Wang
(Continued)

FOREIGN PATENT DOCUMENTS

DE    102011078287 A1 *  1/2013  .............. F21V 13/04
DE    202014100784 U1 *  4/2014  ................ F21V 5/08
(Continued)

OTHER PUBLICATIONS

International Search Report and Written Opinion corresponding to PCT/US2020/049036, dated Nov. 19, 2020, 7 pages.

*Primary Examiner* — Erin Kryukova
(74) *Attorney, Agent, or Firm* — J. Clinton Wimbish; Maynard Nexsen PC

(57) ABSTRACT

Optical lenses and associated luminaire are described herein. In one aspect, a lens comprises a light receiving side comprising grooves for receiving light emitting diodes, the grooves defined by a central refractive region and walls comprising total internal reflection faces; and a light extraction side opposite the light receiving side, the light extraction side comprising refractive extraction surfaces, total internal reflection extraction surfaces, or combinations thereof. In some embodiments, luminaire comprises an array
(Continued)

of light emitting diodes; and the lens positioned over the array of light emitting diodes.

20 Claims, 53 Drawing Sheets

Related U.S. Application Data continuation of application No. 16/558,964, filed on Sep. 3, 2019, now Pat. No. 11,092,313.

(51) Int. Cl.
| | | |
|---|---|---|
| *F21V 5/08* | (2006.01) | |
| *F21V 7/00* | (2006.01) | |
| *F21Y 105/18* | (2016.01) | |
| *F21Y 115/10* | (2016.01) | |
| *F21V 3/00* | (2015.01) | |

(52) U.S. Cl.
CPC ............. *F21V 3/00* (2013.01); *F21Y 2105/18* (2016.08); *F21Y 2115/10* (2016.08)

(58) Field of Classification Search
CPC ............. F21Y 2103/10; F21Y 2107/20; F21Y 2107/30; F21V 5/007; F21V 5/08; F21V 5/04; F21V 5/045; F21V 7/0091; F21V 13/04; F21V 3/00
See application file for complete search history.

(56) References Cited

U.S. PATENT DOCUMENTS

| | | | |
|---|---|---|---|
| 10,948,159 B2* | 3/2021 | Yin | F21V 13/04 |
| 2009/0279311 A1* | 11/2009 | Yu | F21V 5/045 |
| | | | 362/310 |
| 2009/0296388 A1* | 12/2009 | Wu | G02B 6/0018 |
| | | | 362/235 |
| 2010/0296283 A1* | 11/2010 | Taskar | F21V 5/04 |
| | | | 362/346 |
| 2012/0081897 A1 | 4/2012 | Ogawa et al. | |
| 2015/0043213 A1* | 2/2015 | Zhang | F21V 29/70 |
| | | | 362/329 |
| 2015/0077987 A1 | 3/2015 | Zhang | |
| 2015/0176823 A1* | 6/2015 | Leshniak | F21V 29/77 |
| | | | 362/249.03 |
| 2016/0320025 A1* | 11/2016 | Ebner | F21V 5/00 |
| 2018/0156393 A1* | 6/2018 | Seki | G02B 19/0028 |
| 2018/0220508 A1* | 8/2018 | Pilat | F21S 8/061 |
| 2018/0292071 A1* | 10/2018 | Tarsa | F21V 5/08 |
| 2019/0170325 A1* | 6/2019 | Lai | F21S 43/40 |
| 2019/0331314 A1 | 10/2019 | Engelen | |
| 2020/0400285 A1* | 12/2020 | He | G02B 19/0061 |
| 2021/0018159 A1* | 1/2021 | Vredenborg | F21V 5/005 |

FOREIGN PATENT DOCUMENTS

| | | | |
|---|---|---|---|
| JP | 2018049748 A | * | 3/2018 |
| KR | 101762585 B1 | * | 8/2017 |

* cited by examiner

Extraction to left direction

LUMINAIRES AND COMPONENTS THEREOF

RELATED APPLICATION DATA

This application is a U.S. National Phase of PCT/US2020/049036, filed Sep. 2, 2020, which claims priority pursuant to Section 8 of the Patent Cooperation Treaty to U.S. patent application Ser. No. 16/558,964 filed Sep. 3, 2019 and U.S. patent application Ser. No. 16/786,619 filed Feb. 10, 2020, each of which is incorporated herein by reference in its entirety.

FIELD

The present invention relates luminaires and optical components thereof.

BACKGROUND

Traditional high bay luminaires found in retail stores typically use large light source sizes, such as hundreds of mid-power light emitting diodes ("LEDs"), in order to illuminate large areas of a retail floor space. While LED arrays are very efficient, they often suffer from pixelation, where bright points of light from individual LEDs are observed instead of a more comfortable uniform lighted surface typically associated with incandescent or fluorescent lighting. Conventional high bay luminaires designs have struggled to produce pixelation-free performance while maintaining high efficacy and generating target distributions. Accordingly, improved luminaires and associated optical components, such as lenses are needed.

SUMMARY

In one aspect, optical components of luminaires are described herein. In some embodiments, for example, a lens comprises a light receiving side comprising grooves for receiving light emitting diodes, the grooves defined by a central refractive region and walls comprising total internal reflection faces. The lens also comprises a light extraction side opposite the light receiving side, the light extraction side comprising refractive extraction surfaces, total internal reflection extraction surfaces, or combinations thereof. In some embodiments, the grooves are arranged in a concentric format, linear format or combinations thereof.

In another aspect, a lens comprises a light receiving side comprising grooves for receiving light emitting diodes, the grooves defined by a central refractive region and walls comprising total internal reflection faces. The lens also comprises a light extraction side opposite the light receiving side, wherein an axis bisecting the central refractive region forms an angle with a vertical axis of the lens ranging from greater than zero degrees to less than 90 degrees. In some embodiments, the angle is from 5 to 60 degrees. The light extraction side can comprise refractive extraction surfaces, total internal reflection extraction surfaces, or combinations thereof. In some embodiments, the grooves are arranged in one or various linear formats.

In another aspect, a lens comprises a light receiving side comprising grooves for receiving light emitting diodes, the grooves defined by refractive walls. The lens also comprises a light extraction side opposite the light receiving side, the light extraction side comprising refractive extraction surfaces diverging light from a central axis of the lens. In some embodiments, the refractive walls of the grooves work in conjunction with the refractive extraction surfaces to diverge light from the central axis of the lens.

In another aspect, luminaires are described herein. A luminaire comprises an array of light emitting diodes, and a lens positioned over the array of light emitting diodes. The lens comprises a light receiving side comprising grooves for receiving the light emitting diodes, the grooves defined by a central refractive region and walls comprising total internal reflection faces. The lens also comprises a light extraction side opposite the light receiving side, the light extraction side comprising refractive extraction surfaces, total internal reflection extraction surfaces, or combinations thereof. In some cases, the refractive extraction surfaces and the total internal reflection extraction surfaces redirect the light received from the central refractive region and the total internal reflection faces to provide a lighting distribution of the luminaire.

In another aspect, the lens of the luminaire can comprise a light receiving side comprising grooves for receiving light emitting diodes, the grooves defined by a central refractive region and walls comprising total internal reflection faces. The lens also comprises a light extraction side opposite the light receiving side, wherein an axis bisecting the central refractive region forms an angle with a vertical axis of the lens ranging from greater than zero degrees to less than 90 degrees. In some embodiments, the angle is from 5 to 60 degrees. The light extraction side can comprise refractive extraction surfaces, total internal reflection extraction surfaces, or combinations thereof. In some embodiments, the grooves are arranged in one or various linear formats.

In a further aspect, the lens of the luminaire can comprise a light receiving side comprising grooves for receiving the light emitting diodes, the grooves defined by refractive walls. The lens also comprises a light extraction side, the light extraction side comprising refractive extraction surfaces diverging light from a central axis of the lens.

In some embodiments, the luminaire further comprises a diffuser positioned over the lens. The lighting distribution can in some instances have a uniform luminance over the diffuser. The luminaire can further comprise a glare shield in some embodiments.

These and other embodiments are further described in the detailed description which follows.

DETAILED DESCRIPTION

Figure 1A:
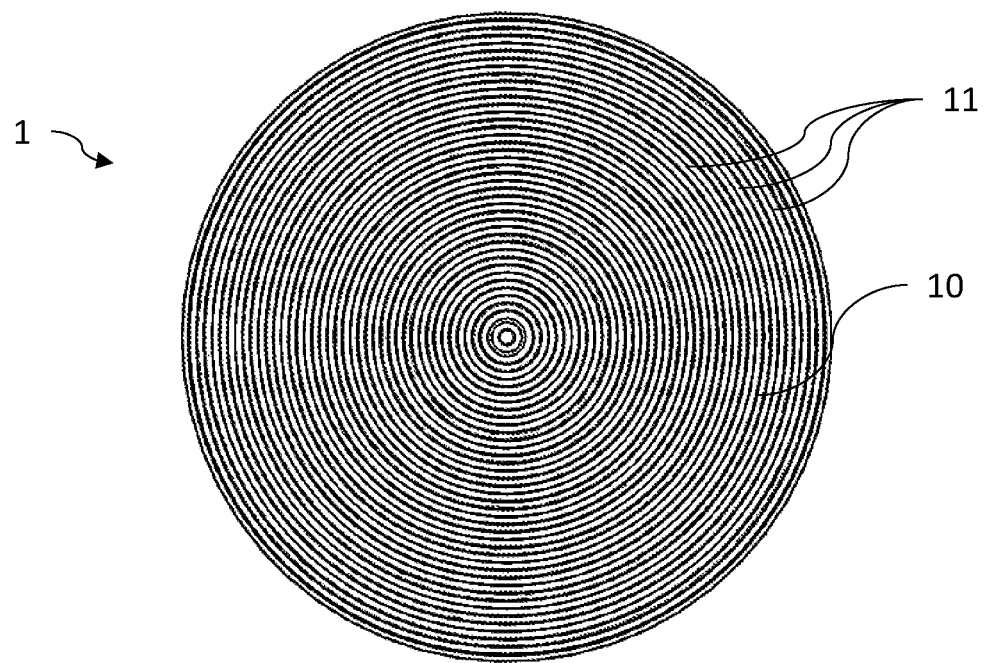
FIG. 1A is a plan view of a light receiving side of a lens having concentric grooves.

Embodiments described herein can be understood more readily by reference to the following detailed description, examples, and figures. Elements, apparatus, and methods described herein, however, are not limited to the specific embodiments presented in the detailed description, examples, and figures. It should be recognized that these embodiments are merely illustrative of the principles of this disclosure. Numerous modifications and adaptations will be readily apparent to those of skill in the art without departing from the spirit and scope of this disclosure.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "top" or "bottom" or "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an" and "the" are intended to include the plural forms as well, unless the context clearly indicates otherwise.

It will be further understood that the terms "comprises," "comprising," "having," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In addition, all ranges disclosed herein are to be understood to encompass any and all subranges subsumed therein. For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9.

All ranges disclosed herein are also to be considered to include the end points of the range, unless expressly stated otherwise. For example, a range of "between 5 and 10" or "from 5 to 10" or "5-10" should generally be considered to include the end points 5 and 10.

I. Lenses

In one aspect, optical components of luminaires are described herein. In some embodiments, for example, a lens comprises a light receiving side comprising grooves for receiving light emitting diodes, the grooves defined by a central refractive region and walls comprising total internal reflection faces. The lens also comprises a light extraction side opposite the light receiving side, the light extraction side comprising refractive extraction surfaces, total internal reflection extraction surfaces, or combinations thereof. In some embodiments, the grooves are arranged in a concentric format, linear format or combinations thereof.

Lenses described herein can be formed of any light transmissive material consistent with the objectives of this disclosure. In some embodiments, the lens is formed of glass or radiation transmissive polymeric material. Suitable radiation transmissive polymeric materials include acrylics, polycarbonates, polystyrene, COPs (Cyclic Olefin Polymers), COCs (Cyclic Olefin Copolymers), nylons, silicones and the like.

Figure 1B:
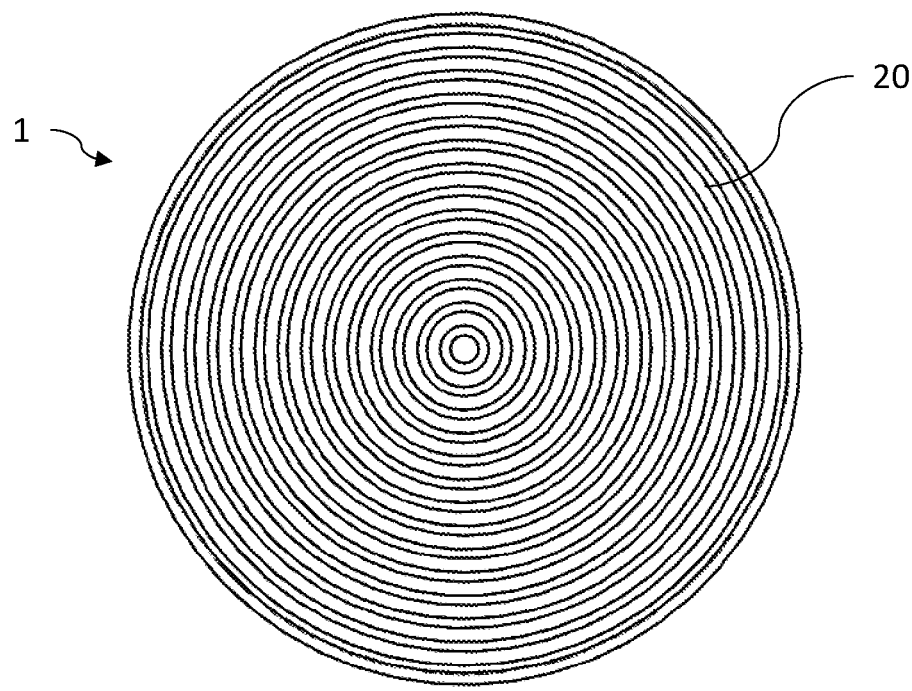
FIG. 1B is a plan view of a light extraction side of the lens in FIG. 1A.
Figure 1C:
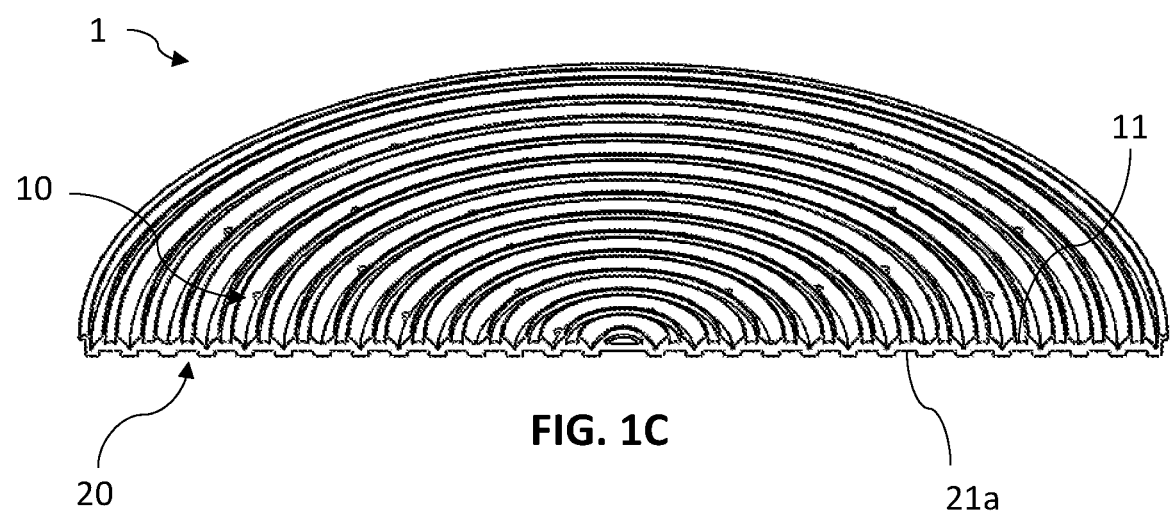
FIG. 1C is a cross-sectional perspective view of lens in FIG. 1A.

Turning now to specific features, the lens comprises a light receiving side and an opposite light extraction side. FIG. 1A illustrates a light receiving side 10 of lens 1 according to one embodiment, while FIG. 1B illustrates the light extraction side 20 of the lens 1. Similarly, FIG. 1C provides a perspective cross-sectional view of the lens 20 of FIGS. 1A-1B. The lens can have a continuous surface over the diameter of the lens, as shown in FIGS. 1A-1C. Alternatively, the lens can have a central aperture, such as central aperture 24 shown in FIG. 15.

The light receiving side comprises grooves for receiving light emitting diodes (LEDs). The grooves can be arranged in any format not inconsistent with the objectives of this disclosure. The grooves can exhibit an isotropic or anisotropic arrangement over the light receiving side of the lens. For example, the grooves can be arranged in a concentric format on the light receiving side of the lens, as illustrated in FIGS. 1A and 1C. The number of and dimensions of grooves 11 can be selected according to various considerations including, but not limited to, size and/or number of the LEDs and the desired lighting distribution provided by the lens.

Figure 2A:
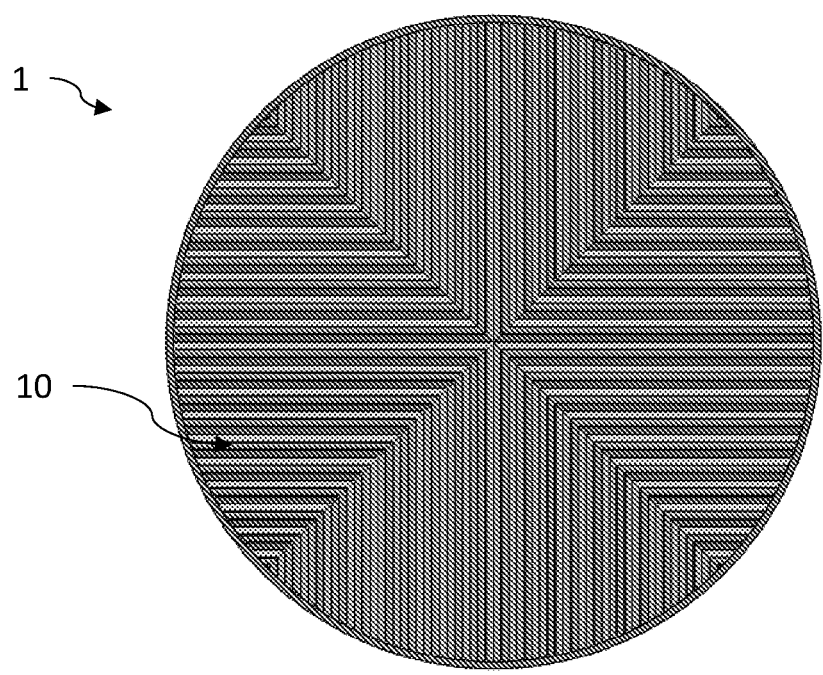
FIG. 2A is a plan view of a light receiving side of a lens having grooves arranged in a recti-linear format.
Figure 2B:
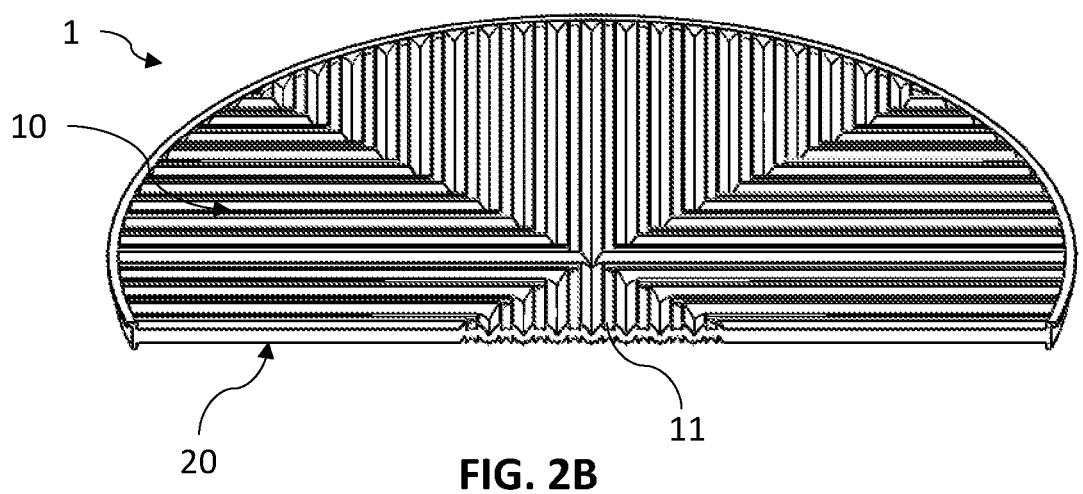
FIG. 2B is a cross-sectional perspective view of the lens in FIG. 2A
Figure 2C:
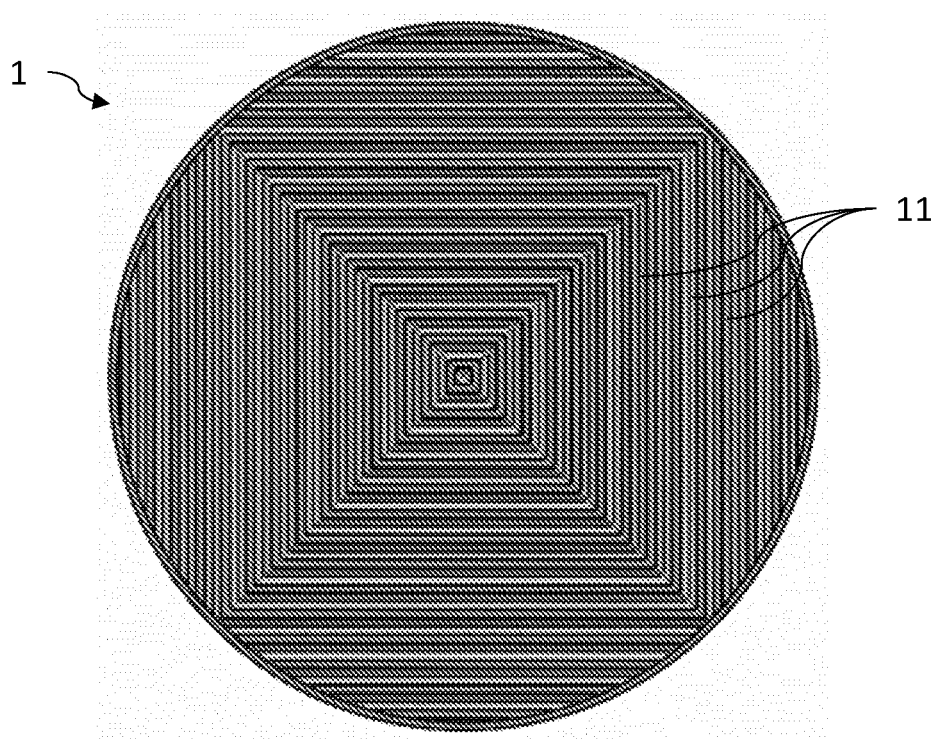
FIG. 2C is a plan view of a light receiving side of a lens having grooves arranged in another recti-linear format.
Figure 2D:
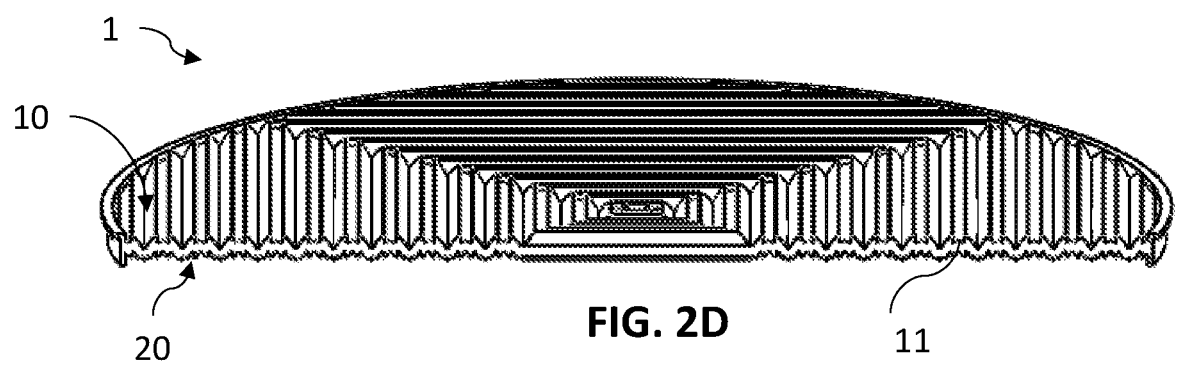
FIG. 2D is a cross-sectional perspective view of the lens in FIG. 2C.

In some embodiments, the grooves are arranged in a linear format. In some cases, the grooves are arranged in a rectilinear format. FIGS. 2A and 2C show a light receiving side 10 of lens 1 having grooves 11 arranged in different linear formats according to some embodiments. As illustrated in FIGS. 2A and 2C, radial sections of the light receiving surface can exhibit differing linear arrangements of the grooves. FIG. 2B and FIG. 2D are cross-sectional perspective views of the lens in FIGS. 2A and 2C, respectively. The linearly arranged grooves can be arranged in two axes with an angle between 0 and 90 degrees.

Figure 2E:
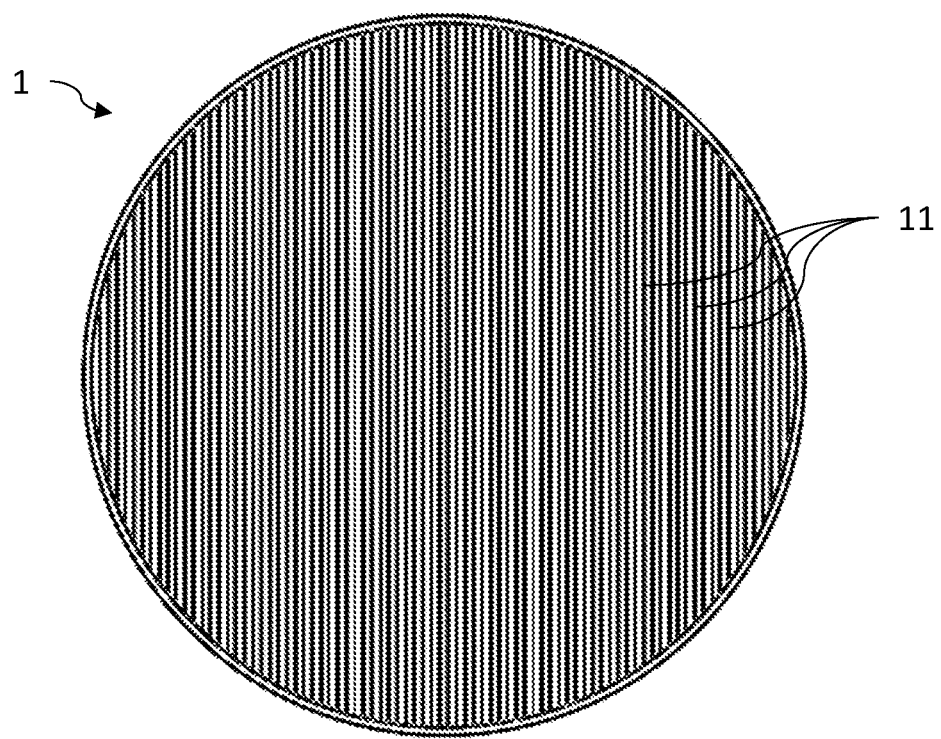
FIG. 2E is a plan view of a light receiving side of a lens having grooves arranged in a linear format.
Figure 2F:
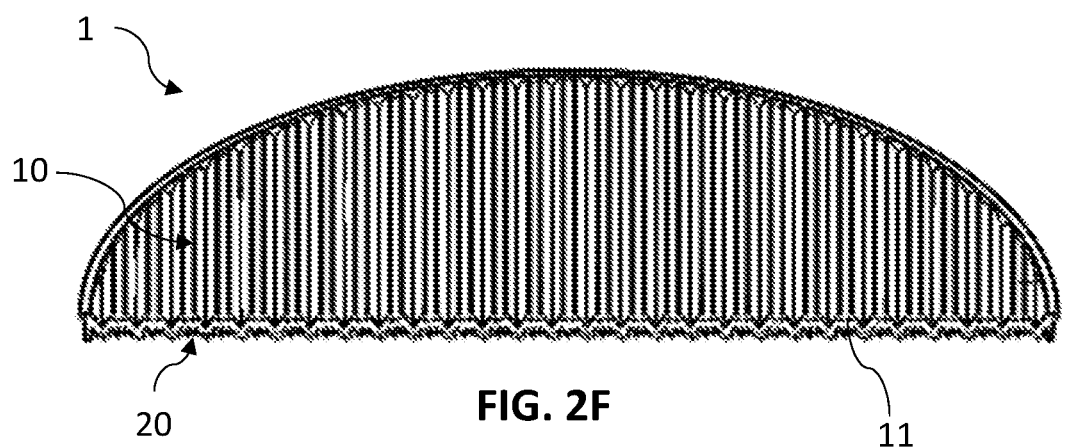
FIG. 2F is a cross-sectional perspective view of the lens in FIG. 2E.

FIGS. 2E and 2F shows an exemplary embodiment of grooves arranged linearly in only one direction, along with extraction facets in parallel.

In further embodiments, radial sections of the light receiving surface can comprise any combination of concentric grooves and linear grooves. In some embodiments, for example, half of the light receiving surface comprises concentric grooves and the remaining half comprises linear grooves.

Figure 3A:
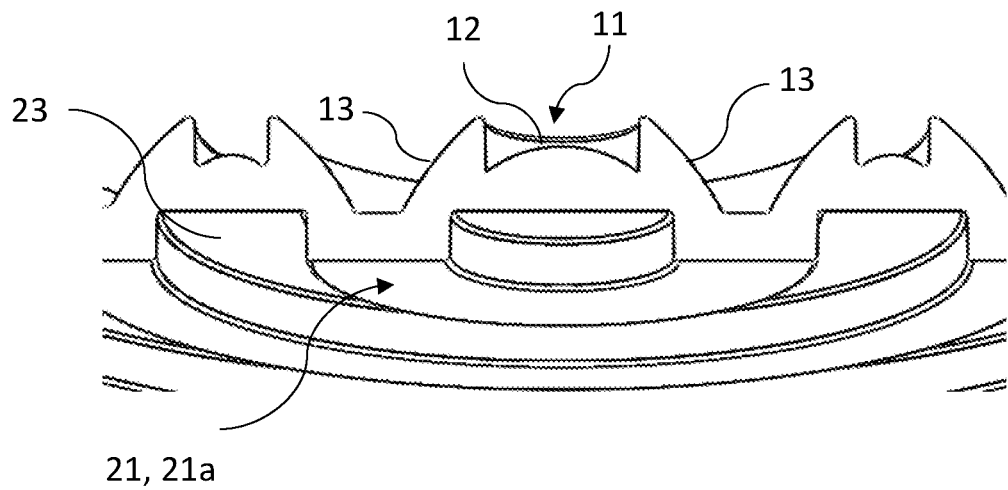
FIG. 3A is a cross-sectional view of an exemplary narrow light distribution lens having a light receiving side and a light extraction side.
Figure 3B:
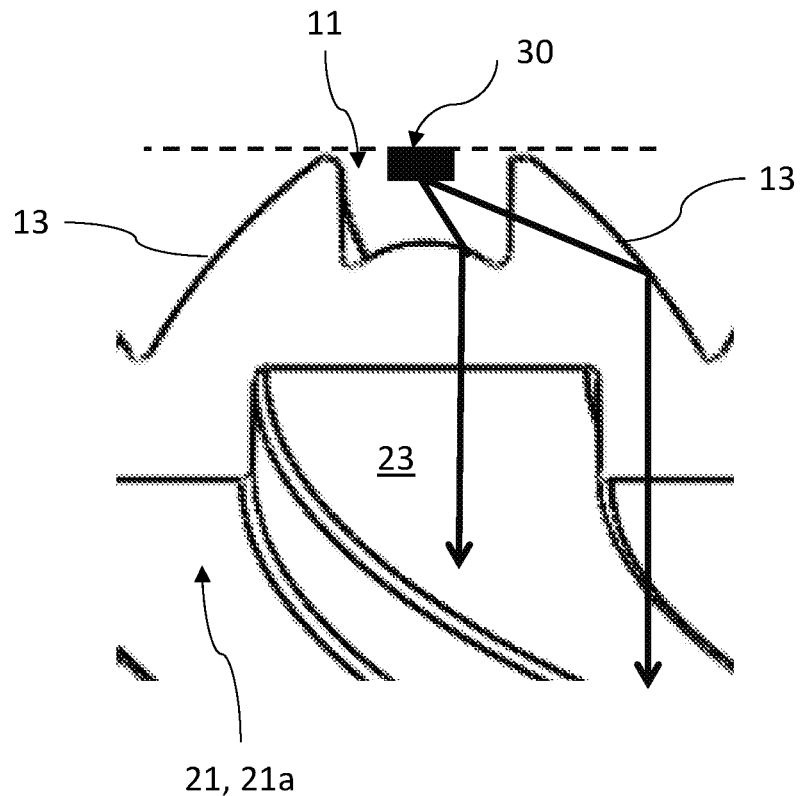
FIG. 3B is a cross-sectional view of the lens in FIG. 3A showing light extractions in collimated or narrow angles.
Figure 3C:
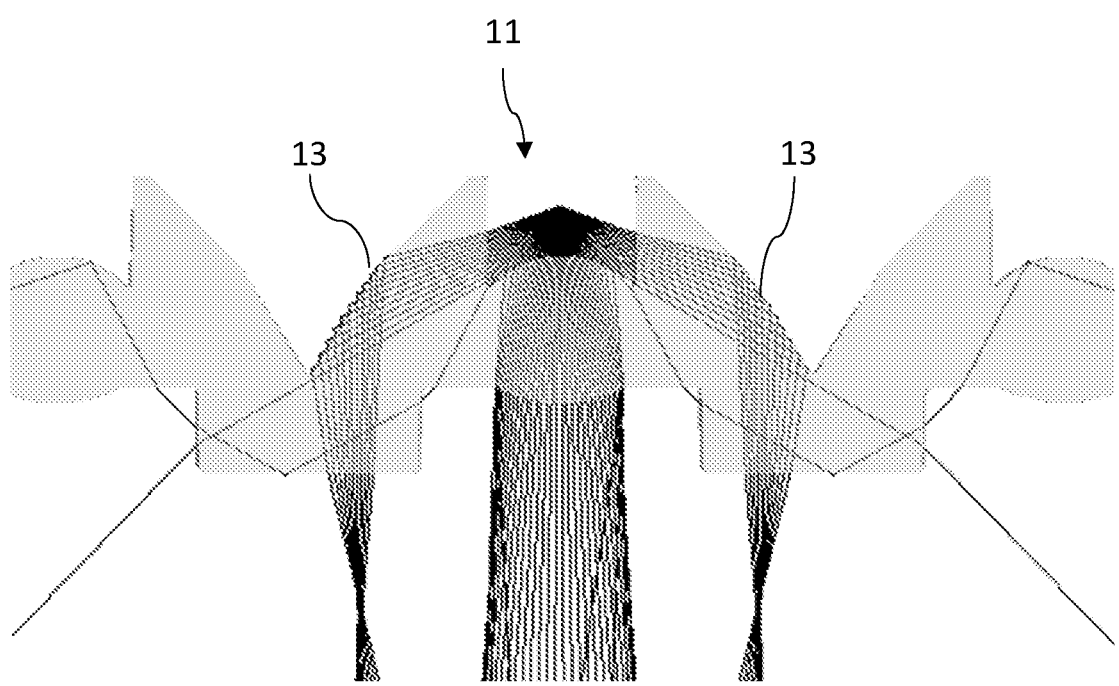
FIG. 3C is a rayfan of the lens in FIG. 3A illustrating the central refractive region and TIR faces directing light received from the LEDs in a direction parallel to the central vertical axis of the lens.

The grooves are defined by a central refractive region and walls comprising total internal reflection (TIR) faces. The central refractive region can have any desired surface profile. As described further herein, the central refractive region can direct light received by the lens in direction parallel to a central vertical axis of the lens. In some embodiments, the central refractive region comprises a convex surface. In addition to the central refractive region, the grooves include walls comprising TIR faces. In some embodiments, the TIR faces also direct light received by the lens in a direction parallel to the central vertical axis of the lens. In this way, light emitting from the LEDs is directed to the light extraction side of the lens comprising the refractive extraction surfaces, total internal reflection extraction surfaces or combinations thereof. FIG. 3C is a rayfan illustrating the central refractive region and TIR faces directing light received from the LEDs in a direction parallel to the central vertical axis of the lens. Moreover, FIGS. 3A-6B show different lenses with grooves 11 having central refractive regions 12 and walls comprising TIR surfaces 13, according to some embodiments.

As detailed herein, the light extraction side is opposite the light receiving side. The light extraction side comprises refractive extraction surfaces, total internal reflection (TIR) extraction surfaces, or combinations thereof. In some embodiments, the light extraction side comprises facets including the TIR extraction surfaces. The facets can have any desired geometry and/or dimensions. Facet geometry and/or dimensions, for example, can be selected according to the desired lighting distribution from the lens, such as a narrow, wide, medium, or asymmetric lighting distribution. In some embodiments, adjacent facets have the same geometry and/or dimensions, including width and height. In other embodiments, adjacent facets have differing geometry and/or dimensions, including width and height. By changing geometry and/or dimensions of the facts and, concomitantly, the angles of the refractive extractions surfaces and/or TIR extraction surfaces, the desired light distribution pattern can be obtained. In some embodiments, the facets comprise triangular cross-sections or splined shaped cross-sections. One or more surfaces defining the facets can comprise total internal reflection (TIR) extraction surfaces. The angles of the TIR extraction surfaces 22 are different in each of FIGS. 3A-6B, resulting in differing lighting distributions.

Figure 4A:
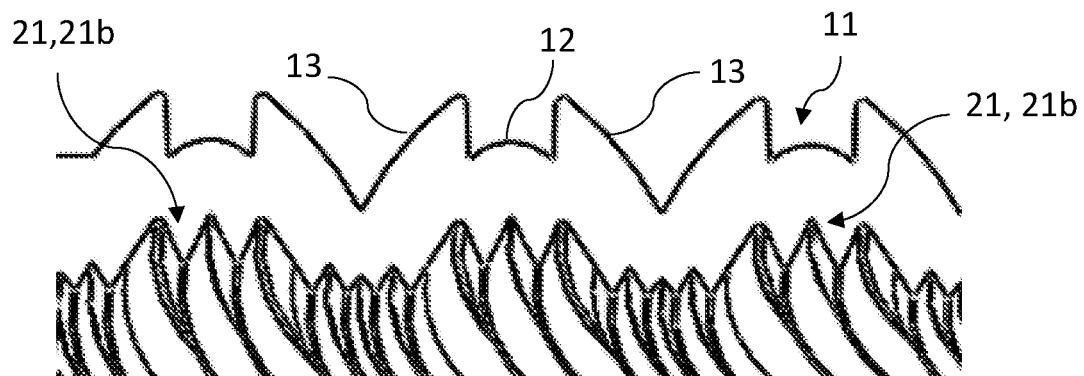
FIG. 4A is a cross-sectional view of an exemplary wide light distribution lens having a light receiving side and a light extraction side.
Figure 5A:
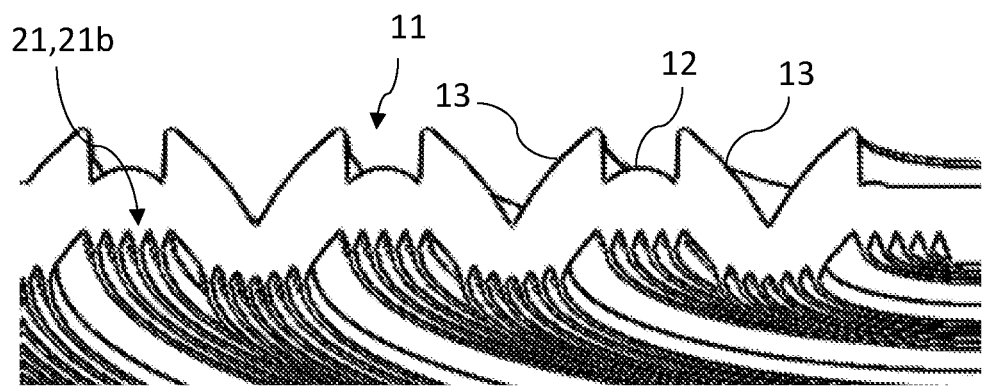
FIG. 5A is a cross-sectional view of an exemplary medium light distribution lens having a light receiving side and a light extraction side.
Figure 6A:
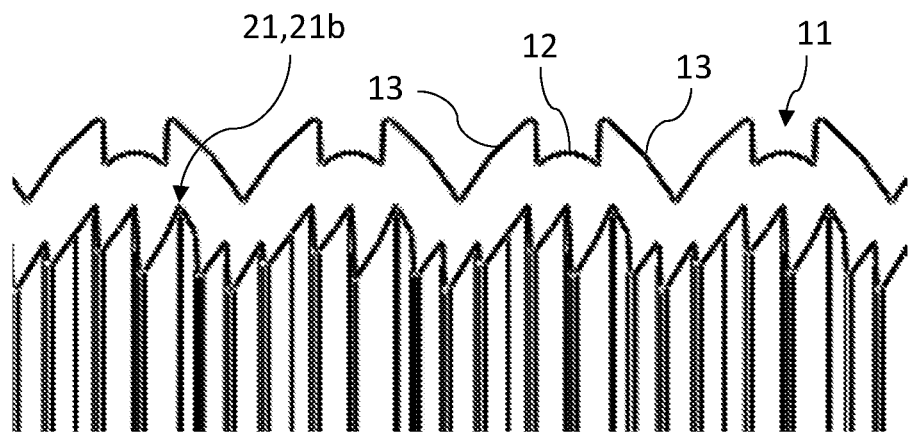
FIG. 6A is a cross-sectional view of an exemplary asymmetric light distribution lens having a light receiving side and a light extraction side.

As described further herein, the facets work in conjunction with the grooves to provide the desired lighting distribution from the lens. In some embodiments, adjacent grooves comprise the same number of facets on the light extraction side of the lens. Alternatively, adjacent grooves comprise differing numbers of facets on the light extraction side. Facet geometry can also be the same or differ across the grooves. Facets can be concentric or parallel to one another. In some embodiments, radial sections of the light extraction side can have facets having concentric and/or parallel relationships. Facets can also exhibit a symmetric or asymmetric arrangement relative to one another. FIGS. 3A, 4A and 5A, for example, exhibit a symmetric facet arrangement, such as a rotationally, symmetric facet arrangement, while FIG. 6A illustrates a linear arrangement of grooves for an asymmetric distribution.

As illustrated in FIGS. 3B, 4B, 5B, and 6B, light emitted from an LED 30 positioned proximate or in groove 11 contacts both the central refractive regions 12 and walls forming groove 11. In some embodiments, light rays contacting the central refractive region 12 are refracted by the central refractive region 12 and directed toward the refractive extraction surfaces 23, towards the TIR extraction surfaces 22, or to both. Light rays also contact total internal reflection (TIR) surfaces 13 of the groove walls. The TIR surfaces 13 direct the light rays towards the light extraction side 20 of lens 1. Thus, in some instances, the central refractive region and total internal reflection faces direct light received by the lens to the refractive extraction surfaces and the total internal reflection extraction surfaces. In some embodiments, the central refractive region and the total internal reflection faces can direct light received by the lens in a direction parallel to a central vertical axis of the lens. In some cases, the central vertical axis of the lens is a collimation axis. However, the lens is not limited to directing light in a direction parallel to the central vertical axis, but, as shown for example in FIGS. 4B, 5B, and 6B, can also direct the received light towards the light extraction side in a direction angled away from the central vertical axis.

As previously discussed, the angle of light emitted from the light extraction side 20 of lens 1 can be controlled by the geometry and spacing of the refractive extraction surfaces and/or facets 21 comprising TIR extraction surfaces. In FIGS. 3A and 3B, for example, a lens is illustrated for providing a narrow lighting distribution pattern. Light emitted from LED 30 contacts central refractive region 12, where the light is refracted in a direction approximately parallel to a central vertical axis of the lens. Light emitted from LED 30 also contacts the walls of the groove 11, and is reflected by the TIR reflection faces 13 in a direction approximately parallel to a central vertical axis of the lens. FIG. 3C is a rayfan illustrating the central refractive region and TIR faces directing light received from the LEDs in a direction parallel to the central vertical axis of the lens. The refracted and reflected light from LED 30 is emitted from refractive extraction surfaces 21a,23 of the light extraction side to provide the desired narrow lighting distribution. In some embodiments, the lighting distribution exhibits a full width at half maximum intensity of 60 degrees to 80 degrees. This narrow lighting distribution may also satisfy a spacing criterion ("SC") of 0.7 to 1.2 when the lens is part of a luminaire mounted over a workplane. Spacing criterion is defined as the ratio of luminaire spacing to mounting height to produce acceptable illumination uniformity on the workplane.

Figure 4B:
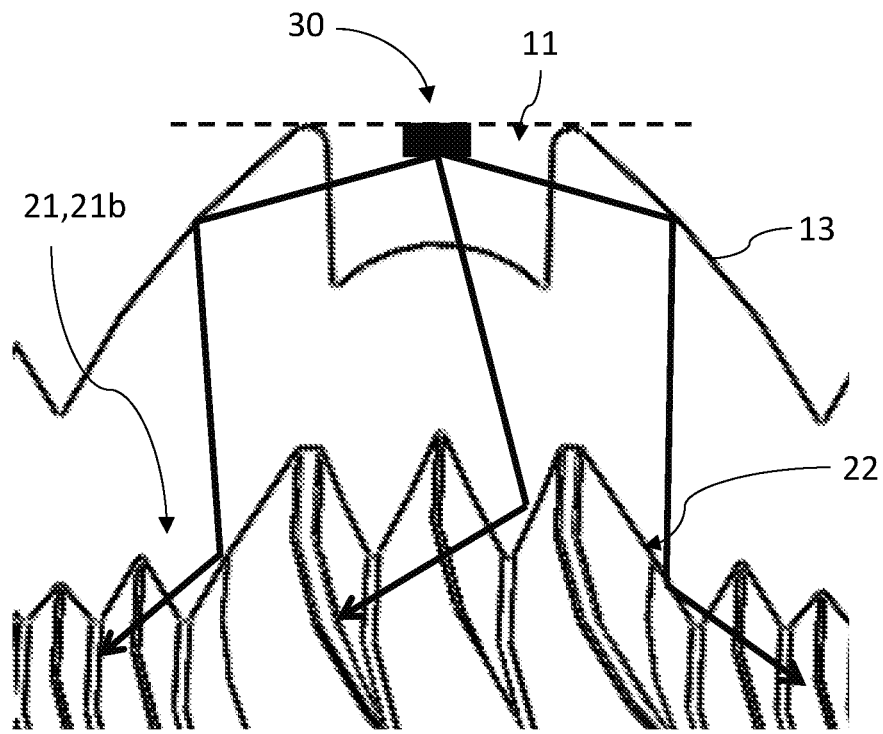
FIG. 4B is a cross-sectional view of the lens in FIG. 4A showing light extraction in wide angles.
Figure 4C:
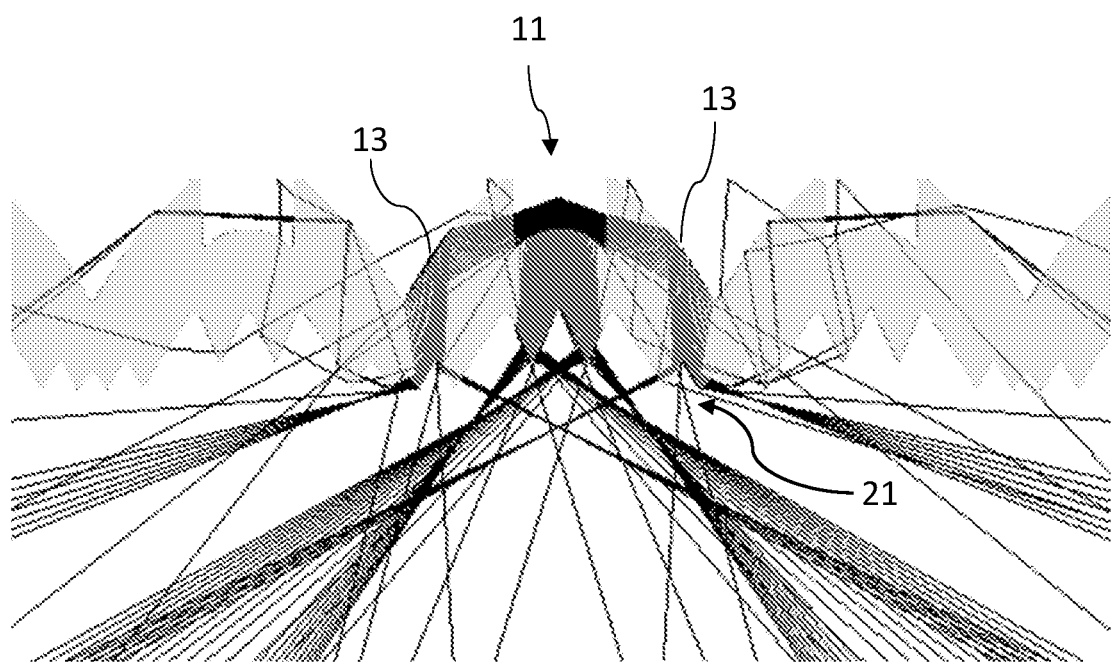
FIG. 4C is a rayfan of the lens in FIG. 4A illustrating the lighting distribution produced by redirection of LED light by refractive extraction surfaces and TIR extraction surfaces.

In FIGS. 4A and 4B, a lens is illustrated comprising a light extraction side producing a wide lighting distribution. Specifically, a symmetric arrangement of concentric facets 21 with triangular cross-sections 21b is shown. Light emitted from LED 30 contacts central refractive region 12, where the light is refracted towards the light extracting side. Light emitted from LED 30 is also reflected by the TIR reflection surfaces 13 of the groove walls towards the light extracting side 20. The refracted and reflected light from LED 30 then contacts the TIR surfaces 22 of the facets 21, which then reflects the light in wide angles based on the angle of the TIR surfaces 22. FIG. 4C is a rayfan illustrating the lighting distribution produced by redirection of LED light by refractive extraction surfaces and TIR extraction surfaces of the lens. In some embodiments, the lighting distribution exhibits a full width at half maximum intensity of 120 degrees to 160 degrees. In other embodiments, the lighting distribution may exhibit a full width at half maximum greater than 160 degrees. This wide lighting distribution may also satisfy a spacing criterion of 1.6 to 2.1 when the lens is part of a luminaire mounted over a workplane. In some embodiments, the lighting distribution satisfies a spacing criterion greater than 2.1.

Figure 5B:
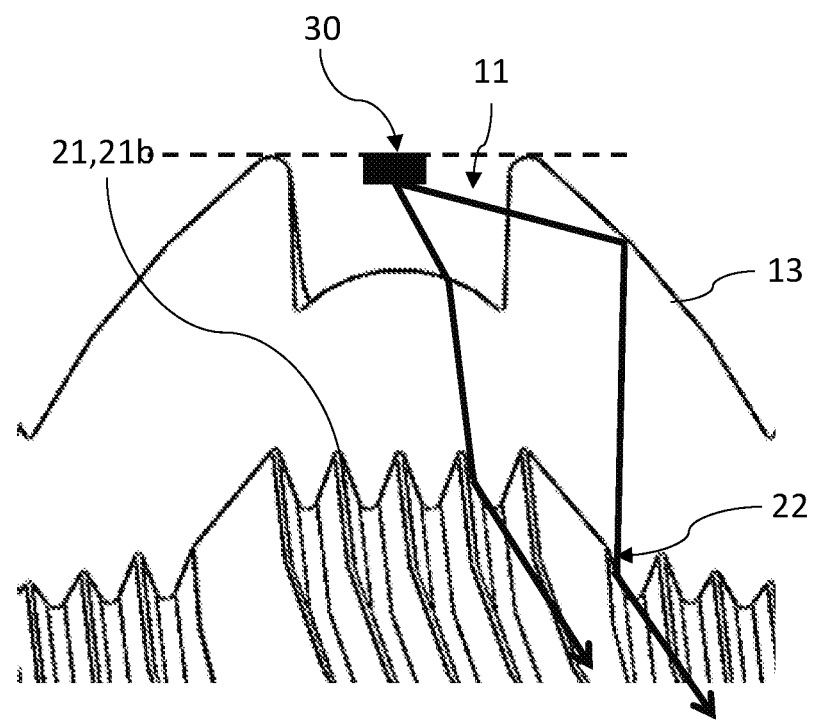
FIG. 5B is a cross-sectional view of the lens in FIG. 5A showing light extractions in medium angles.
Figure 5C:
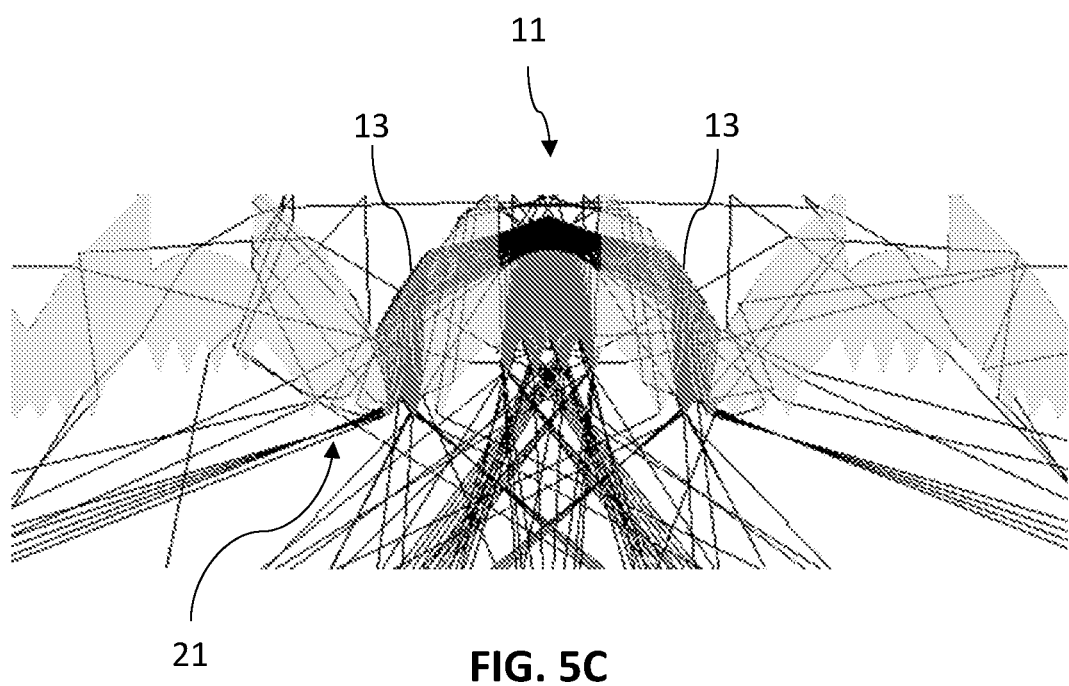
FIG. 5C is a rayfan of the lens in FIG. 5A illustrating the lighting distribution produced by redirection of LED light by refractive extraction surfaces and TIR extraction surfaces.

In FIGS. 5A and 5B, a lens is illustrated comprising a light extraction side producing a lighting distribution between the narrow and wide distributions described above. A symmetric arrangement of concentric facets 21 with triangular cross-sections 21b is shown, where the triangular cross-sections 21b have a different geometry than the triangular cross-sections 21b in FIGS. 4A and 4B. In contrast to the wide light distribution pattern in FIGS. 4A and 4B, the angle of the TIR surfaces is generally smaller to give the medium light distribution pattern. In some embodiments, each of the triangular cross-sections 21b in FIGS. 5A and 5B has the same geometric shape, and symmetrical positioning relative to each other. Light emitted from LED 30 again contacts central refractive region 12, where the light is refracted towards the light extracting side. Light emitted from LED 30 is also reflected by the TIR reflection surfaces 13 towards the light extracting side. The refracted and reflected light from LED 30 then contacts both the refractive surfaces and the TIR surfaces of the facets 21, emitting the light in a medium light distribution due to the geometry of the facets. FIG. 5C is a rayfan illustrating the lighting distribution produced by redirection of LED light by refractive extraction surfaces and TIR extraction surfaces. In some embodiments, the lighting distribution exhibits a full width at half maximum intensity of 80 degrees to 120 degrees. This lighting distribution may also satisfy a spacing criterion of 1.2 to 1.6 when the lens is part of a luminaire mounted over a workplane.

Figure 6B:
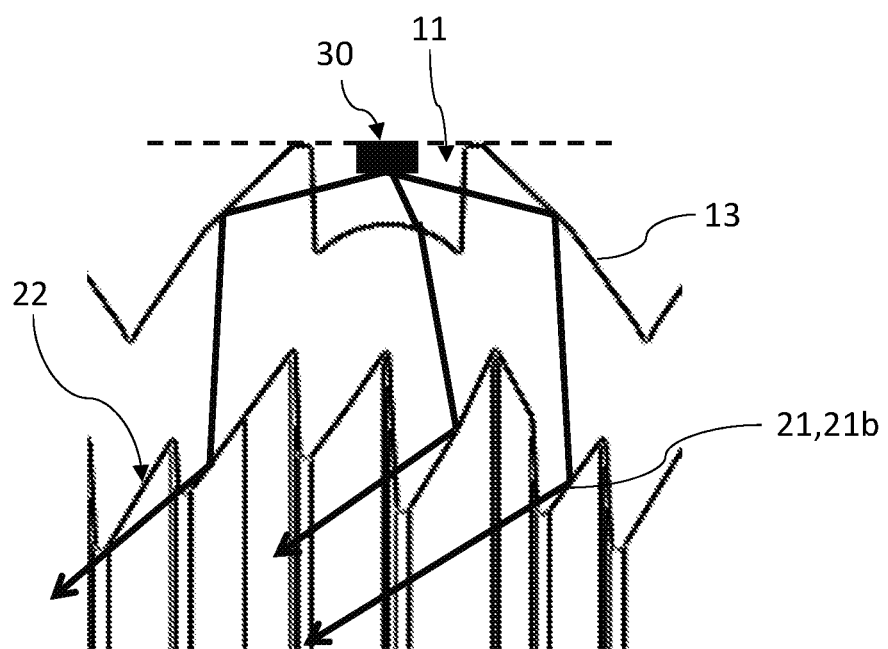
FIG. 6B is a cross-sectional view of the lens in FIG. 6A showing light extractions in one side.
Figure 6C:
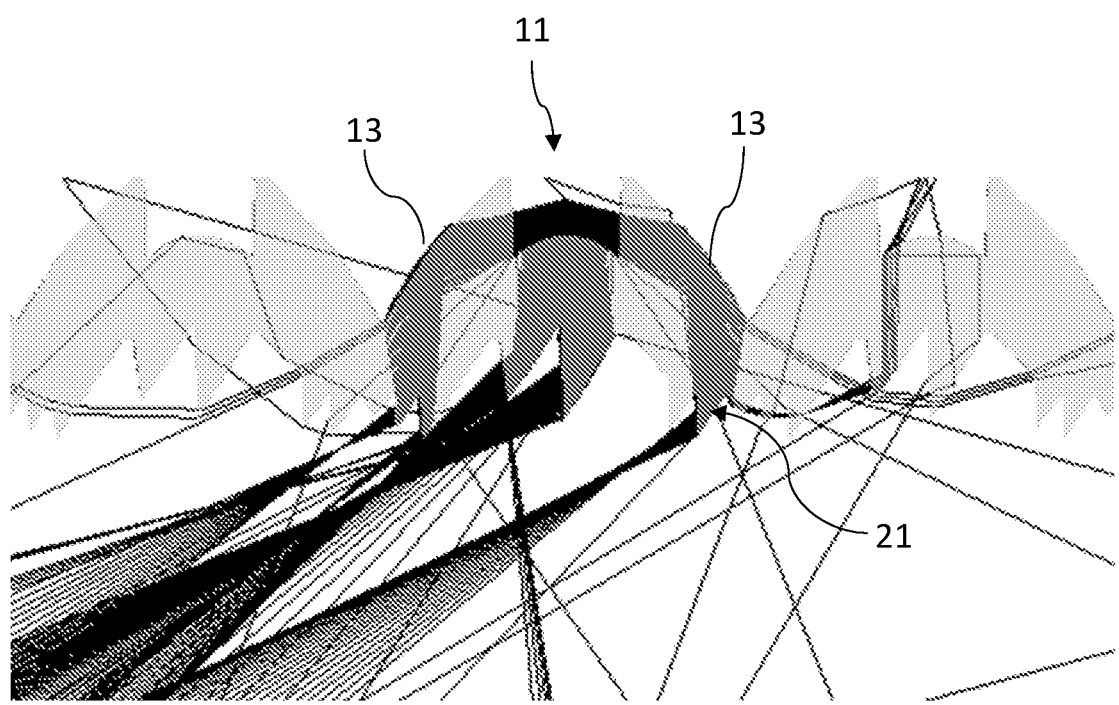
FIG. 6C is a rayfan of the lens in FIG. 6A illustrating the asymmetric lighting distribution produced by redirection of LED light by refractive extraction surfaces and TIR extraction surfaces.

In FIGS. 3A-5B, embodiments of lenses having a symmetrical arrangement of facets on the light extracting side are shown. In contrast, FIGS. 6A and 6B show an embodiment of a lens with an asymmetrical arrangement of facets on the light extracting side. Light emitted from LED 30 contacts central refractive region 12, where the light is refracted towards the light extracting side. Light emitted from LED 30 is also reflected by the TIR reflection surfaces 13 towards the light extracting side. The refracted and reflected light from LED 30 then contacts TIR surfaces of the facets 21, emitting the light in an asymmetric light distribution. FIG. 6C is a rayfan illustrating the asymmetric lighting distribution produced by redirection of LED light by refractive extraction surfaces and TIR extraction surfaces of the lens.

Lenses described herein can have high optical efficiency. In some cases, the optical efficiency of fixtures with lenses can have an optical efficiency 80-85%, 85-90%, 90-95%, or greater than 95%.

In another aspect, a lens comprises a light receiving side comprising grooves for receiving light emitting diodes, the grooves defined by a central refractive region and walls comprising total internal reflection faces. The lens also comprises a light extraction side opposite the light receiving side, wherein an axis bisecting the central refractive region forms an angle with a vertical axis of the lens ranging from greater than zero degrees to less than 90 degrees. The light extraction side comprises refractive extraction surfaces, total internal reflection extraction surfaces, or combinations thereof.

Figure 16A:
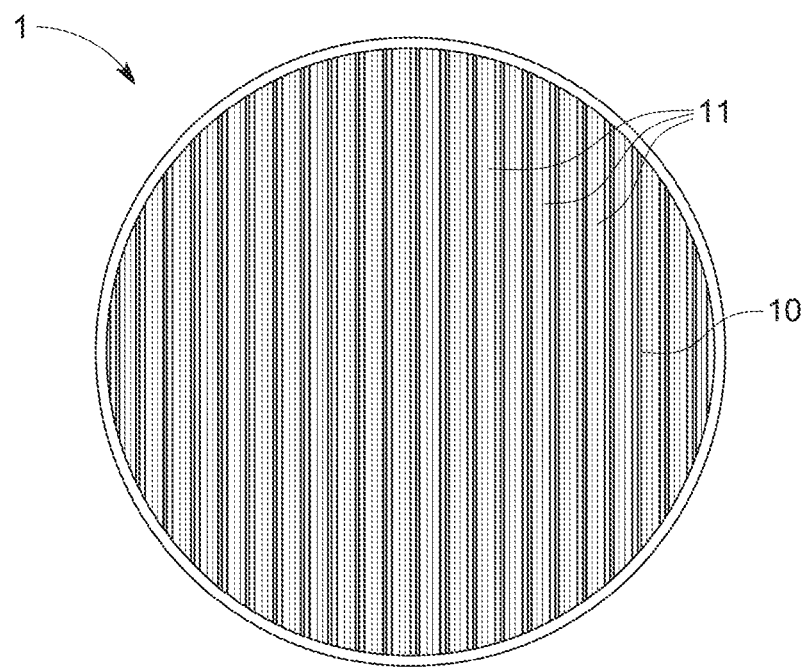
FIG. 16A is a plan view of a light receiving side of a lens having grooves arranged in a linear format.
Figure 16B:
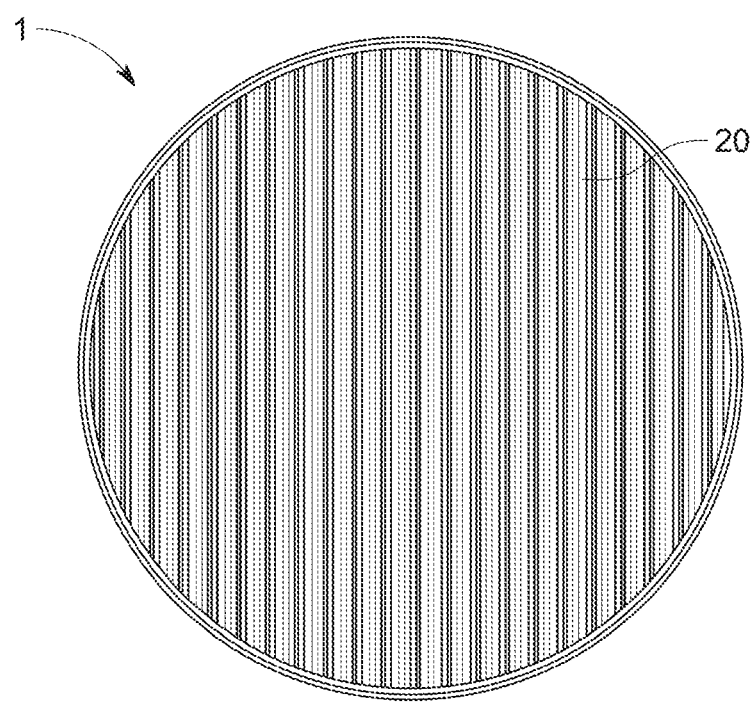
FIG. 16B is a plan view of a light extraction side of the lens of FIG. 16A.
Figure 16C:
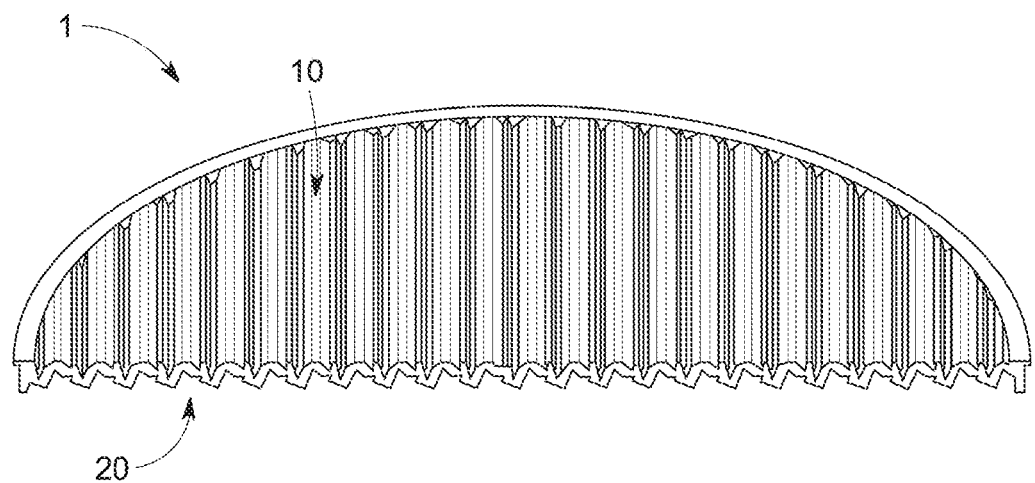
FIG. 16C is a partial cross-sectional perspective view of the lens in FIG. 16A having an asymmetric light distribution pattern.
Figure 16D:
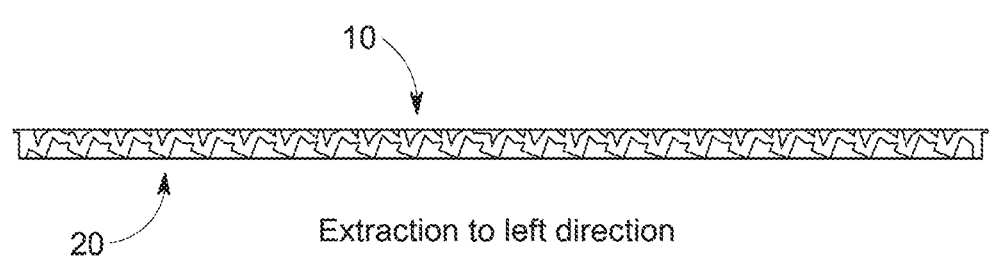
FIG. 16D is a cross-sectional perspective view of the lens in FIG. 16C.
Figure 17A:
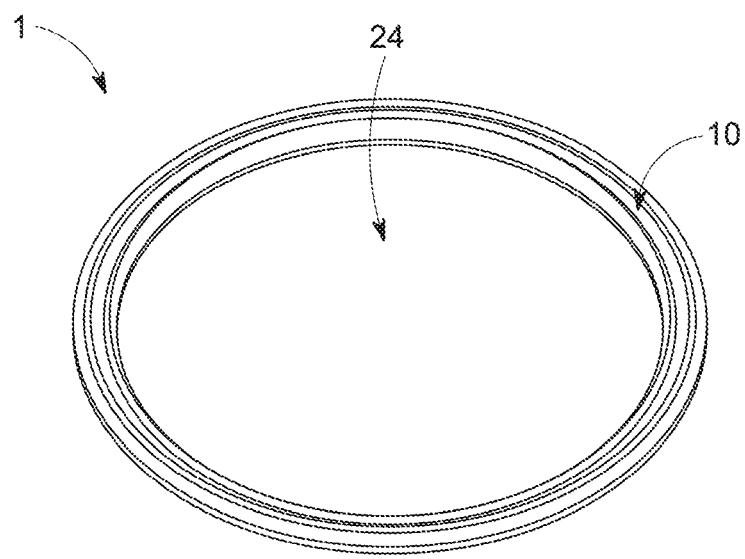
FIG. 17A is a perspective view of an annular lens having a central aperture.
Figure 17B:
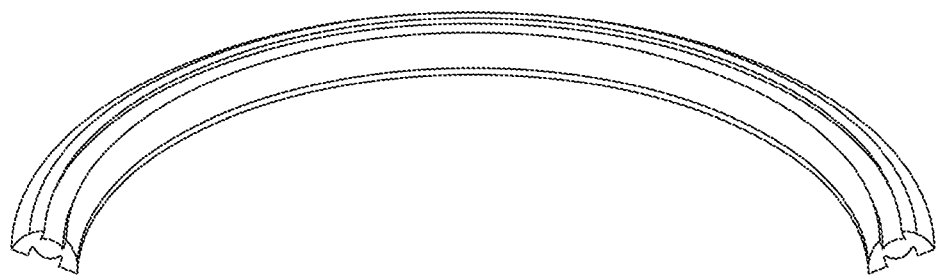
FIG. 17B is a perspective view of a semicircular lens.
Figure 17C:
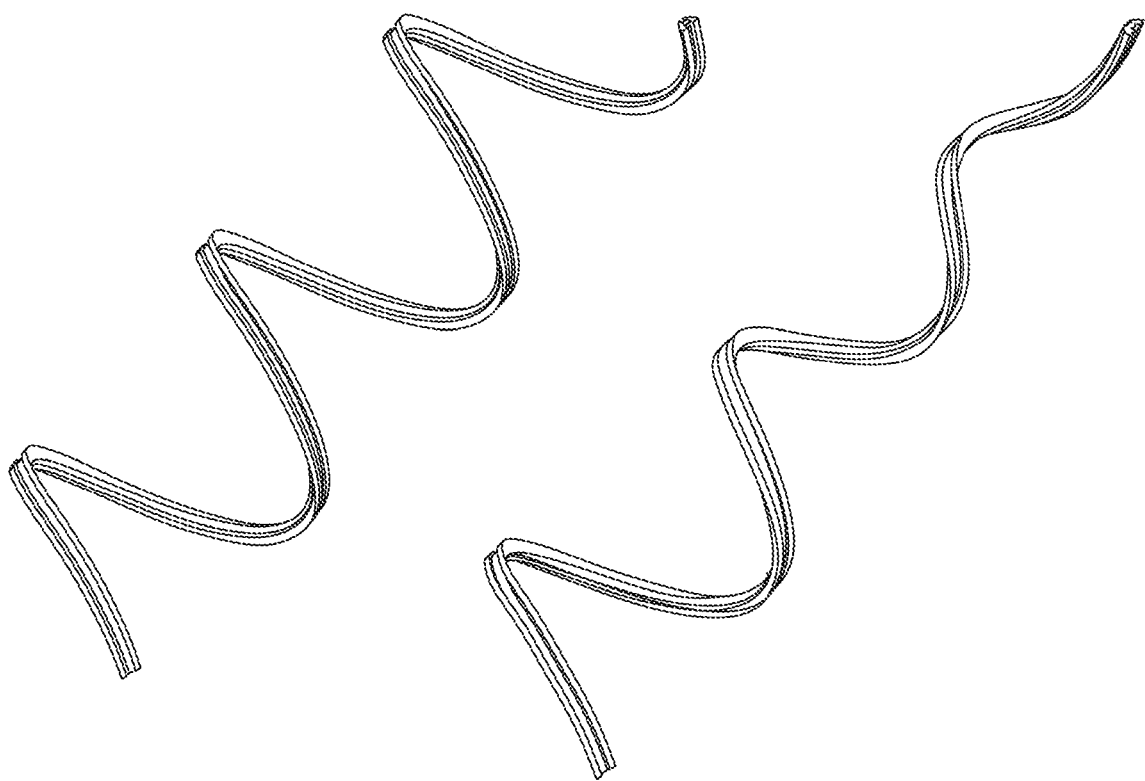
FIG. 17C is a perspective view of a helical and a tapered helical lens.
Figure 17D:
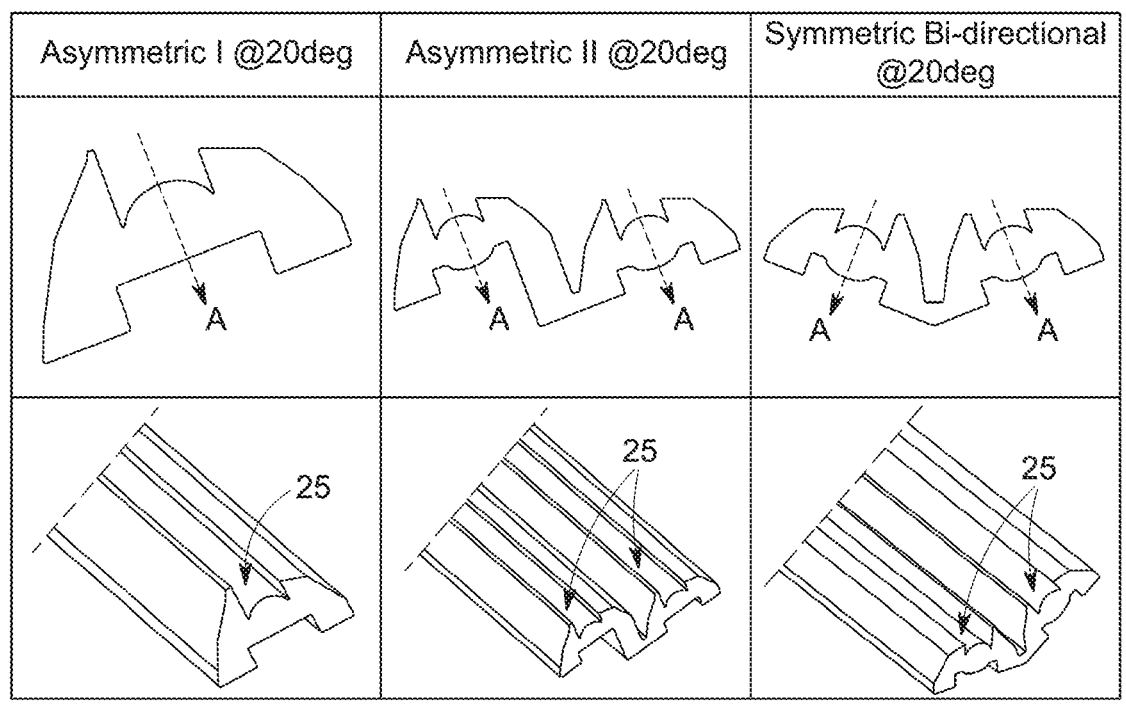
FIG. 17D is a graph of a linear lens having asymmetric and symmetric light distribution patterns.

Turning now to specific features, the lens comprises a light receiving side and an opposite light extraction side. FIG. 16A illustrates a light receiving side 10 of lens 1 according to an embodiment, while FIG. 16B illustrates the light extraction side 20 of lens 1. Similarly, FIG. 16C provides a perspective cross-sectional view of the lens 1 of FIGS. 16A and 16B. The lens can have a continuous surface over the diameter of the lens, as shown in the disc-shaped lens 1 of FIGS. 16A-16D. However, the lens is not limited to the continuous surface embodiment shown in FIGS. 16A and 16B. In some embodiments, lens 1 can have a central aperture, such as central aperture 24 shown in FIG. 17A. In other embodiments, lens 1 can be semicircular in shape, as shown for example in FIG. 17B. Lens 1 can also be formed in other shapes, such as a helical or tapered helical shape of FIG. 17C. FIG. 17D illustrates various arrangements (asymmetric and symmetric bi-directional) of adjacent grooves 25 and associated optical surfaces.

The light receiving side comprises grooves for receiving light emitting diodes (LEDs). The grooves can be arranged in any format not inconsistent with the objectives of this disclosure. The grooves can exhibit an isotropic or anisotropic arrangement over the light receiving side of the lens. For example, the grooves can be arranged in a linear format, such as illustrated in FIGS. 16A-16C and 16E, where the grooves 11 are arranged linearly in only one direction, along with extraction facets in parallel.

Figure 18A:
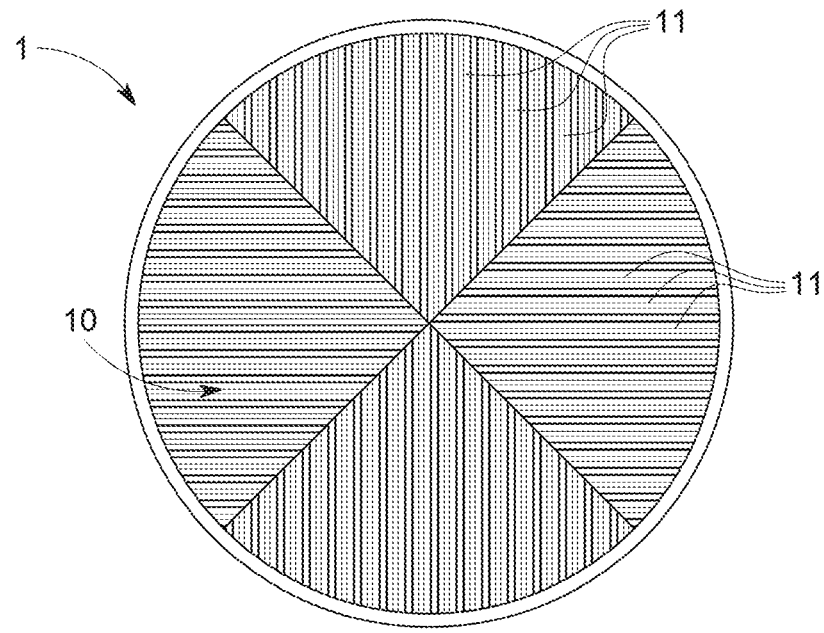
FIG. 18A is a plan view of a light receiving side of a lens having grooves arranged in a recti-linear format.
Figure 18B:
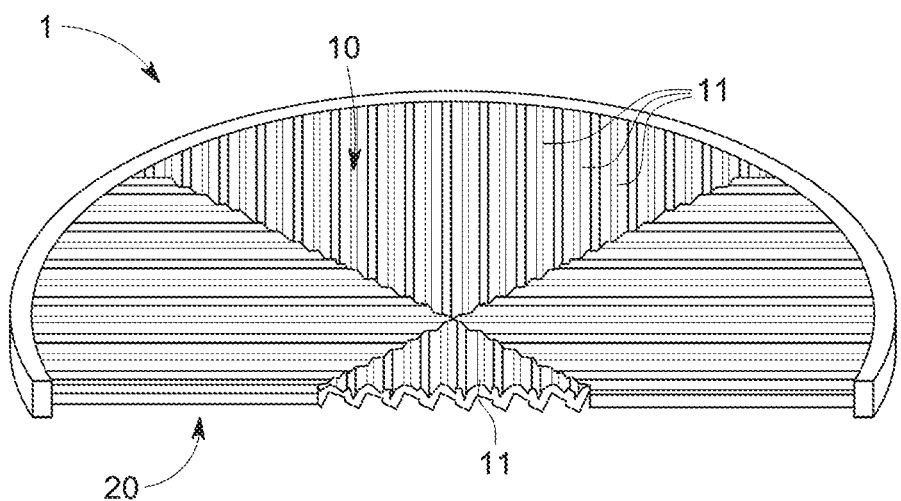
FIG. 18B is a cross-sectional perspective view of the lens in FIG. 3A.
Figure 18C:
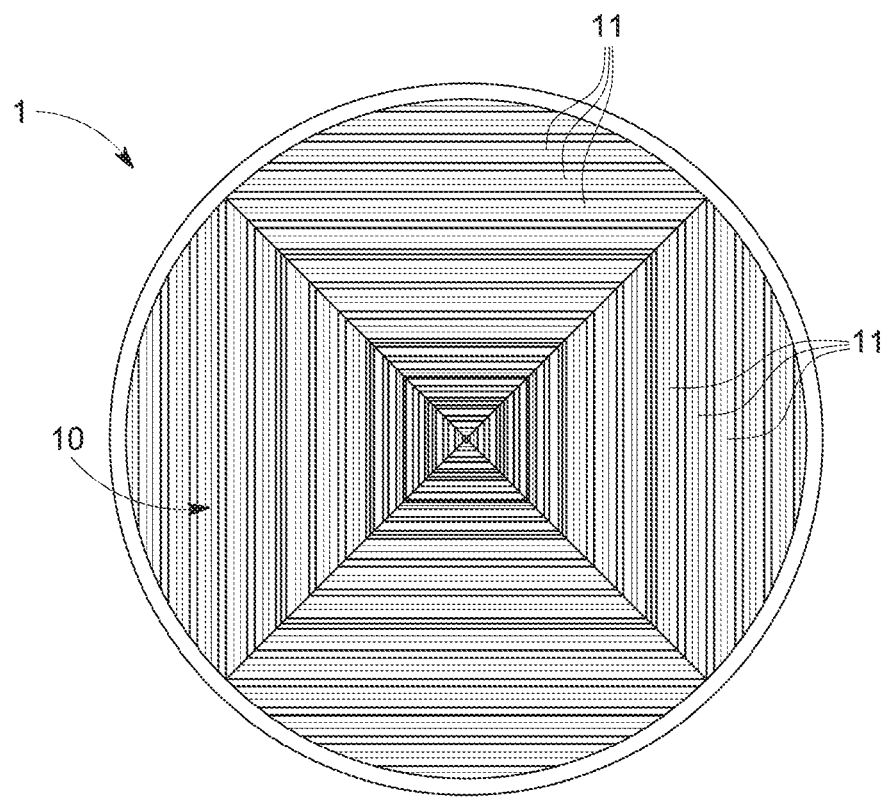
FIG. 18C is a plan view of a light receiving side of a lens having grooves arranged in another recti-linear format.
Figure 18D:
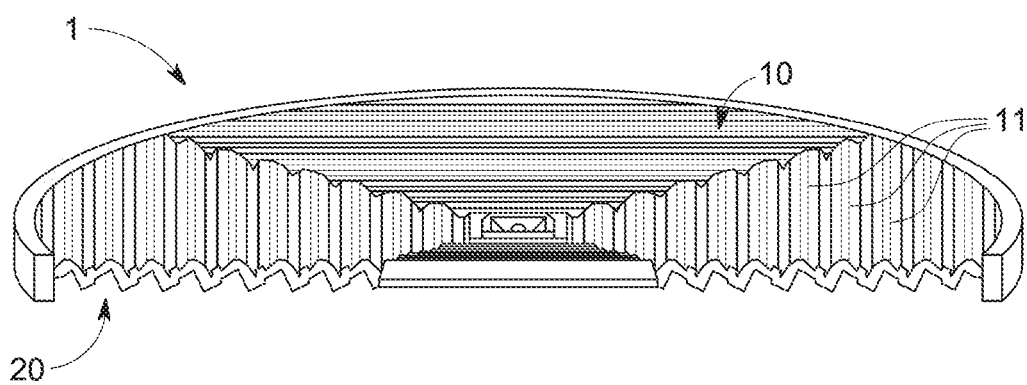
FIG. 18D is a cross-sectional perspective view of the lens in FIG. 18C.

In some cases, the grooves are arranged in a recti-linear format. FIGS. 18A,18B and 18C,18D show a light receiving side 10 of lens 1 having grooves 11 arranged in different linear formats according to some embodiments. As illustrated in FIGS. 18A and 18C, radial sections of the light receiving surface can exhibit differing linear arrangements of the grooves. FIGS. 18B and 3D are cross-sectional perspective views of the lens in FIGS. 18A and 18C, respectively. The linearly arranged grooves can be arranged in two axes with an angle between 0 and 90 degrees.

The number of, and dimensions of, grooves 11 can be selected according to various considerations including, but not limited to, size and/or number of the LEDs and the desired lighting distribution provided by the lens.

The grooves are defined by a central refractive region and walls comprising total internal reflection (TIR) faces. The central refractive region can have any desired surface profile. In some embodiments, the central refractive region of the light receiving surface comprises a convex surface, including spherical or aspherical convex surfaces. The central refractive region can also exhibit other surface contours such as combination of convex and concave surfaces, in some embodiments. In addition to the central refractive region, the grooves include walls comprising TIR faces. In some embodiments, the TIR faces direct light received by the lens to the light extraction side of the lens.

The light extraction side is opposite the light receiving side. The light extraction side comprises refractive extraction surfaces of any desired contour not inconsistent with the technical objectives described herein. In some embodiments, for example, the light extraction side comprises a convex surface in the central refractive region. The convex surface of the light extraction side may have the same or a different radius of curvature relative to the convex surface of the light receiving side. Alternatively, the light extraction side may be planar or concave in the central refractive region. Moreover, light extraction surfaces receiving light from the TIR faces may be planar or curved, in some embodiments.

In some embodiments, the light extraction side can comprise the light extraction facets, including the TIR facets. The facets can have any desired geometry and/or dimensions. Facet geometry and/or dimensions, for example, can be selected according to the desired lighting distribution from the lens, such as a narrow, wide, medium, or asymmetric lighting distribution, as described herein.

Figure 19A:
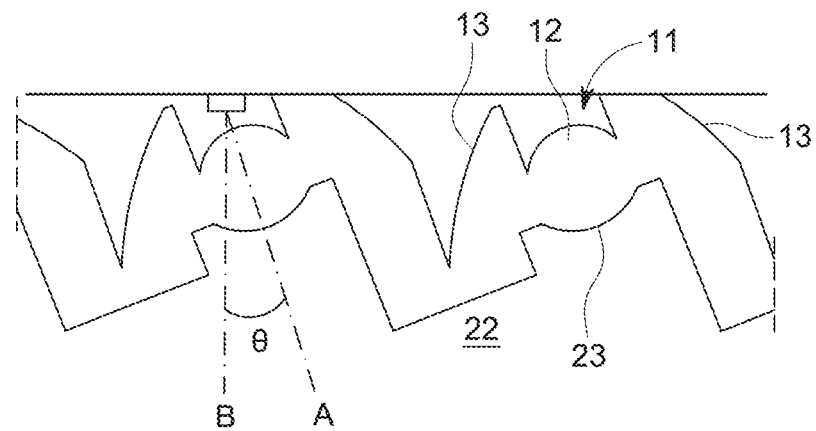
FIG. 19A is a cross-sectional perspective view of two individual light elements of a lens.
Figure 19B:
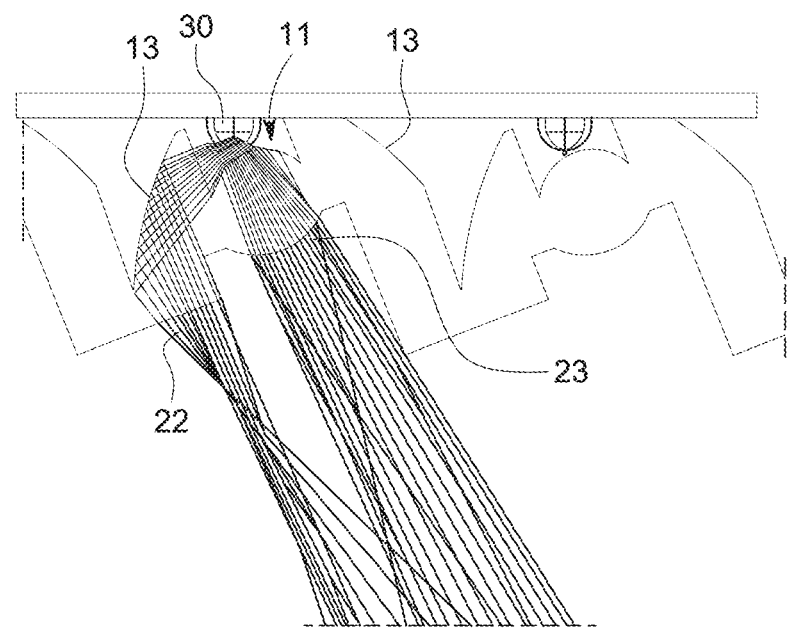
FIG. 19B is a rayfan of the lens in FIG. 19A illustrating the central refractive region and TIR faces directing light received from an LED light source in a direction parallel to the central vertical axis of the lens.

An axis bisecting the central refractive region forms an angle with a vertical axis of the lens ranging from greater than zero degrees to less than 90 degrees. In some embodiments, the central refractive region, TIR faces, and light extraction faces of the lens work in conjunction to collimate or direct light along the axis bisecting the central refractive region. FIGS. 19A and 4B illustrate cross-sections of a portion of a lens described herein, according to some embodiments. In the embodiments of FIGS. 19A and 19B, the lens comprises a light receiving side comprising grooves 11 for receiving light emitting diodes 30, the grooves defined by a central refractive region 12 and walls comprising TIR surfaces 13. The light extraction side is opposite the light receiving side and comprises a convex extraction surface 23 in the central refractive region 12. The light extraction side also comprises planar extraction surfaces 22 receiving light from the TIR surfaces. An axis (A) bisecting the central refractive region 12 forms an angle (θ) with a vertical axis (B) of the lens. The angle (θ) is generally greater than zero degrees and less than 90 degrees. In the embodiment of FIG. 19A, the bisecting axis (A) divides the central refractive region 12 into symmetric parts. It is contemplated that in other embodiments, the bisecting axis (A) will pass through the center of the central refractive region wherein such symmetry is not achieved. Symmetry or asymmetry between sections of the central refractive region on opposing sides of the axis (A) will be dependent upon the specific design of the central refractive region.

Figure 20A:
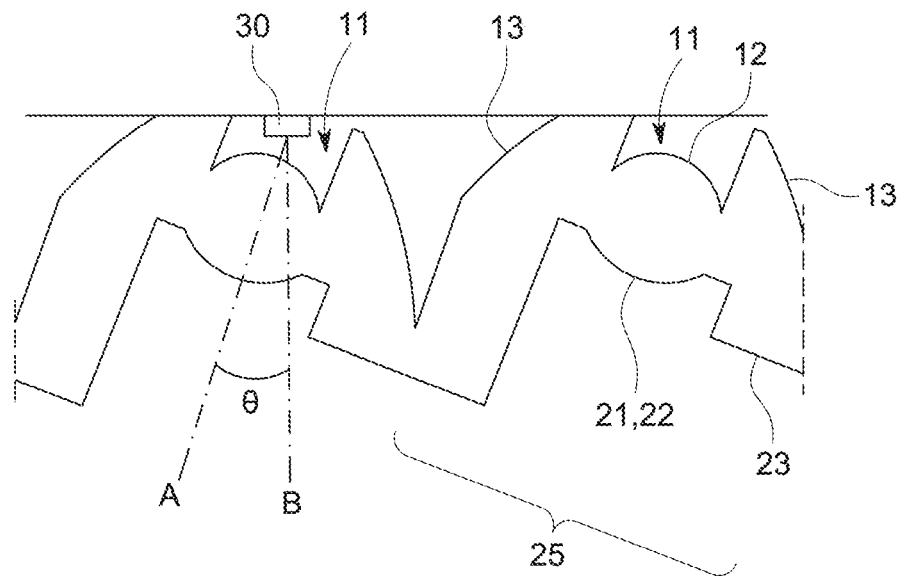
FIG. 20A is a cross-sectional perspective view of two individual light elements of a lens.
Figure 20B:
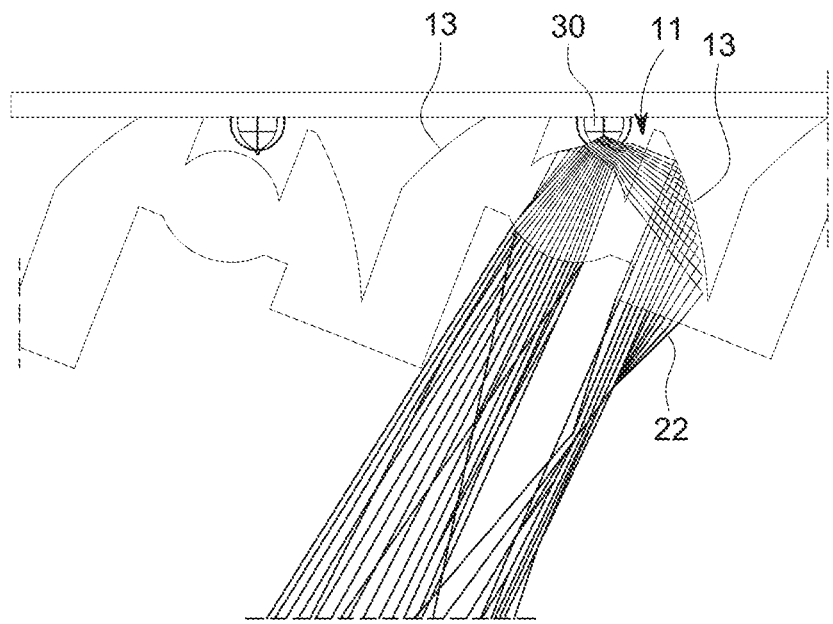
FIG. 20B is a rayfan of the lens in FIG. 20A illustrating the central refractive region and TIR faces directing light received from an LED light source in a direction parallel to the central vertical axis of the lens.
Figure 21:
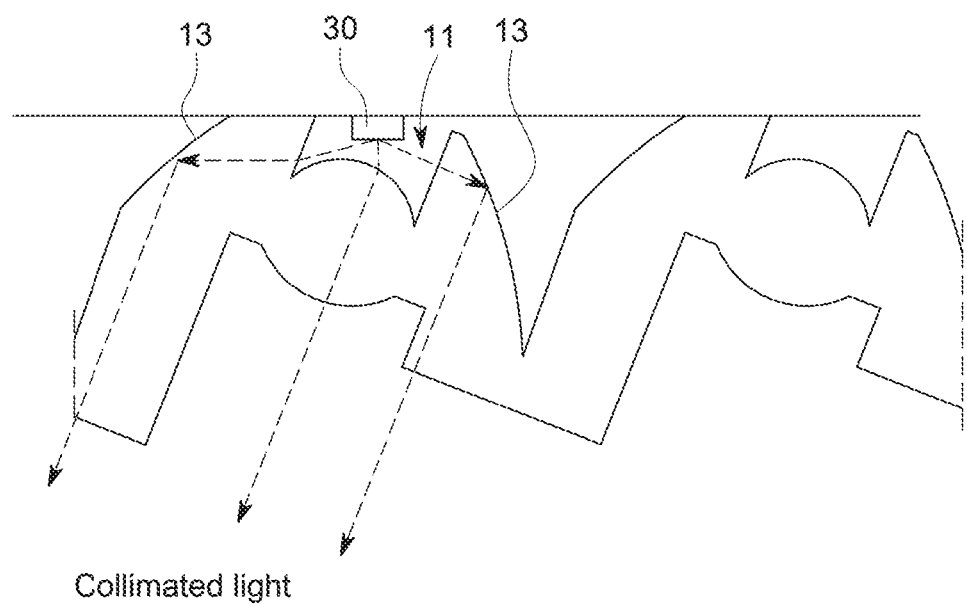
FIG. 21 is a cross-sectional perspective view light collimation by an individual light element of a lens.

As illustrated in FIG. 19B, the central refraction region 12, TIR surfaces 13 and extraction surfaces 22, 23 work in conjunction to collimate or direct light from the LED 30 along the axis (A). Similar embodiments are also illustrated in FIGS. 20A, 20B and 21.

The lighting distribution of the lens, therefore, can be controlled or altered according to the angle (θ). In some embodiments, each groove and associated optical features have the same angle (θ). In other embodiments, the angle (θ) can vary across the grooves of the lens. Angle (θ), in some embodiments, has a value selected from Table I.

TABLE I

| Values of angle (θ) |
| --- |
| 5-85 |
| 10-80 |
| 15-75 |
| 20-70 |
| 30-60 |
| 40-50 |

Figure 16E:
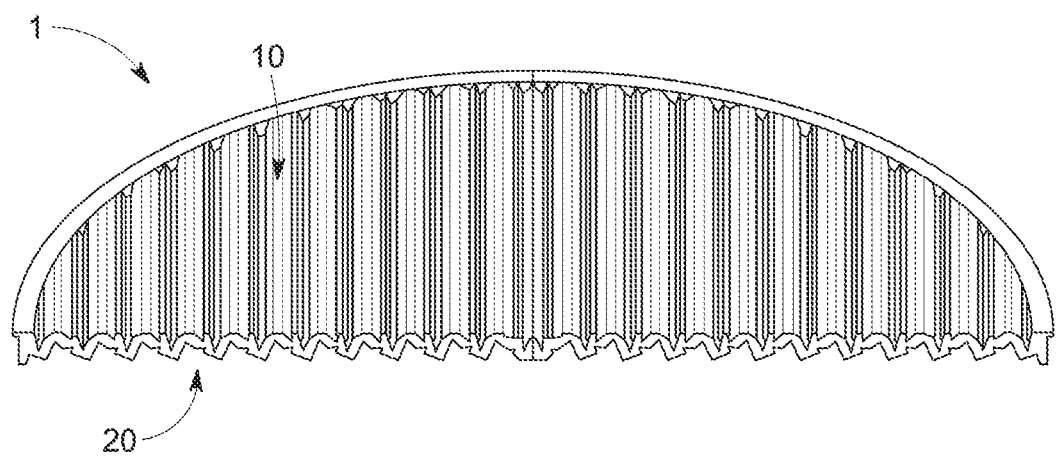
FIG. 16E is a partial cross-sectional perspective view of the lens in FIG. 16A having a symmetric bi-directional light distribution pattern.
Figure 16F:
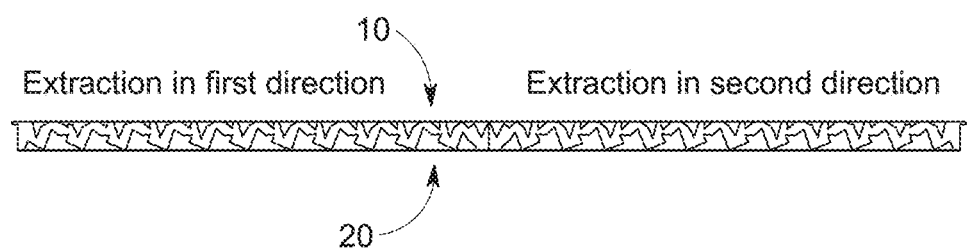
FIG. 16F is a cross-sectional perspective view of the lens in FIG. 16E.
Figure 22:
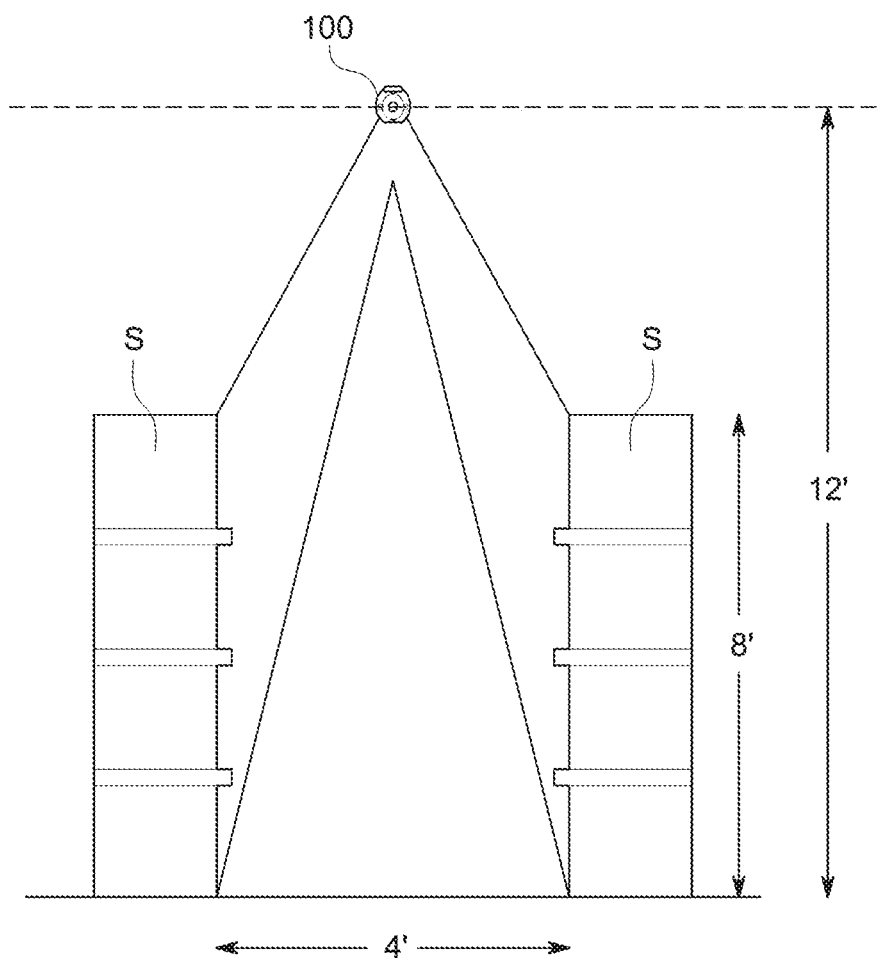
FIG. 22 is a schematic of an aisle luminaire employing a lens having an asymmetric light distribution described herein.

By adjusting the angle (θ), light distribution patterns can be controlled and/or tailored. For example, when a lens according to embodiments described herein is used in an aisle light luminaire (such as described in Section II), light from the luminaire can be customized to illuminate shelving or racks on one or both sides of the aisle by setting the appropriate angle of the grooves and associated optical surfaces. FIG. 22 illustrates an exemplary retail aisle having opposing shelving S that is illuminated with a luminaire having lens 1 with a bi-direction light distribution pattern formed from lens according to embodiments herein, such as lens 1 having individual light elements arranged as shown in FIGS. 16E and 16F or in the symmetric bi-directional embodiment shown in FIG. 17D. The invention is not limited to bidirectional light distribution patterns, but can in other instances have a mono-directional (FIGS. 16B, 16C, and asymmetric I, II of 2D), tri-directional, tetra-directional, or any other number of directional light distribution patterns. Additionally, the multi-directional distribution patterns can be symmetrically distributed or asymmetrically distributed by variation in the number of individual light elements positioned at the same angle θ. This level of control allows the light distribution to be tailored to selectively illuminate a desired target area, control beam spread, and/or control the intensity of the lightings (such as making one side brighter than the other in a bi-directional light distribution pattern). In some cases, the light distribution pattern can be graduated and formed using the annular, semicircular, and helical lens designs shown in FIGS. 17A-17C. Such graduated patterns can, for instance, be used to selectively illuminate curved racks and shelving, or in the case of the helical lens, provide architectural lighting with reduced glaring.

Figures 23A, 23B:
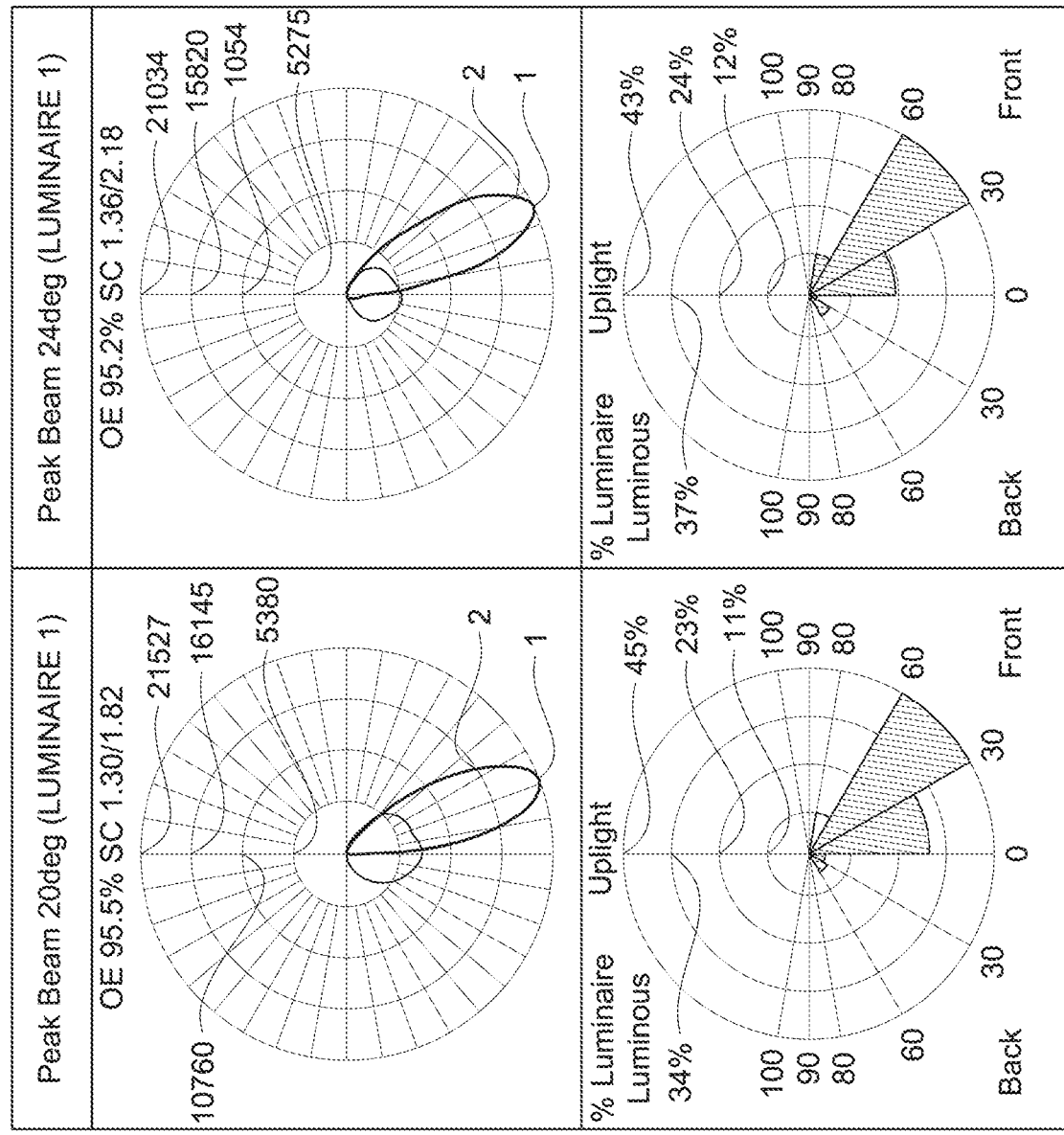
FIGS. 23A-23D each illustrate an asymmetric light distribution generated by a lens in FIG. 16D.
Figures 23C, 23D:
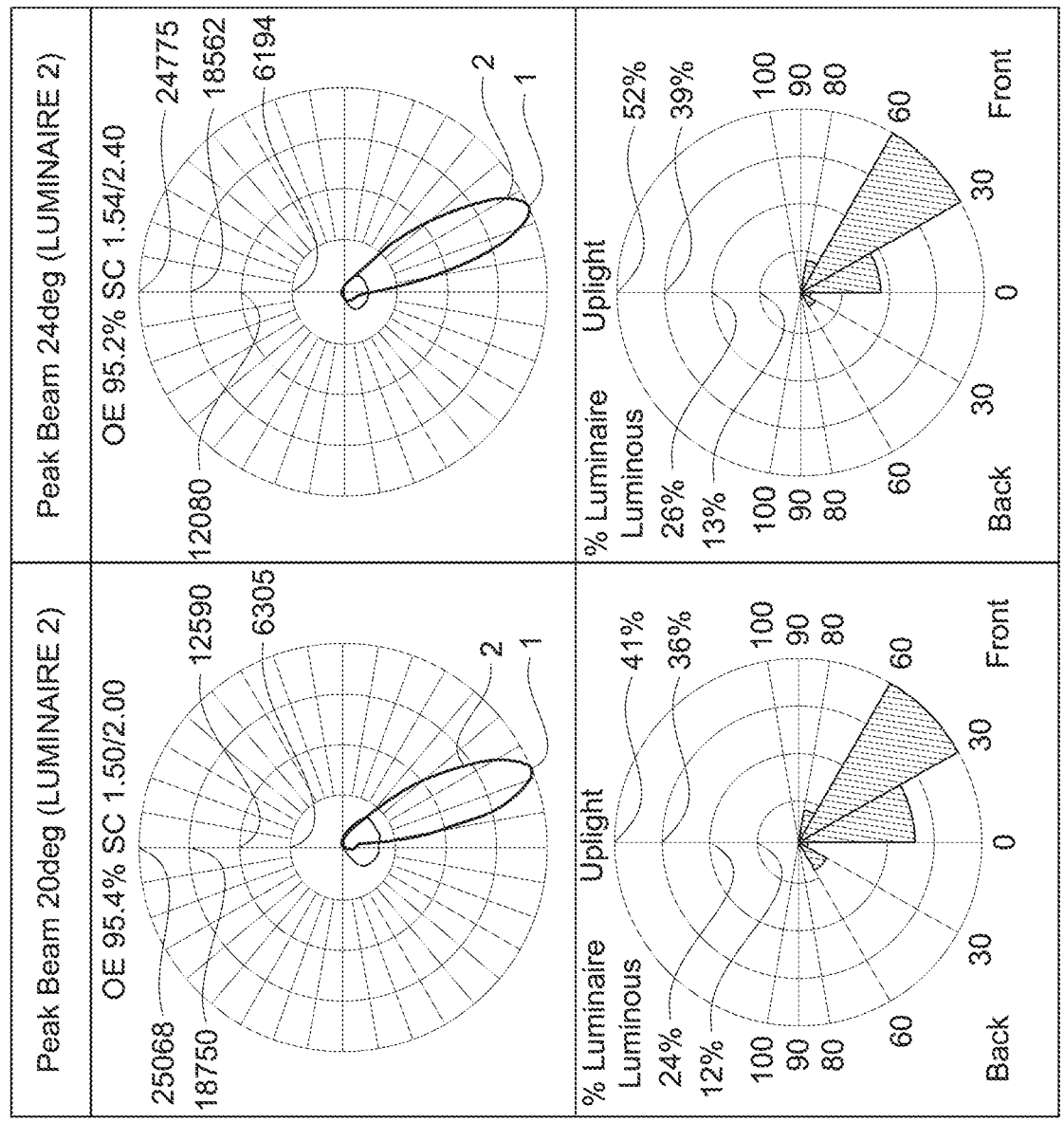

As previously discussed, the angle of light emitted from the light extraction side 20 of lens can be controlled by angle θ. FIGS. 23A and 23C show simulated lighting distribution patterns from two different luminaires employing a lens, where angle θ=20 degrees for each groove in the lens 1. FIGS. 23B and 23D show simulated lighting distribution patterns where angle θ=24 degrees for each individual groove in the lens.

Figures 24A, 24B:
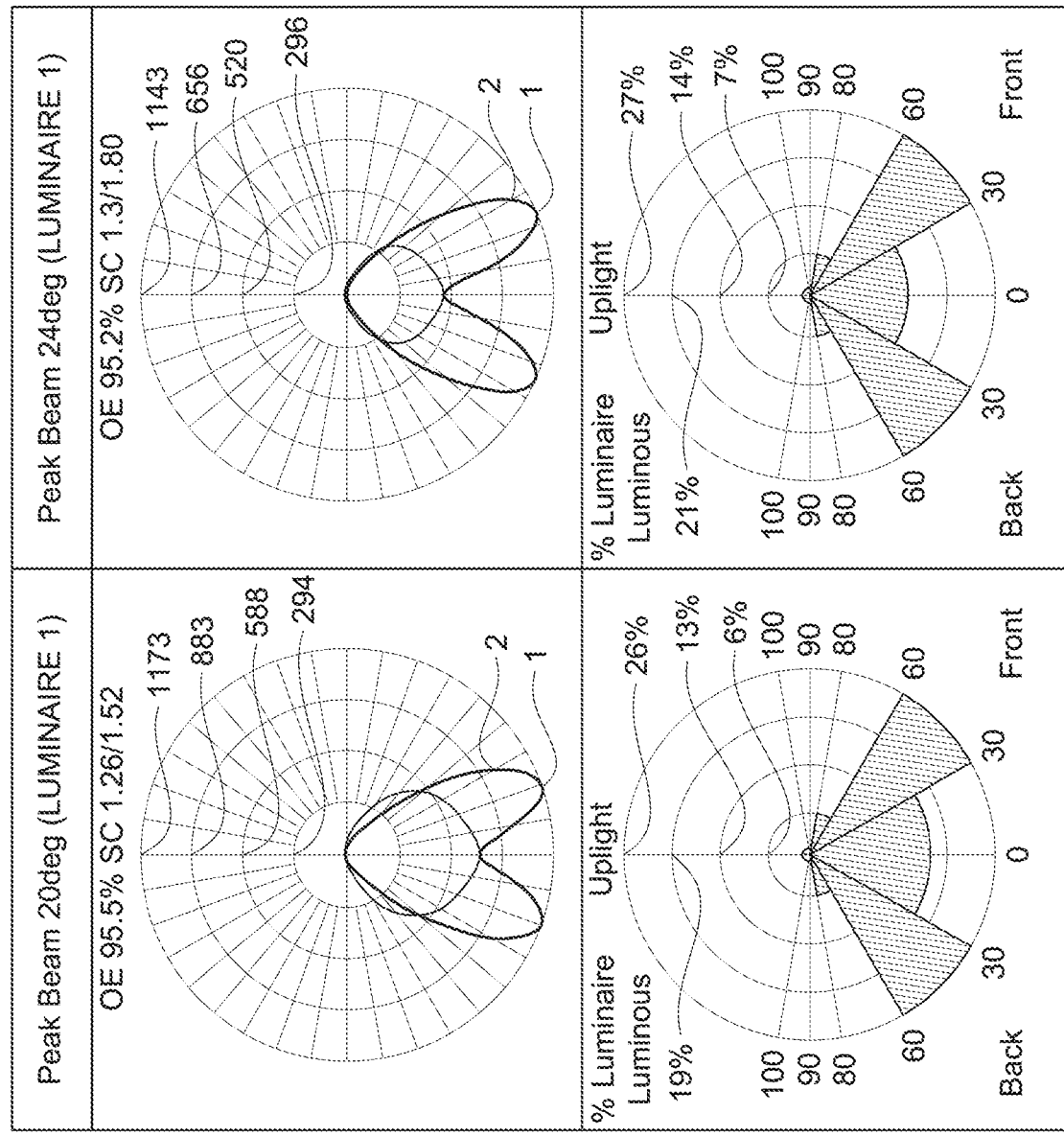
FIGS. 24A-24D each illustrate a symmetric light distribution generated by a lens in FIG. 16F.
Figures 24C, 24D:
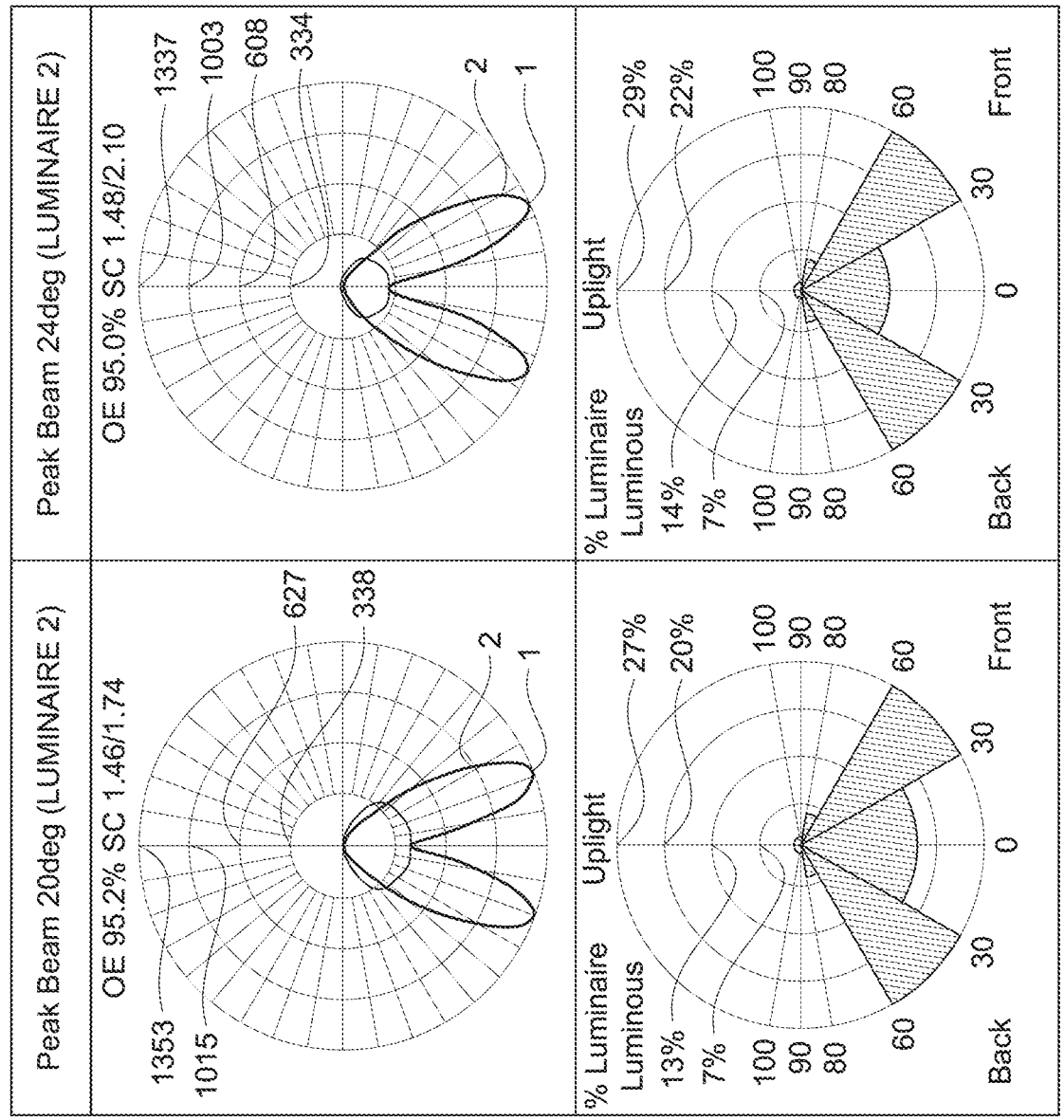

In the embodiment shown in FIGS. 16E and 16F, the grooves of lens 1 are tilted in opposite directions to form a symmetrical bi-directional lighting pattern. FIGS. 24A and 24C show simulated lighting distribution patterns from two different luminaires employing a lens described herein, where θ=20 degrees and the grooves have a symmetric bidirectional orientation. Similarly, FIGS. 24B and 24D illustrate simulated lighting distribution patterns from two different luminaires employing a lens described herein, where θ=24 degrees and the grooves have a symmetric bidirectional orientation.

In another aspect, a lens comprises a light receiving side comprising grooves for receiving light emitting diodes, the grooves defined by refractive walls. The lens also comprises a light extraction side opposite the light receiving side, the light extraction side comprising refractive extraction surfaces diverging light from a central axis of the lens. In some embodiments, the refractive walls of the groove work in conjunction with the refractive extraction surfaces to diverge light from the central axis of the lens.

Figure 25A:
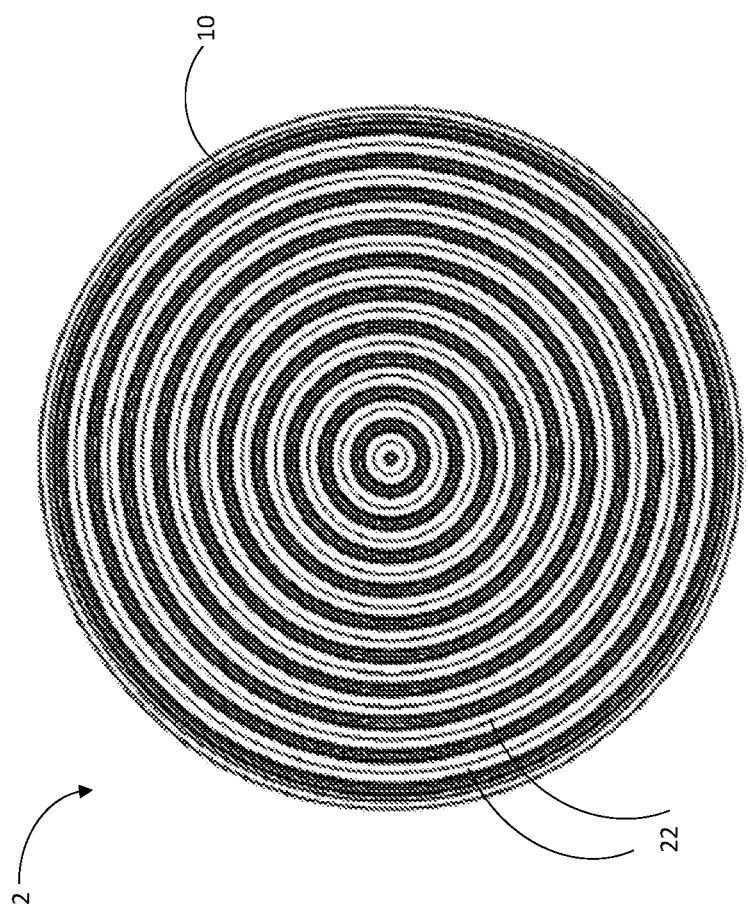
FIG. 25A is a plan view of a light receiving side of a lens according to some embodiments.
Figure 25B:
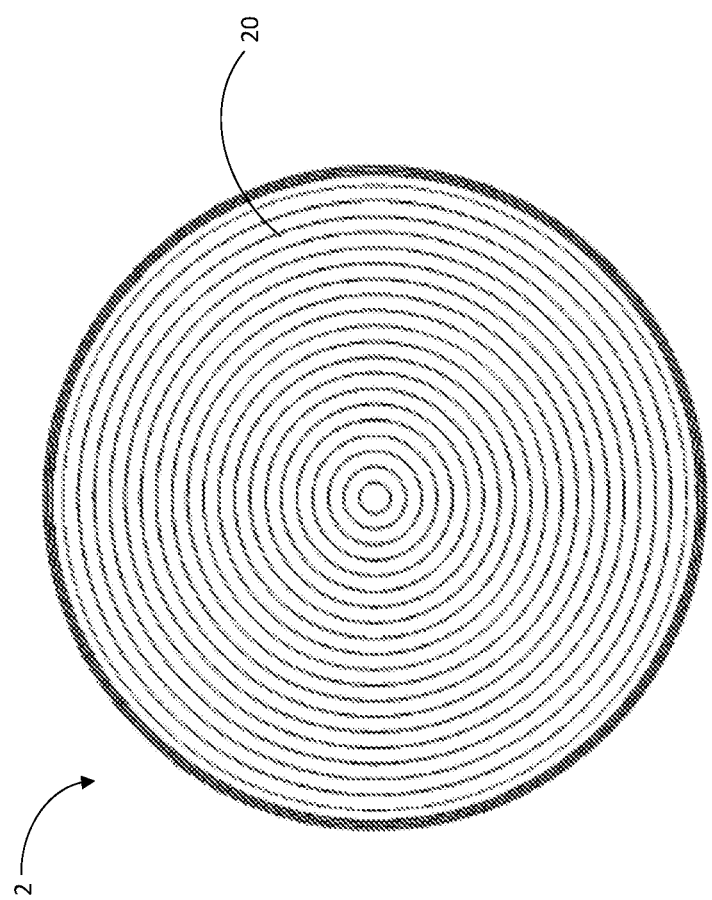
FIG. 25B is a plan view of a light extraction side of a lens according to some embodiments.
Figure 25C:
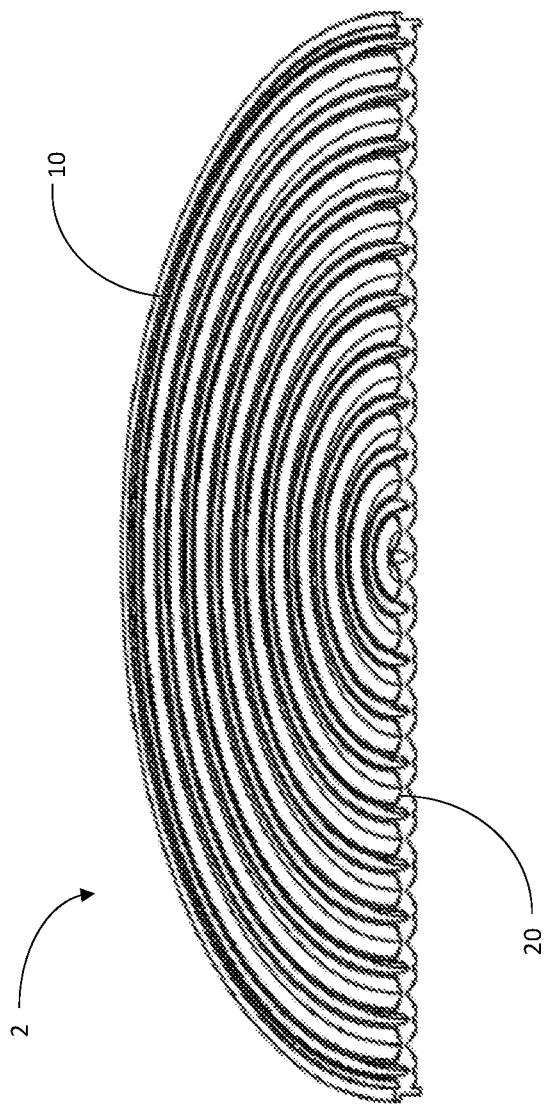
FIG. 25C is a slanted cross-sectional view of a lens according to some embodiments.

Turning now to specific features, the lens comprises a light receiving side and an opposite light extraction side. FIG. 25A illustrates a light receiving side 10 of the lens 2, according to some embodiments, while FIG. 25B illustrates the light extraction side 20 of the lens 2. The light receiving side 10 comprises grooves 22 for receiving light emitting diodes. The grooves 22 can exhibit a periodic or aperiodic arrangement over the light receiving side 10 of the lens 2. In the embodiment of FIG. 25A, the grooves are arranged concentrically. FIG. 25C provides a sectional view of the lens 2, further illustrating the concentric arrangement of the grooves 22. However, the grooves may adopt any arrangement not inconsistent with the technical objectives described herein. In some embodiments, the grooves are arranged in a linear format or a recti-linear format, such as that illustrated in FIGS. 26 and 27.

Figure 28:
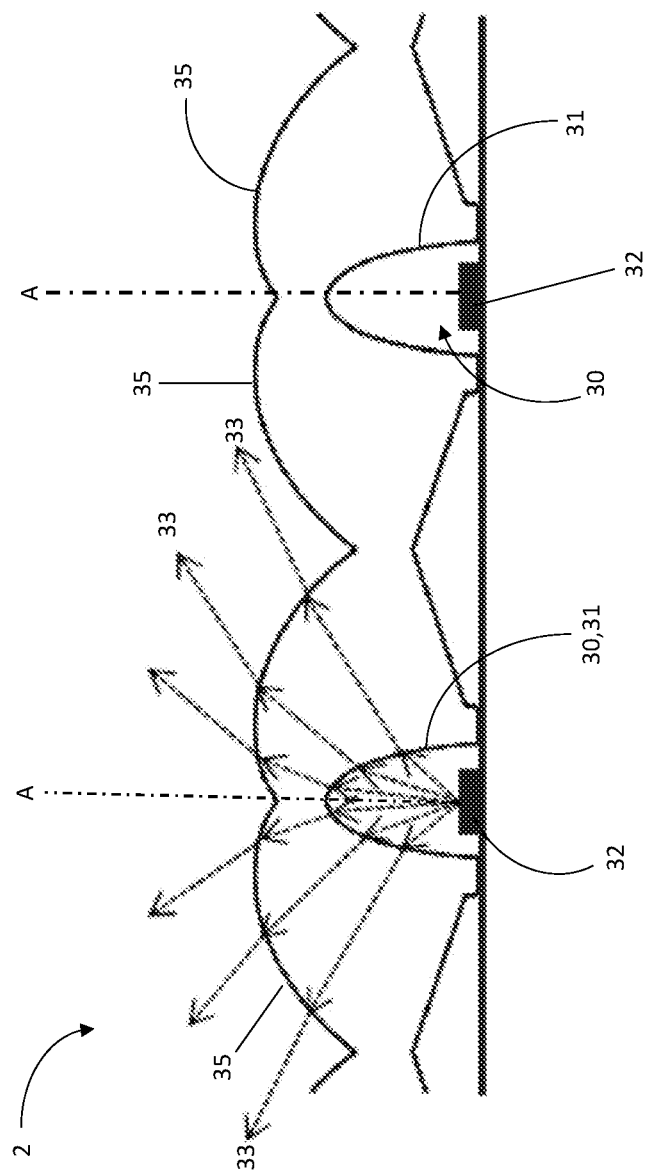
FIG. 28 is a cross-sectional view of a section of a lens according to some embodiments.

The grooves of the lens are defined by refractive walls. Refractive walls defining the grooves can have any contour or profile consistent with the technical objectives described herein. In some embodiments, for example, the walls exhibit a smooth curved profile or contour that can be approximated by one or more mathematical functions, such as quadratic functions. Alternatively, the walls can exhibit a stepped or discontinuous profile comprising linear and/or curvelinear sections. In some embodiments, the refractive walls work in conjunction with the light extraction side of the lens to diverge light from the central axis of the lens. FIG. 28 illustrates a cross-sectional view of a section of a lens, according to some embodiments. In the embodiment of FIG. 28, the grooves 30 are defined by refractive walls 31 having smooth contour and curvature. The refractive walls 31 and refractive surfaces 35 can diverge light 33 received from the light emitting diode 32 from a central axis (A) of the groove 30.

Figure 29:
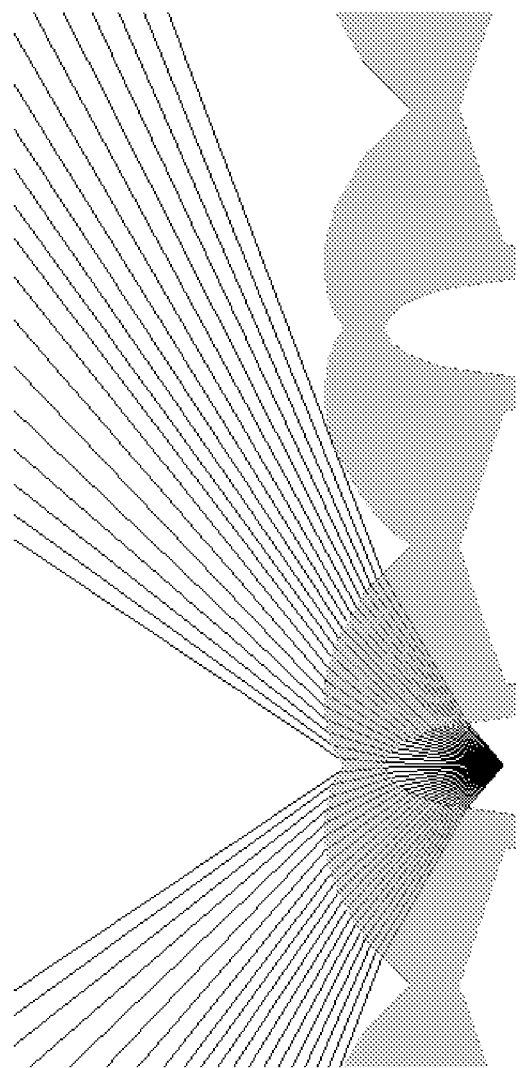
FIG. 29 is a rayfan diagram of a lens according to some embodiments.

The light extraction side of the lens comprises refractive extraction surfaces for diverging light from the central axis of the grooves. The refractive extraction surfaces can have any contour or profile consistent with diverging light from the central axis of the grooves. In some embodiments, the refractive extraction surfaces can exhibit smooth curved profiles, such as one or more convex surfaces. Alternatively, the refractive extraction surfaces can comprise one or more refractive facets. In further embodiments, the refractive extraction surfaces can comprise any combination of smooth surfaces and facets. In the embodiment illustrated in FIG. 28, the refractive extraction surfaces 35 comprise intersecting convex surfaces. The refractive convex surfaces diverge light 33 received from the light emitting diode 32 away from a central axis (A) of the grooves. Moreover, the refractive walls 31 defining the groove 30 also participate in diverging the light 33 away from the central axis (A). FIG. 29 is a rayfan diagram illustrating light paths through a lens having the architecture of FIG. 28. As provided in FIG. 29, light received from the light emitting diode is diverged from the central axis of the groove by the refractive walls defining the groove in conjunction with the convex refractive extraction surfaces. In some embodiments, the walls defining the groove and/or the extraction surfaces do not comprise any total internal reflection (TIR) surfaces.

In some embodiments, the lens spreads light received from the light emitting diode in a manner that rays of the light do not overlap or interfere with one another. As illustrated in the rayfan of FIG. 29, for example, the individual rays are refracted at increasingly wider angles as the convex surfaces extend from the central axis of the groove. Diverging light from the central axis of the groove permits light mixing between light emitting diodes of adjacent and/or concentric grooves. This light mixing can increase uniformity and reduce pixilation. This mixing can also enhance diffuser performance for decreasing/eliminating pixilation and providing uniform lighting output.

In addition, the light rays at such wider angles can form the wide light distribution of the associated luminaire, which is desirable for a distribution with Spacing Criteria >1.9.

In some embodiments, the lens comprises one or more light extraction facets at the perimeter or edge of the lens. The extraction facets can mitigate any hot spots or non-uniformities resulting from the wide refraction angles provided by the refractive extraction surfaces of the lens, in some embodiments. The facets can comprise a plurality of planar or curved surface portions extending along a plane or curve respectively, which intersects with a plane or curve of an adjacent planar or curved surface portion. Some of the adjacent planes or curves intersect with unequal slopes. The extraction facets can comprise refractive surfaces, TIR surfaces or any combination thereof. In some embodiments, extraction facets can have any desired cross-sectional geometry including triangular or trapezoidal. The extraction facets can extend along the entire perimeter of the lens or only a portion thereof. The extraction facets can have any desired arrangement. In some embodiments, for example, the facets are concentric with one another.

Figure 30:
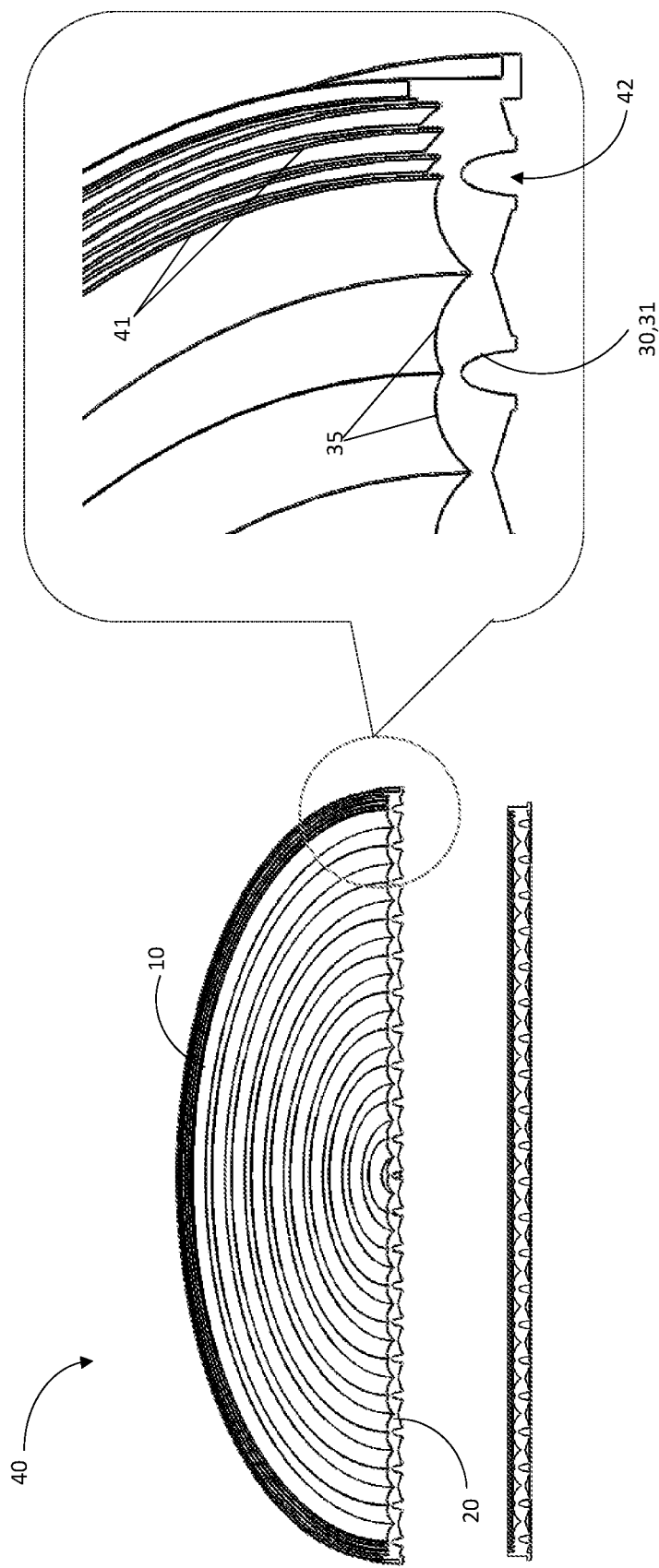
FIG. 30 is a cross-sectional view of a lens illustrating edge facets according to some embodiments.

FIG. 30 illustrates a sectional view of a lens including refractive facets along the lens perimeter. As provided in FIG. 30, the facets 41 exhibit a concentric arrangement at the perimeter of the lens 40 and partially replace refractive extractions surfaces associated with the outermost groove 42. In this way, pixilation, hot spots and/or other lighting non-uniformities at the perimeter of the lens and/or associated diffuser or glare shield are mitigated or eliminated.

Lenses described herein can have high optical efficiency. In some cases, the optical efficiency of fixtures with lenses can have an optical efficiency 80-85%, 85-90%, 90-95%, or greater than 95%.

II. Luminaires

In another aspect, luminaires are described herein comprising lenses described in Section I above. The luminaires can deliver symmetrical or asymmetrical lighting distributions that have reduced pixelation or pixelation-free lighting. Luminaires described herein are not limited to specific design and/or lighting application, and can provide light distributions as high bay fixtures, low bay fixtures, or any fixture not inconsistent with the objectives of this disclosure. In some embodiments, luminaires are mounted on the ceiling. Alternatively, in some instances, luminaires can be mounted on a floor for delivery of light to wall, floor, and/or ceiling surfaces.

Figure 7A:
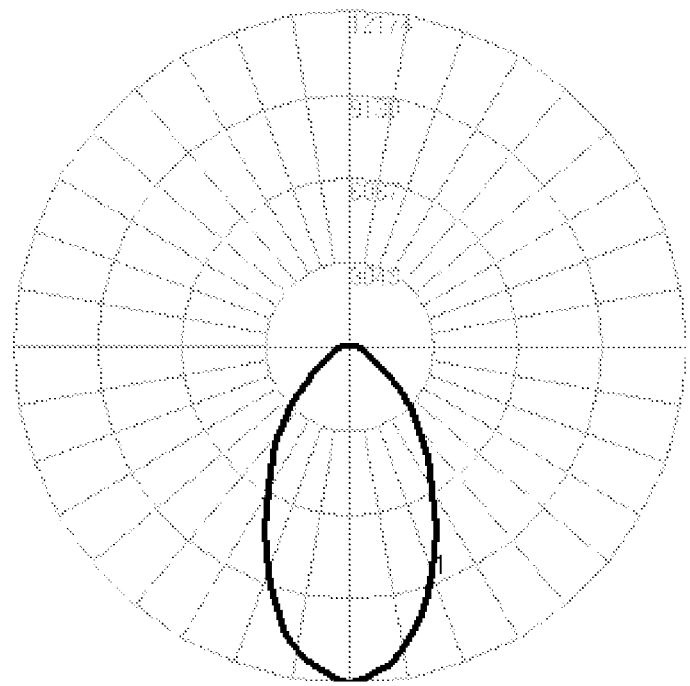
FIG. 7A is an exemplary narrow distribution generated by a lens in FIG. 3A.
Figure 7B:
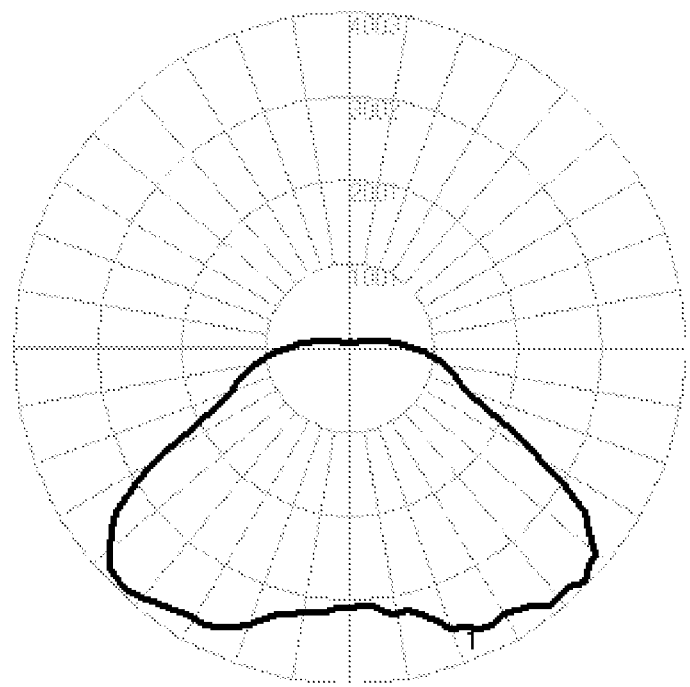
FIG. 7B is an exemplary wide distribution generated by a lens in FIG. 4A.
Figure 7C:
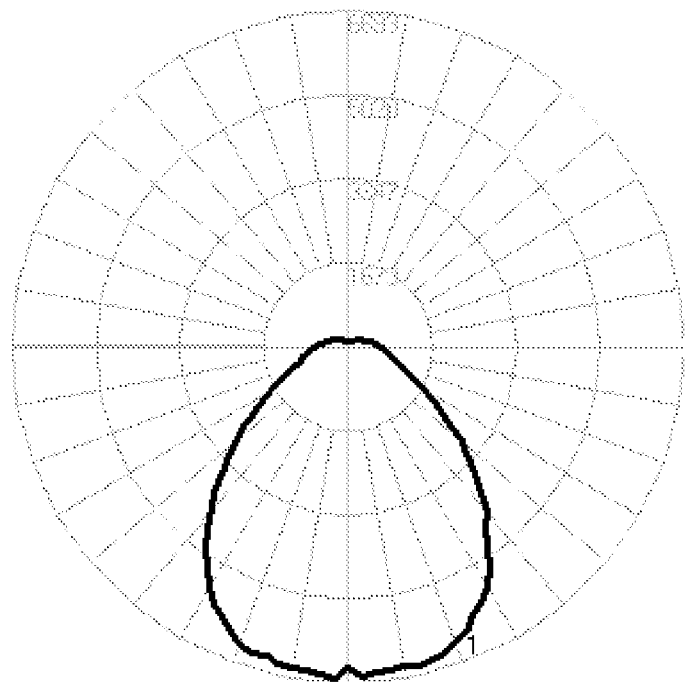
FIG. 7C is an exemplary medium distribution generated by a lens in FIG. 5A.
Figure 7D:
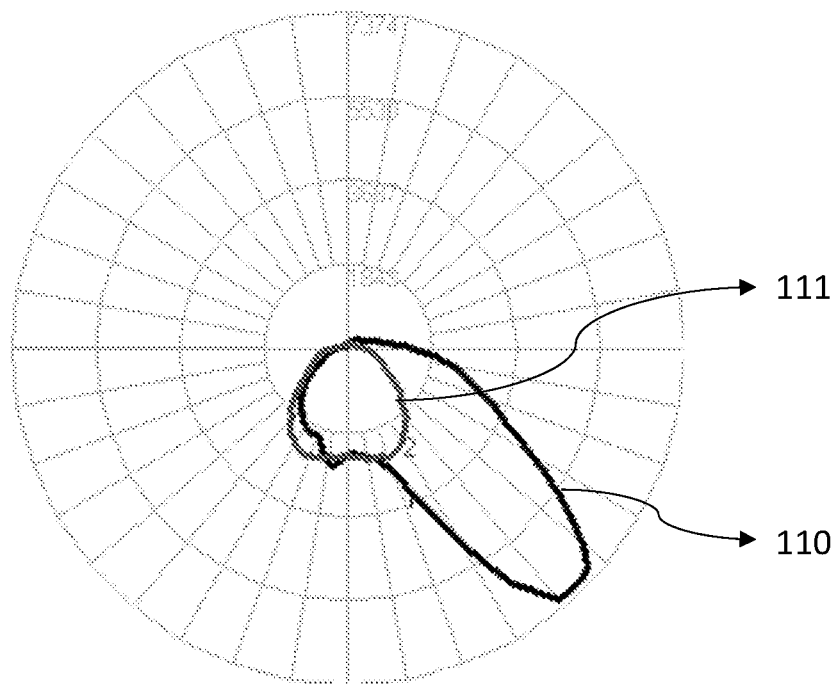
FIG. 7D is an exemplary asymmetric distribution generated by a lens in FIG. 6A.
Figure 8A:
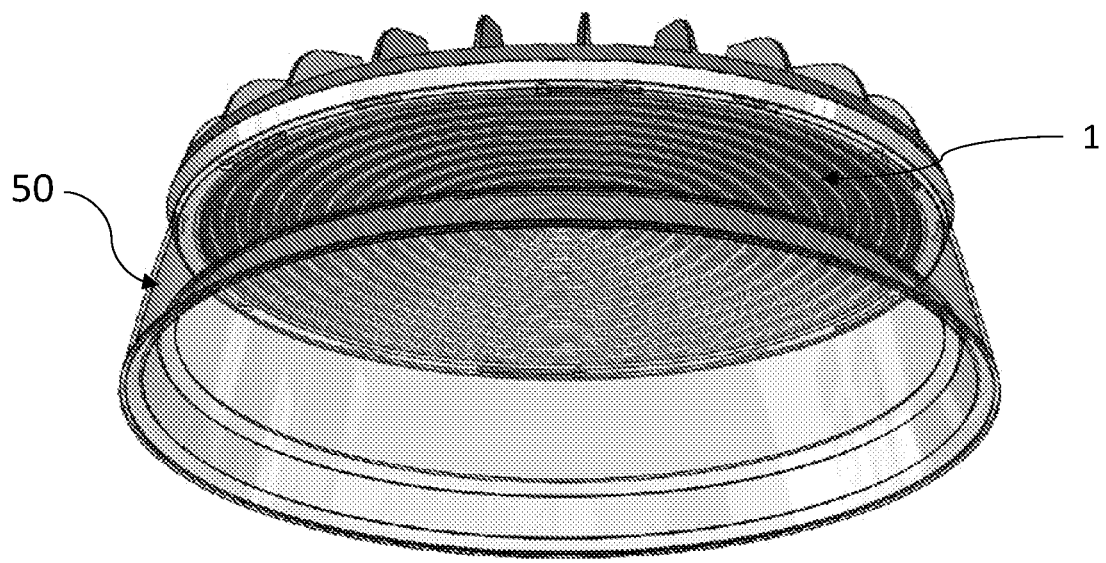
FIG. 8A is a perspective view of an exemplary luminaire.
Figure 8B:
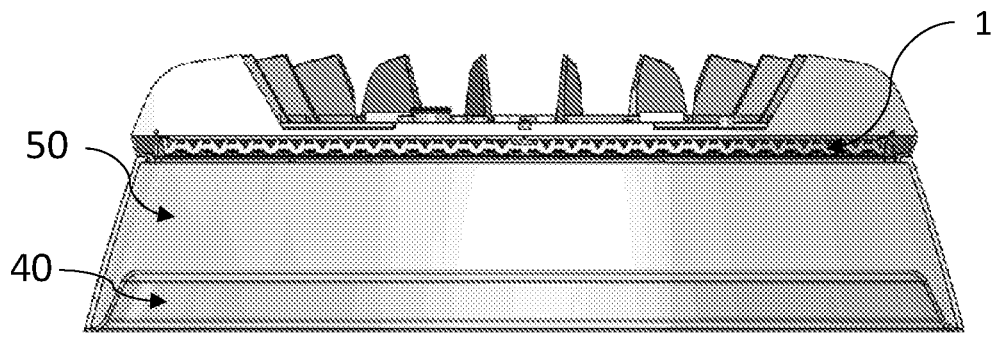
FIG. 8B is a cross-sectional view of luminaire in FIG. 8A.
Figure 9A:
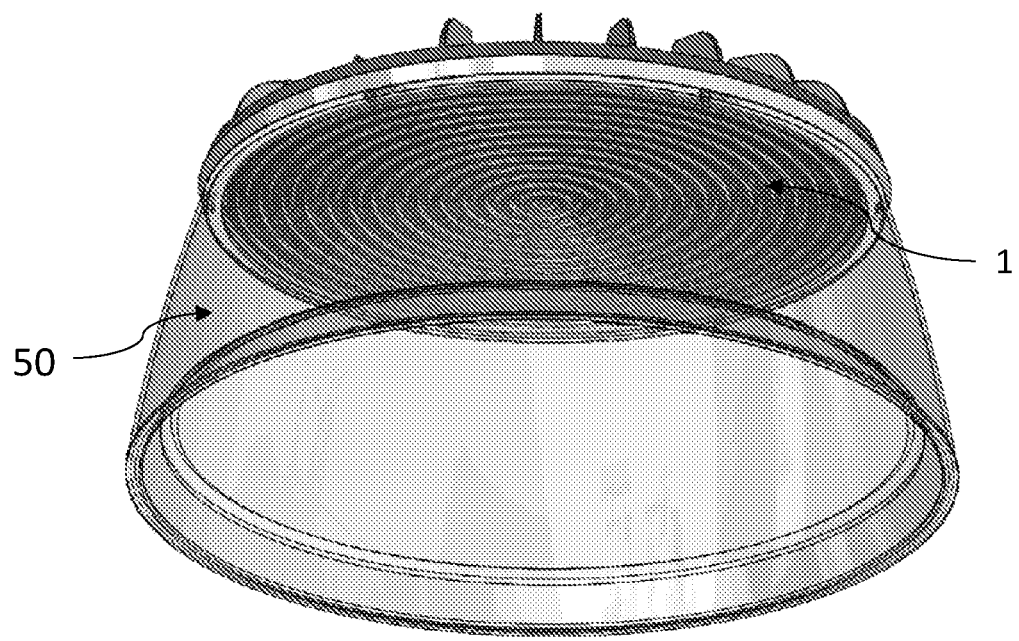
FIG. 9A is a perspective view of an exemplary luminaire.
Figure 9B:
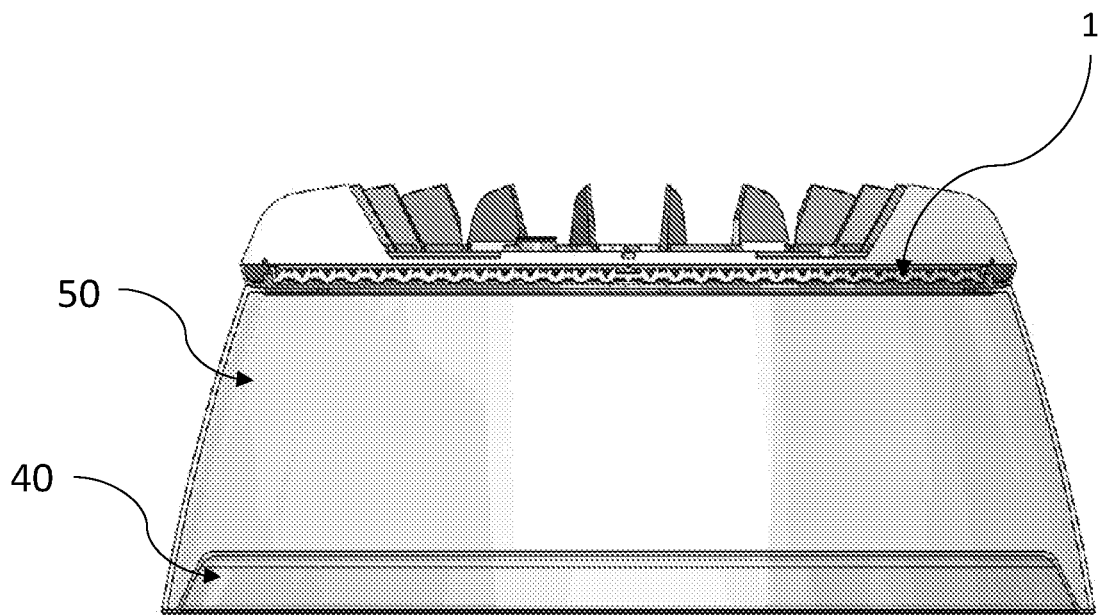
FIG. 9B is a cross-sectional view of luminaire in FIG. 9A.
Figure 10A:
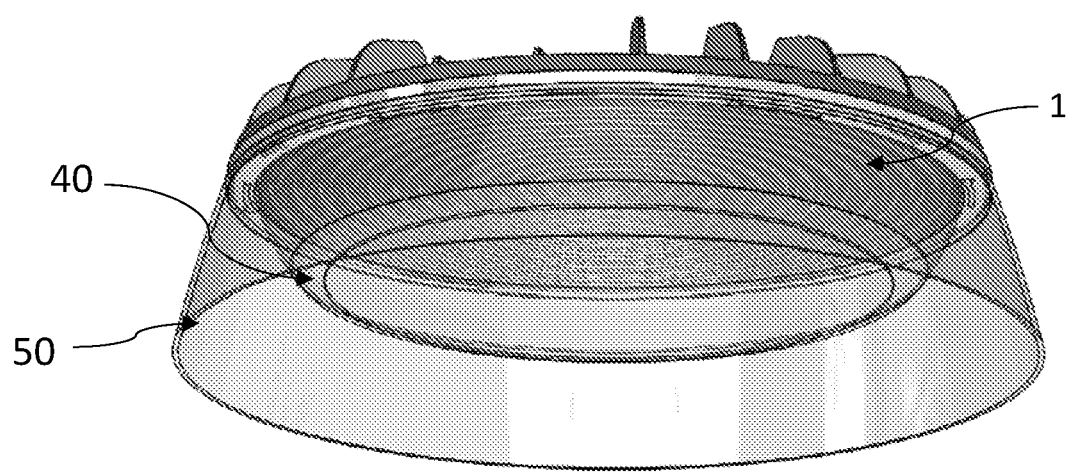
FIG. 10A is a perspective view of an exemplary luminaire.
Figure 10B:
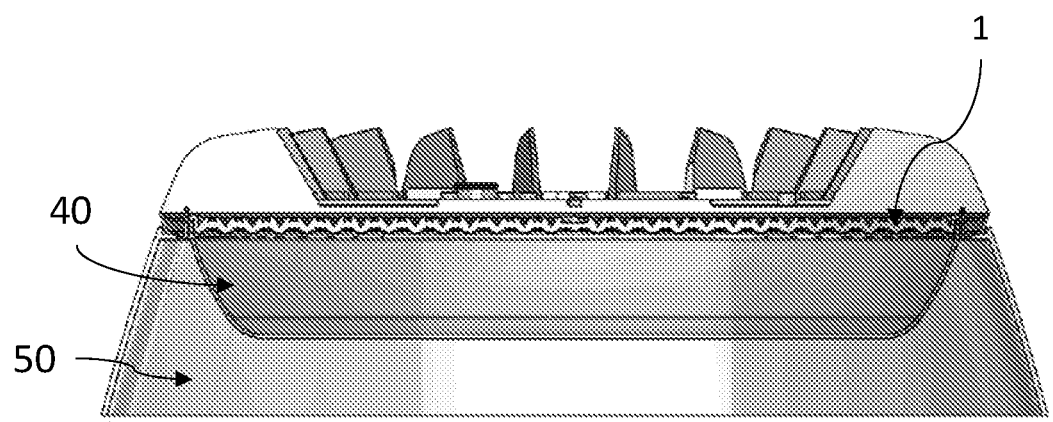
FIG. 10B is a cross-sectional view of luminaire in FIG. 10A.
Figure 11A:
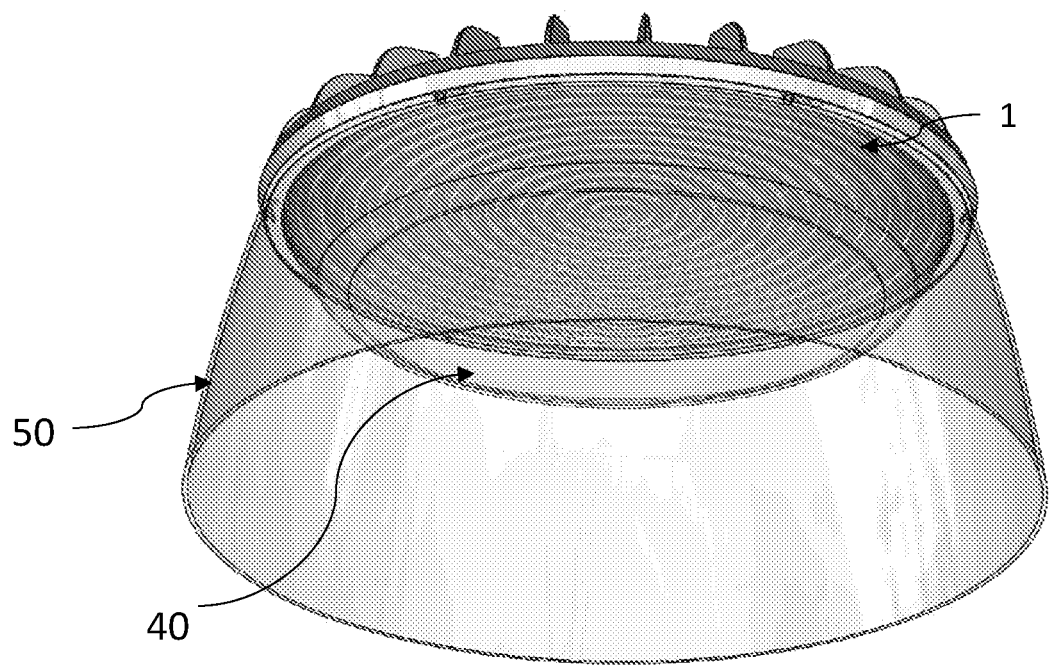
FIG. 11A is a perspective view of an exemplary luminaire.
Figure 11B:
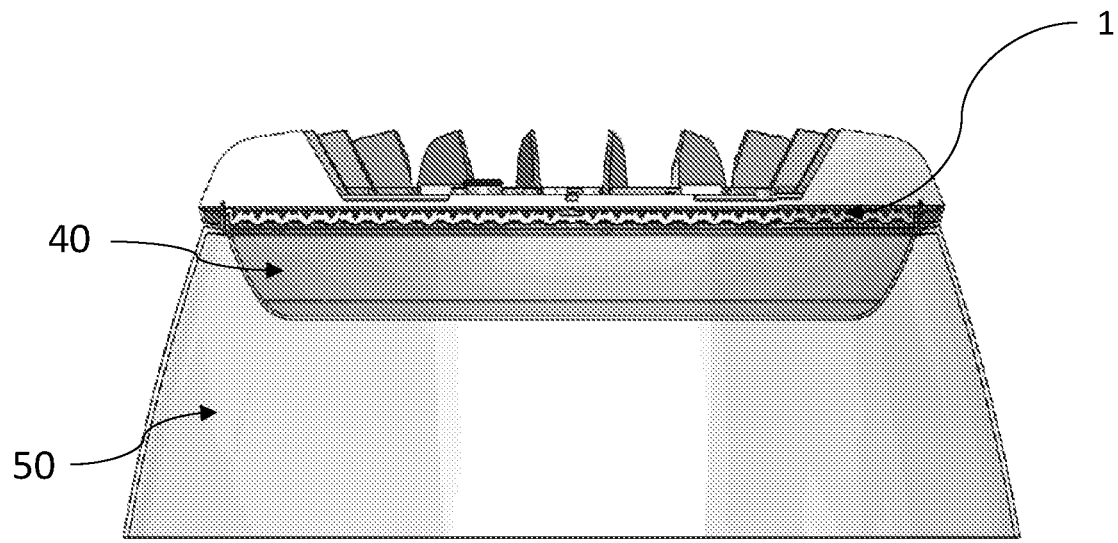
FIG. 11B is a cross-sectional view of luminaire in FIG. 11A.
Figure 12A:
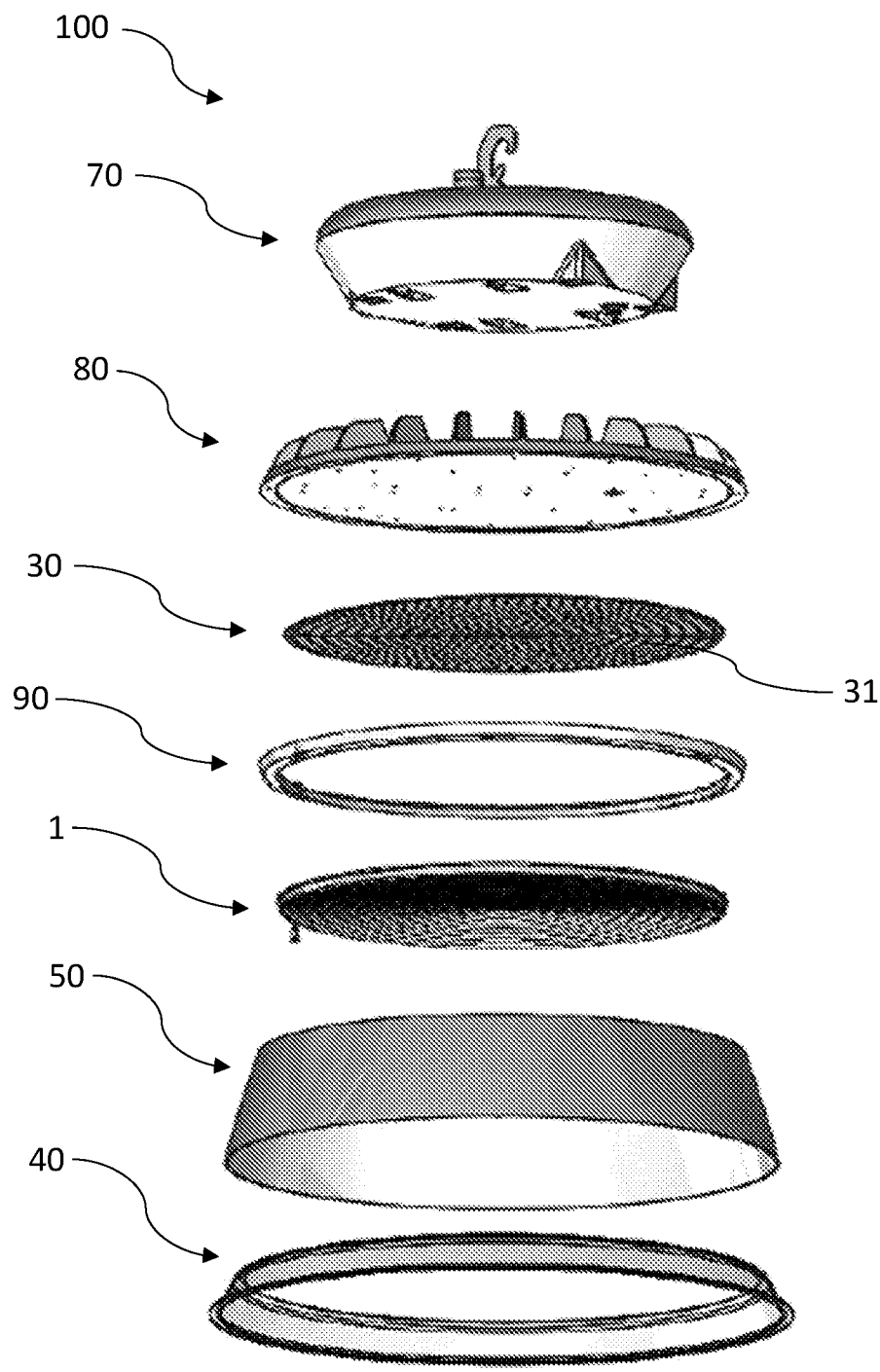
FIG. 12A is an exploded view of an exemplary luminaire.
Figure 12B:
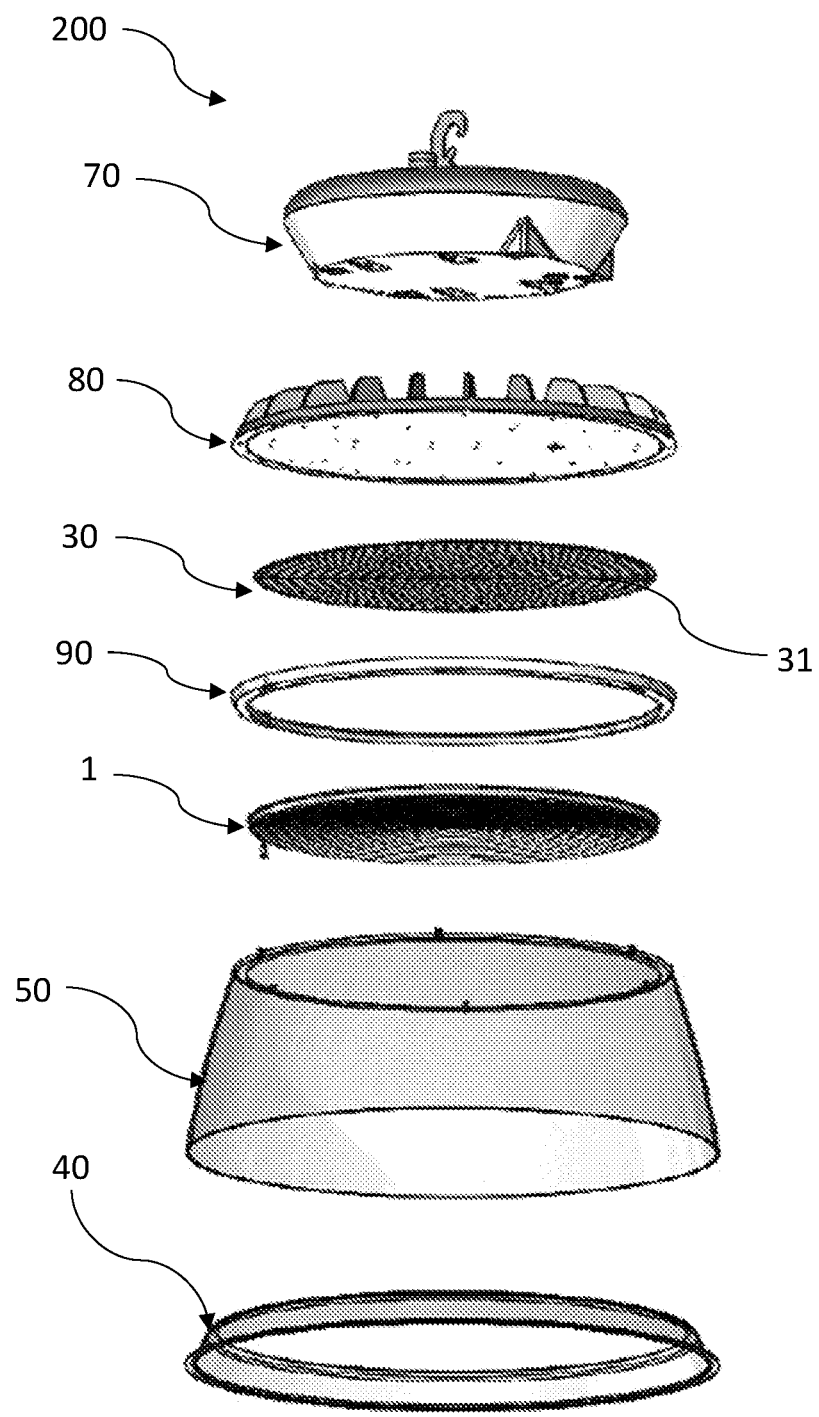
FIG. 12B is an exploded view of another exemplary luminaire.
Figure 13A:
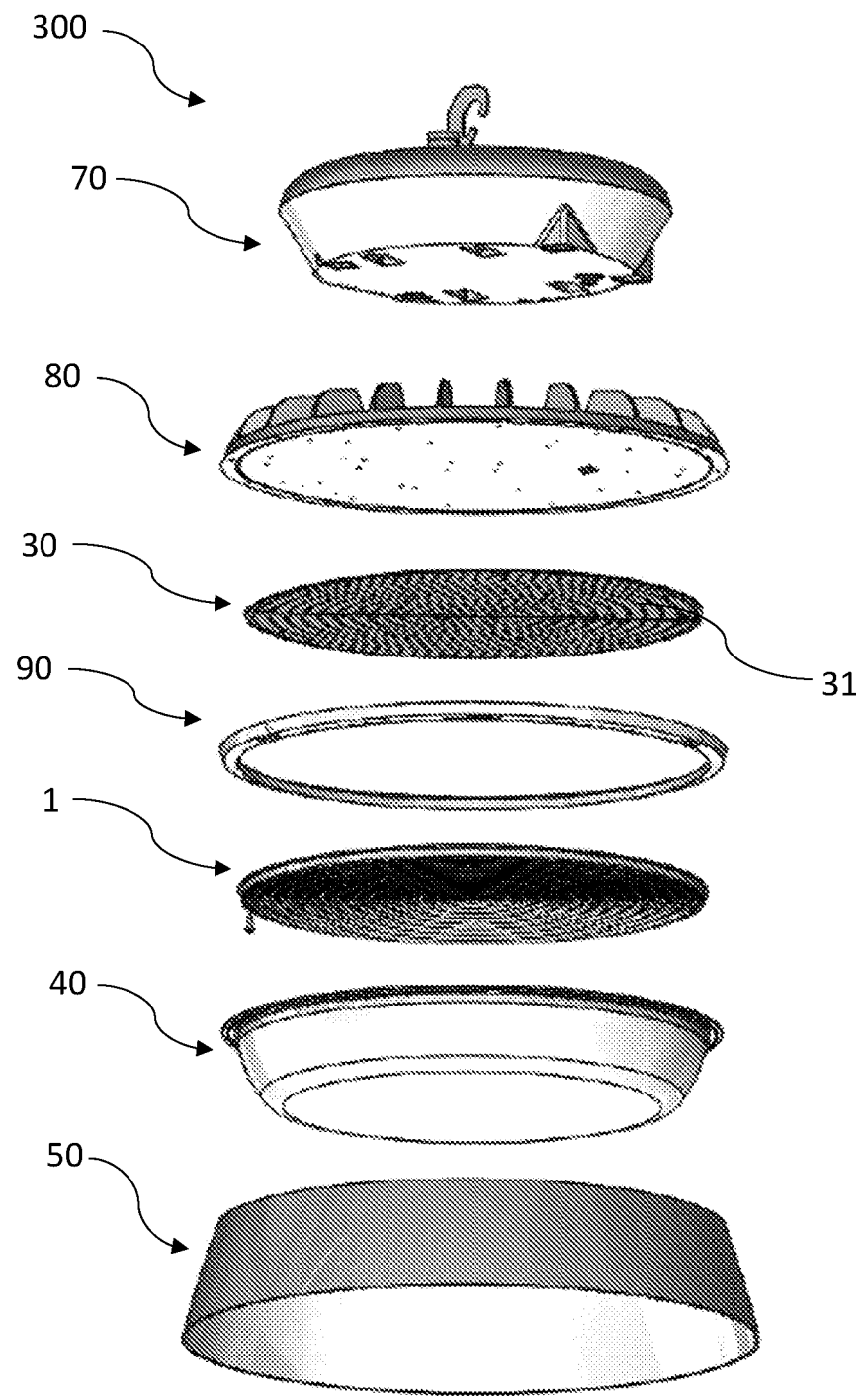
FIG. 13A is an exploded view of another exemplary luminaire.
Figure 13B:
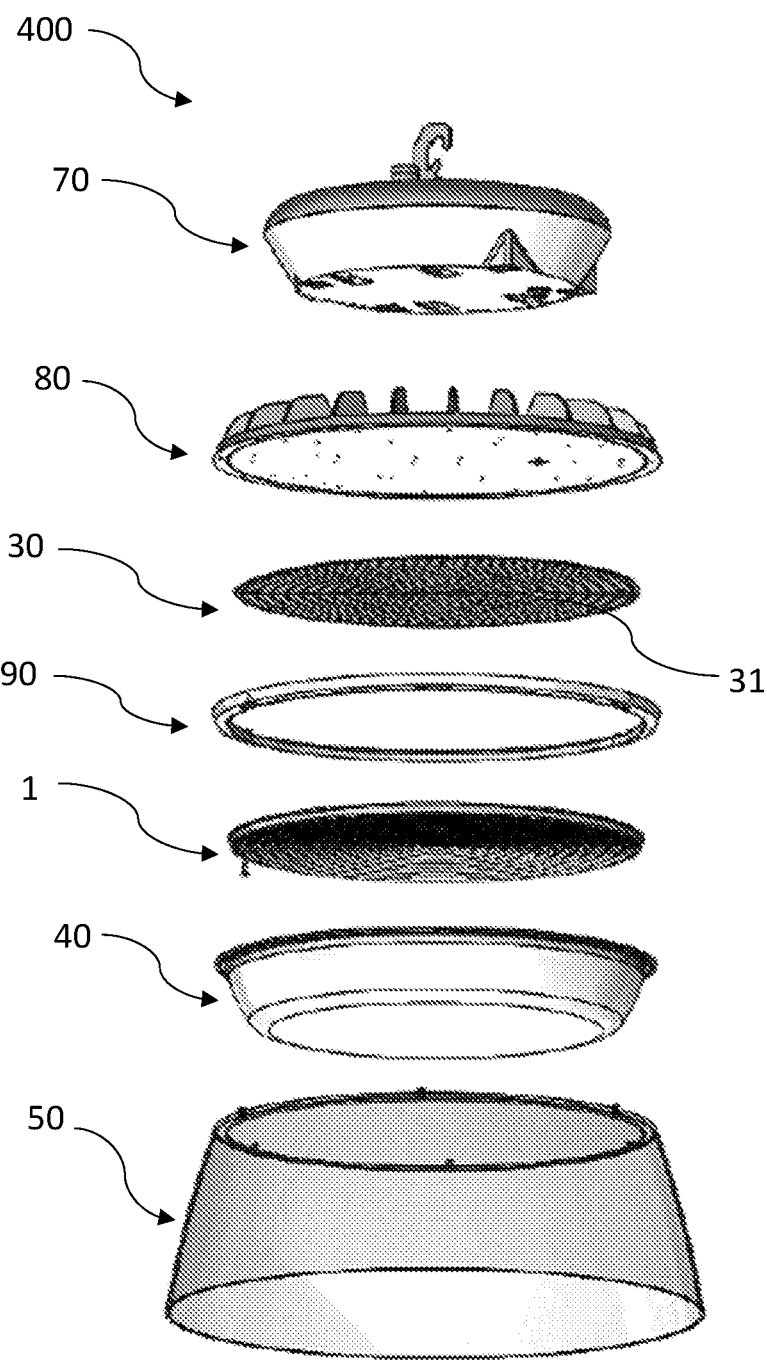
FIG. 13B is an exploded view of another exemplary luminaire.

In exemplary features shown in FIG. 7A-7D, intensity distributions are generated by luminaires with the lenses in FIG. 3 to FIG. 6. Narrow distribution gives a spacing criterion ("SC") of approximately 0.94, wide distribution of approximately SC 1.90, medium distribution of approximately SC. 1.3, or asymmetric distribution of approximately SC 1.42 and 2.76 in its perpendicular planes. FIG. 7D shows two intensity distributions in perpendicular vertical planes (110 and 111) created by the asymmetric lens in FIG. 6A. These spacing criterion values are approximate, and in other embodiment can vary, such as ±0.5.

Luminaires described herein, can comprise an LED light source, and a lens described in Section I positioned over the LED light source. The lens can have any design, construction and/or properties described in Section I herein. The LED light source can comprise an array of LEDs. FIGS. 8A-11B show different embodiments of luminaires, and FIGS. 12A to 13B show exploded views of different variations of luminaires. In the embodiment shown in FIGS. 12A-13B, luminaires 100-400 comprises an LED array 30 light source and optic 1 positioned over an LED light source 30. These four exemplary luminaires have different diffuser and shroud options: two diffuser shapes with an assembled location, and two glare shields (long and shallow). Similarly for the embodiment shown in FIG. 15, luminaire 700 comprises an LED array 30 light source and optic 1 positioned over an LED light source 30. The optic can have any construction and/or properties described in Section I herein, such as those described for optic 1.

Figure 14:
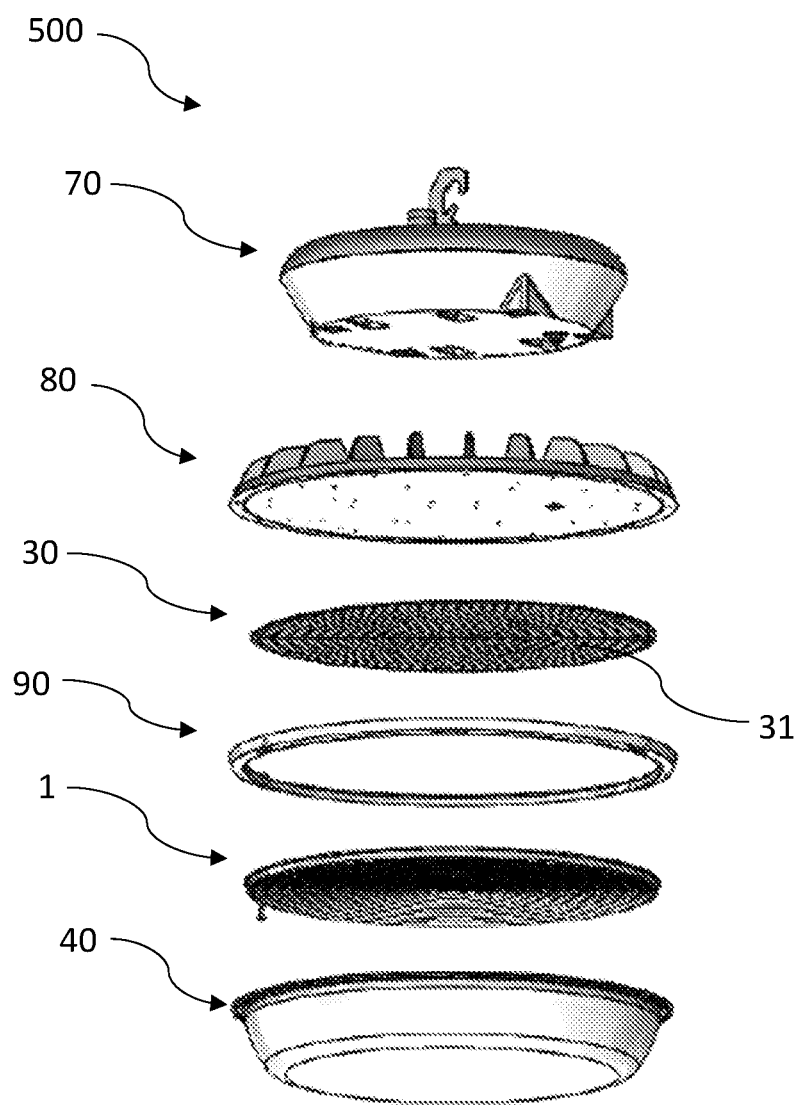
FIG. 14 is an exploded view of another exemplary luminaire, without glare shield.

FIG. 14 is an embodiment of a luminaire that omits a glare shield while still maintaining the desired performance.

The LED light source can be arranged in an array format, including one-dimensional LED arrays or two-dimensional LED arrays. In some embodiments, the LED array has a recti-linear or a concentric format. The LED light source 30 shown generally in FIGS. 12A-15 comprises an arrayed format on PCB (Printed Circuit Board) and a light emitting surface 31 onto which a two-dimensional array of LEDs are positioned. Generally, the LED light source 30 has a shape complementary to the shape of the optic 1. In the examples shown in FIG. 12A-14, LED light source 30 has an annular shape corresponding to the annular shape of optic 1. However, the shape of the light source 30 is not limited to annular shapes, but can also have other shapes, such as in the embodiment shown in FIG. 15, where LED light source 30 has a central aperture 54.

In some embodiments, a plurality of LEDs in the LED light source 30 are distributed in a plurality of concentric rings having a spatial position corresponding to concentric grooves 11 formed on optic 1, such that when the optic 1 is positioned over the LED array 30, each of the LEDs is positioned in or proximate to the grooves 11. In instances where the grooves 11 are in a linear pattern rather than a concentric pattern, the LED array 30 would have a corresponding linear pattern such that each of the LEDs would be positioned in or proximate to the grooves 11 when the linearly patterned optic 1 is positioned over the LED array 30.

As used herein, the term "LED" can comprise packaged LED chip(s) or unpackaged LED chip(s). LED array 30 can use LEDs of the same or different types and/or configurations. The LEDs can comprise single or multiple phosphor-converted white and/or color LEDs, and/or bare LED chip(s) mounted separately or together on a single substrate or package that comprises, for example, at least one phosphor-coated LED chip either alone or in combination with at least one-color LED chip, such as a green LED, a yellow LED, a red LED, and the like. The LED array can comprise phosphor-converted white or color LED chips and/or bare LED chips of the same or different colors mounted directly on a printed circuit board (e.g., chip on board) and/or packaged phosphor-converted white or color LEDs mounted on the printed circuit board, such as a metal core printed circuit board or FR4 board. In some embodiments, the LEDs can be mounted directly to the heatsink or another type of board or substrate. Depending on the embodiment, the luminaire can employ LED arrangements or lighting arrangements using remote phosphor technology as would be understood by one of ordinary skill in the art, and examples of remote phosphor technology are described in U.S. Pat. No. 7,614,759, assigned to the assignee of the present invention and hereby incorporated by reference.

In cases where a soft white illumination with improved color rendering is to be produced, each LED array 30 can include one or more blue shifted yellow LEDs and one or more red or red/orange LEDs as described in U.S. Pat. No. 7,213,940, assigned to the assignee of the present invention and hereby incorporated by reference. The LEDs can be disposed in different configurations and/or layouts as desired, for example utilizing single or multiple strings of LEDs where each string of LEDs comprise LED chips in series and/or parallel. Different color temperatures and appearances could be produced using other LED combinations of single and/or multiple LED chips packaged into discrete packages and/or directly mounted to a printed circuit board as a chip-on board arrangement. In one embodiment, the LED array 30 comprises any LED, for example, an XP-Q LED incorporating TrueWhite® LED technology or as disclosed in U.S. Pat. No. 9,818,919, granted Nov. 14, 2017, entitled "LED Package with Multiple Element Light Source and Encapsulant Having Planar Surfaces" by Lowes et al., the disclosure of which is hereby incorporated by reference herein, as developed and manufactured by Cree, Inc., the assignee of the present application. If desirable, other LED arrangements are possible. In some embodiments, a string, a group of LEDs or individual LEDs can comprise different lighting characteristics and by independently controlling a string, a group of LEDs or individual LEDs, characteristics of the overall light out output of the luminaire can be controlled.

As shown in the embodiments of FIGS. 8A-15, luminaires 100-700 can further comprise one or more of a diffuser 40, glare shield 50, a sensor assembly, an LED driver 70, trim ring 90 and a heatsink 80.

Diffuser 40 can be made of any suitable diffuser material with light diffusing properties. The diffuser can permit concealment of any pixilated light beams while maintaining the desired light distributions. In some embodiments, the lighting distribution provided by the array of LEDs in conjunction with the lens has uniform luminance over the diffuser. The diffuser typically has a relatively high light transmission with lower diffusing properties, so that light is uniformly illuminated across the surface of the diffusor, but the light is generally not redirected. In some embodiments, the diffuser can have a light transmission of 80-85%, 85-90%, 90-92%.

When present, the diffuser is positioned over the lens. The diffuser can be positioned directly on and in contact with the lens, or proximate to the lens, such as shown in FIGS. 10A-11B. Alternatively, the diffuser can be positioned over the lens and spaced a distance away from the lens. FIGS. 8A-9B show embodiments of a diffuser positioned over the lens and spaced a distance away from the lens. The diffuser can have any thickness suitable for the LED array and lens employed in the luminaire. In some embodiments, the diffuser comprises one or more tapered surfaces. The diameter of the diffuser, for example, can taper along the vertical axis of the diffuser. In some embodiments, the diameter is greatest at the base of the diffuser. Alternatively, the diameter can be greatest along the top surface of the diffuser.

As described herein, the luminaire can further comprise a glare shield. Glare shield or shroud 50 can be a monolithic element or can be formed of two or more segments having the same or differing optical properties. The glare shield 50 can comprise a clear or diffuse material that can be formed of any desired material including clear or translucent polymeric materials, such as acrylic or polycarbonate. Alternatively, glare shield 50 can be opaque, being formed from a non-translucent material, including metal. The shape and size of the glare shield 50 can vary, depending upon the desired application. FIGS. 8A-11B illustrate different shapes of glare shields 50, such as a long glare shield in FIGS. 9A, 9B, 11A, and 11B, or a relatively short glare shield in FIGS. 8A, 8B, 10A, and 10B.

In some cases, the diffuser generates uplighting, which is light propagative into the opposite space to the main lighting space. The uplighting can be generated by the diffuser scattering a small percentage of the light outward into the glare shield. The glare shield subsequently scatters some of the light to provide the uplighting. Any desired amount of uplighting can be provided by the diffusor in conjunction with the glare shield. In some embodiments, the sidewall(s) of the diffuser can be tapered to alter the amount of light directed to the glare shield for uplighting. The geometry of the glare shield may also be tailored to increase or decrease the amount of uplighting. Notably, the interaction between diffusor and glare shield design can be independent of any lens design described herein. In some cases, 5-20% of the luminaire output (lumens) is classified as uplight. Additionally, luminaires comprising lenses and architecture described herein can have a spacing criteria (SC) greater than 1.9 or ranging from 2 to 2.5, in some embodiments.

Figure 31:
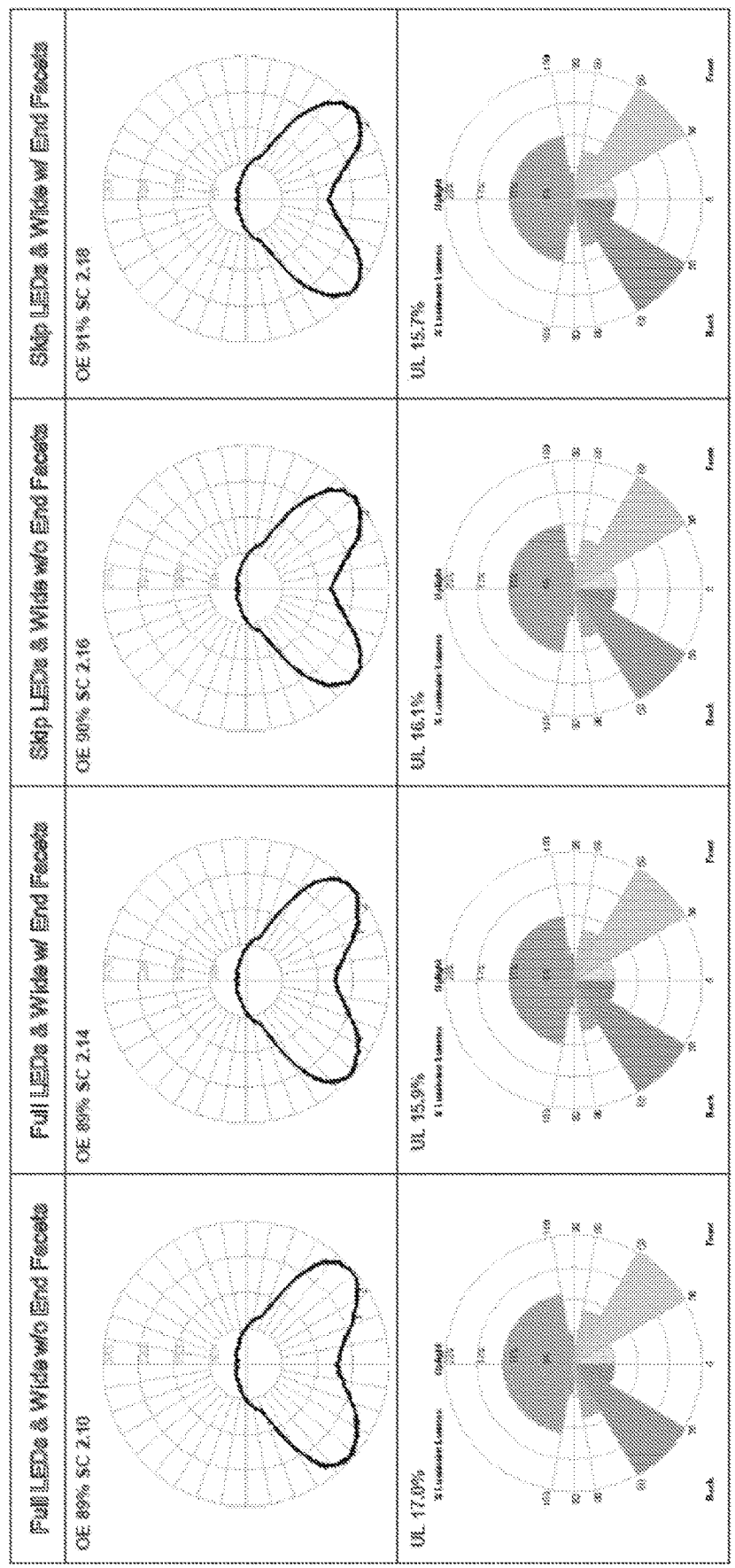
FIG. 31 illustrates lighting distributions of luminaires employing various lens architectures according to some embodiments.

Luminaires employing lens architectures described herein can provide a variety of lighting distributions. FIGS. 24A-24D provide lighting distributions of luminaire employing a lens comprising grooves defined by a central refractive region and walls comprising total internal reflection faces, according to some embodiments. FIG. 31 illustrates lighting distributions of luminaires comprising a lens including grooves for receiving light emitting diodes, the grooves defined by refractive walls. The lens comprises a light extraction side comprising refractive extraction surfaces diverging light from a central axis of the lens. The luminaires further comprise a polycarbonate diffuser and a glare shield. As provided in FIG. 31, two of the lenses comprise end facets described herein, and two lenses do not have the end facets. Additionally, the terminology "Skip LEDs" refers to elimination of LEDs at the perimeter of the PCB. The lighting distributions of FIG. 31 include 15 to 17 percent up-lighting, in additional to the symmetric down lighting component.

Figure 26A:
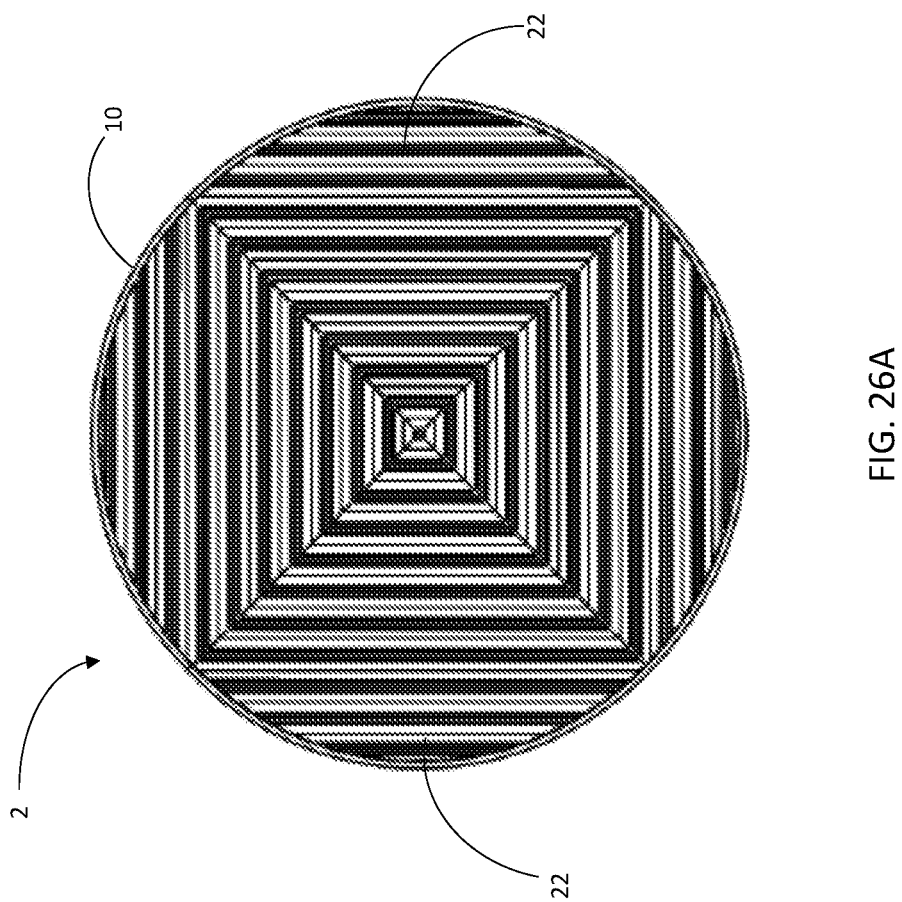
FIG. 26A is a plan view of a light extraction side of a lens according to some embodiments.
Figure 26B:
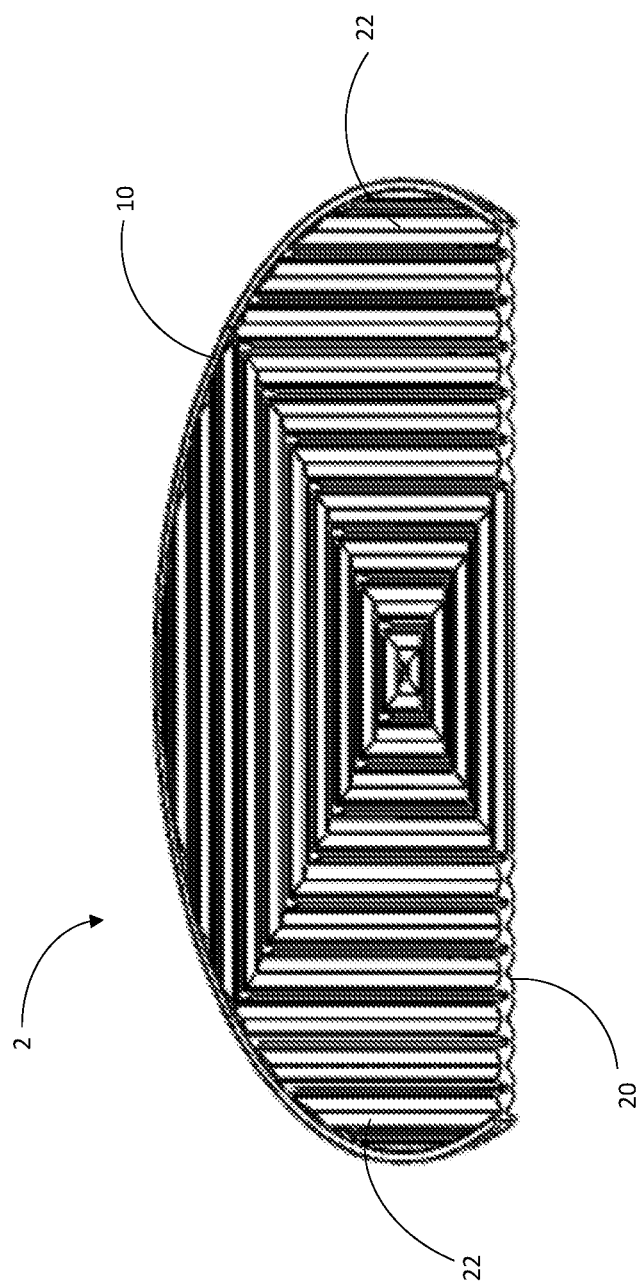
FIG. 26B is a slanted cross-sectional view of the lens of FIG. 26A.
Figure 27A:
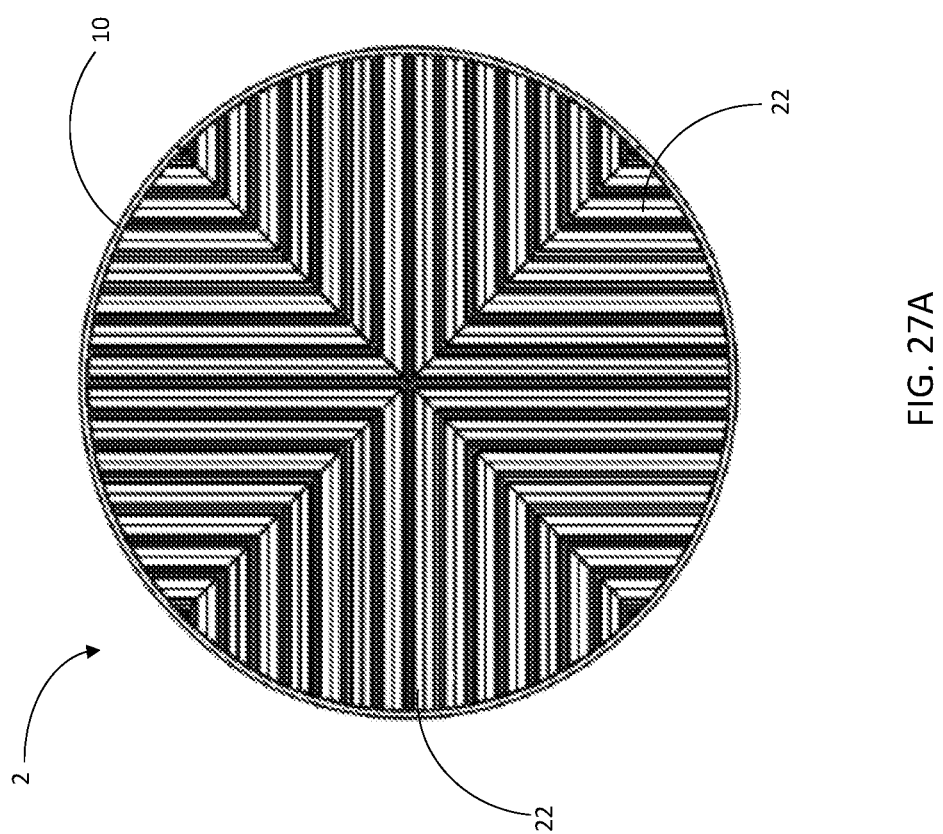
FIG. 27A is a plan view of a light extraction side of a lens according to some embodiments.
Figure 27B:
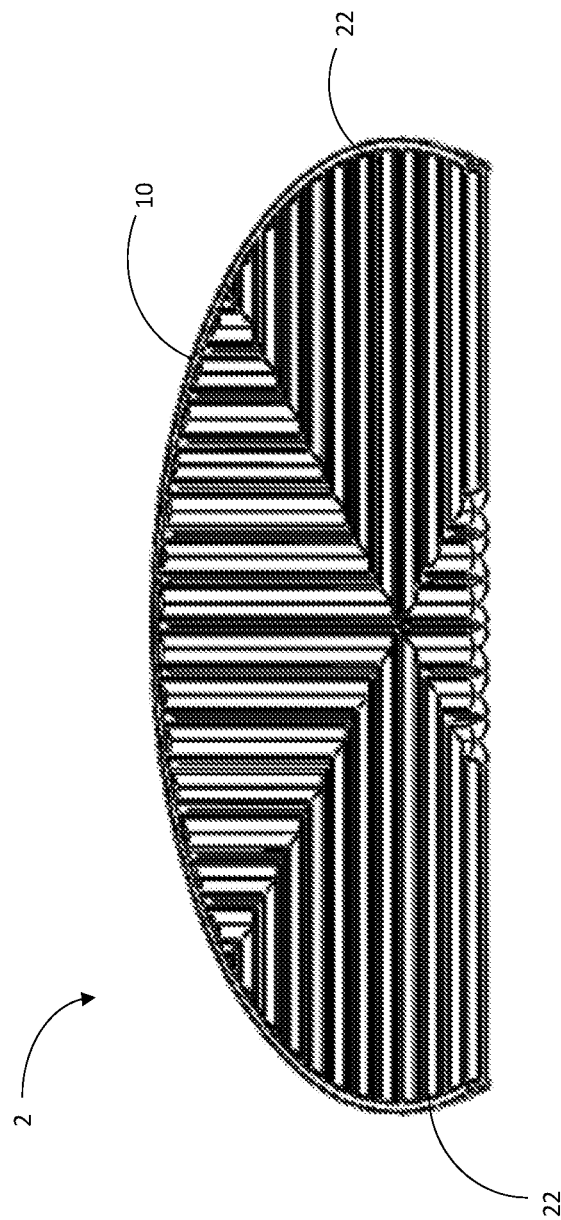
FIG. 27B is a slanted cross-sectional view of the lens of FIG. 27A.
Figure 32:
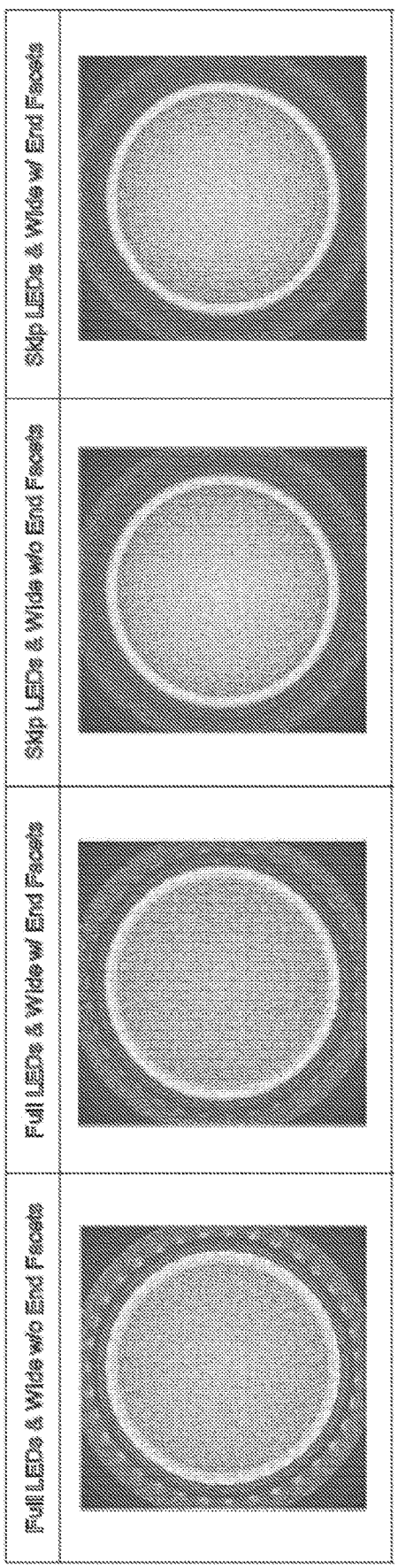
FIG. 32 illustrate lighting simulation results of the luminaires of FIG. 31.

FIG. 32 illustrates lighting results, including uniform luminance on the diffuser, of the luminaire having the distributions provided in FIG. 25. As illustrated in FIG. 26, full LEDs without end facets on the optic resulted in pixilation at the perimeter of the diffuser and shroud. End facets and LED skipping can each individually mitigate the pixilation, with the combination of the two providing elimination of the pixilation.

Figure 15:
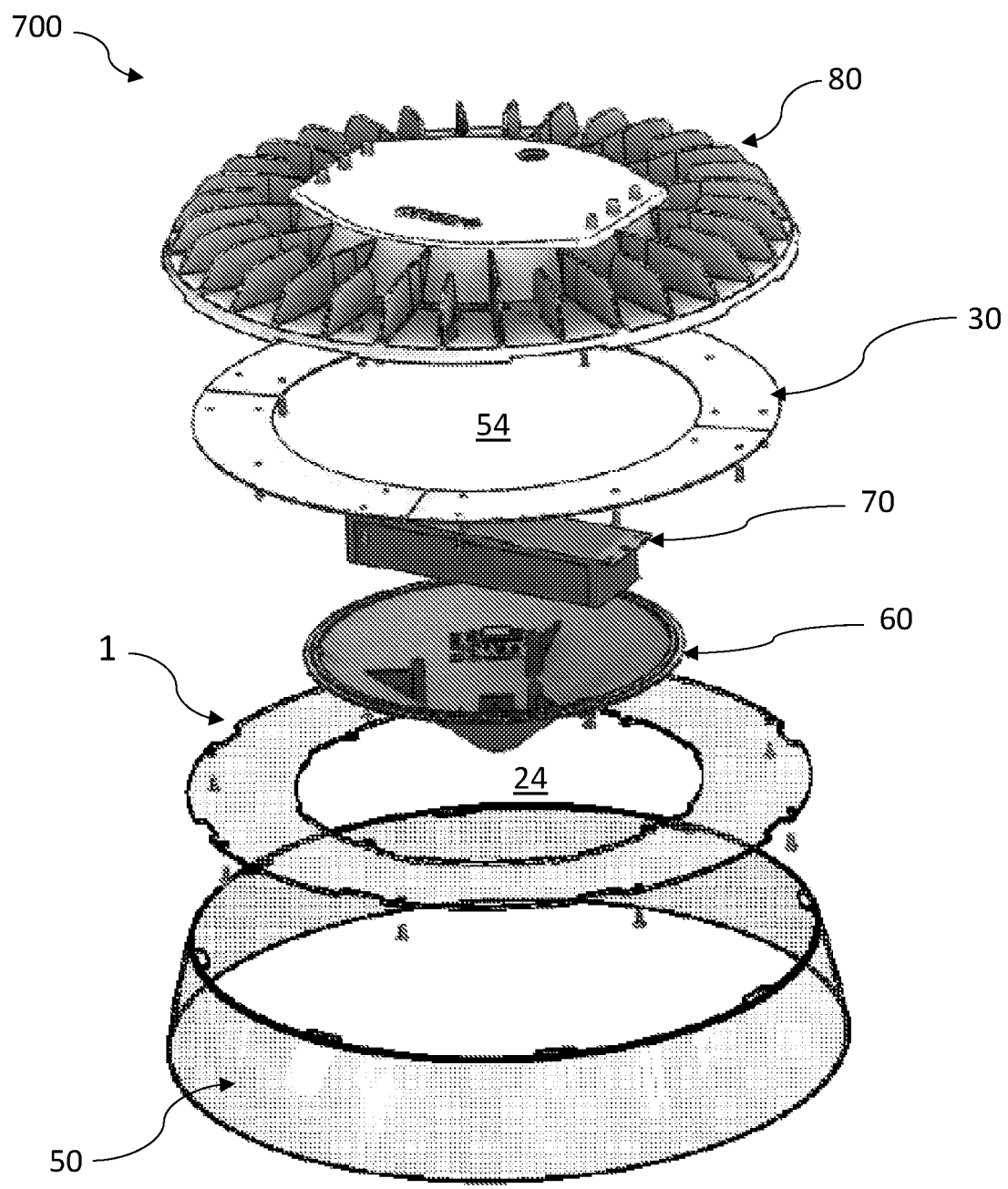
FIG. 15 is an exploded view of an exemplary luminaire having a lens with a central aperture and a sensor module.

In the embodiment shown in FIG. 15, a sensor assembly 60 can be positioned in a central aperture 24 of optic 1 and/or central aperture 54 of LED array 30. Additionally, as described in more detail below, sensor assembly 60 can be positioned in a receiving space of heatsink 80. Placement in the central aperture 24,54 can enable the sensor assembly 60 to connect directly to driver assembly 60, which can also be positioned in the central aperture 24,54. In other embodiments, the sensor assembly is separate from and not integral with the luminaire and can include networking, wired and/or wireless coupling to the luminaire. Further, the sensor assembly 60 can be recessed in the central aperture 24,54, precluding light from the LED array 30 from directly striking the sensor assembly 60. The sensor assembly 60 can have one or more sensors and/or functionalities including, but not limited to, low level light imaging and/or occupancy detection. In other embodiments, other sensor assemblies can be used.

The invention is not limited to the sensor assembly being positioned in a central aperture of the optic 1. In other embodiments, a sensor assembly can be positioned in the end or proximate to glare shield 50, depending on the desired application.

In some embodiments, the sensor assembly can incorporate an effective motion detection system based upon a visible light focal plane array such as a color or monochrome CMOS camera, in conjunction with imaging lens and digital processing. Physically, such motion detection sensor may closely resemble a camera module from a smartphone. Appropriate sensors may include those made by the Aptina division of On Semiconductor, by Ominivsion or others. Appropriate lens assemblies may result in a sensor module field of view from 70 degrees to 120 degrees. Relatively inexpensive camera modules with resolution as low as (640×480) or (1290×960) can deliver fundamental ground sampled resolution as small as 2 cm from a height of 20 feet, more than sufficient to detect major and minor motions of persons or small industrial vehicles such as forklifts.

For operation in zero light environments, the sensor assembly can comprise supplemental illumination provided by optional features, such as a low-power near IR LED illuminator or a low power mode of the luminaire itself where the luminaire remains on at 0.5% to 10.0% of full power.

In various embodiments described herein various smart technologies may be incorporated in luminaires described herein, such as in sensor assembly, as described in the following applications "Solid State Lighting Switches and Fixtures Providing Selectively Linked Dimming and Color Control and Methods of Operating," application Ser. No. 13/295,609, filed Nov. 14, 2011, which is incorporated by reference herein in its entirety; "Master/Slave Arrangement for Lighting Fixture Modules," application Ser. No. 13/782,096, filed Mar. 1, 2013, which is incorporated by reference herein in its entirety; "Lighting Fixture for Automated Grouping," application Ser. No. 13/782,022, filed Mar. 1, 2013, which is incorporated by reference herein in its entirety; "Multi-Agent Intelligent Lighting System," application Ser. No. 13/782,040, filed Mar. 1, 2013, which is incorporated by reference herein in its entirety; "Routing Table Improvements for Wireless Lighting Networks," application Ser. No. 13/782,053, filed Mar. 1, 2013, which is incorporated by reference herein in its entirety; "Commissioning Device for Multi-Node Sensor and Control Networks," "application Ser. No. 13/782,068, filed Mar. 1, 2013, which is incorporated by reference herein in its entirety; "Wireless Network Initialization for Lighting Systems," application Ser. No. 13/782,078, filed Mar. 1, 2013, which is incorporated by reference herein in its entirety; "Commissioning for a Lighting Network," application Ser. No. 13/782,131, filed Mar. 1, 2013, which is incorporated by reference herein in its entirety; "Ambient Light Monitoring in a Lighting Fixture," application Ser. No. 13/838,398, filed Mar. 15, 2013, which is incorporated by reference herein in its entirety; "System, Devices and Methods for Controlling One or More Lights," application Ser. No. 14/052,336, filed Oct. 10, 2013, which is incorporated by reference herein in its entirety; and "Enhanced Network Lighting," application Ser. No. 61/932,058, filed Jan. 27, 2014, which is incorporated by reference herein in its entirety.

LED driver 70 can include power or driver circuitry having a buck regulator, a boost regulator, a buck-boost regulator, a fly-back converter, a SEPIC power supply or the like and/or multiple stage power converter employing the like, and may comprise a driver circuit as disclosed in U.S. Pat. No. 9,791,110, granted Oct. 17, 2017, entitled "High Efficiency Driver Circuit with Fast Response" by Hu et al. or U.S. Pat. No. 9,303,823, granted Apr. 5, 2016, entitled "SEPIC Driver Circuit with Low Input Current Ripple" by Hu et al., the entirety of these applications being incorporated by reference herein. The circuit may further be used with light control circuitry that controls color temperature of any of the embodiments disclosed herein, such as disclosed in U.S. patent application Ser. No. 14/292,286, filed May 30, 2014, entitled "Lighting Fixture Providing Variable CCT" by Pope et al., the entirety of this application being incorporated by reference herein. Additionally, any of the embodiments described herein can include driver circuitry disclosed in U.S. Pat. No. 9,730,289, granted Aug. 8, 2017, entitled "Solid State Light Fixtures Having Ultra-Low Dimming Capabilities and Related Driver Circuits and Methods", the entirety of this application being incorporated herein by reference.

In some embodiments, LED driver 70 can comprise a driver assembly disclosed in U.S. Pat. No. 10,234,127, granted Mar. 19, 2019, entitled "LED Luminaire Having Enhanced Thermal Management" by Bendtsen et al., the entirety of this application being incorporated by reference herein.

Additionally, LED driver 70 can include the smart lighting control technologies disclosed in U.S. Patent Application Ser. No. 62/292,528, entitled "Distributed Lighting Network", assigned to the same assignee as this application, the entirety of the application being incorporated herein by reference.

Any of the embodiments disclosed herein may be used in a luminaire having one or more communication components forming a part of the light control circuitry, such as an RF antenna that senses RF energy. Such communication components can in some instances be included in the LED driver 70 or in a separate driver communicatively connected to LED driver 70. The communication components may be included, for example, to allow the luminaire to communicate with other luminaires and/or with an external wireless controller, such as disclosed in U.S. patent application Ser. No. 13/782,040, filed Mar. 1, 2013, entitled "Lighting Fixture for Distributed Control" or U.S. Provisional Application No. 61/932,058, filed Jan. 27, 2014, entitled "Enhanced Network Lighting" both owned by the assignee of the present application and the disclosures of which are incorporated by reference herein. More generally, the control circuitry can include at least one of a network component, an RF component, a control component, and one or more sensors. A sensor, such as a knob-shaped sensor, may provide an indication of ambient lighting levels and/or occupancy within the room or illuminated area. Other sensors are possible, and a sensor may be integrated into the light control circuitry as described herein, such as those described with reference to sensor assembly 60.

LED heatsink 80 can comprise any heatsink structure not inconsistent with the objectives of this disclosure. A typical LED heatsink comprises a base having a radially extending mounting body, a central aperture formed in the mounting body, and a housing positioned proximate to the central aperture, and being connected, coupled, or attached to the mounting body. The housing can comprise a component receiving space into which LED driver 70, various sensor components, backup battery, and the like can be positioned and housed. In some embodiments, the heatsink housing and LED driver 70 can be combined into one unit to form a driver assembly described in U.S. Pat. No. 10,234,127, granted Mar. 19, 2019, entitled "LED Luminaire Having Enhanced Thermal Management" by Bendtsen et al., which has already been incorporated by reference in its entirety herein. In some embodiments, sensor assembly 60 can connect, attach, or be coupled to the mounting body or housing of the heatsink.

Finned structures extend from heatsink 80. In some cases, the finned structures are positioned around a central aperture of heatsink 80. In some embodiments, finned structures are positioned on an upward facing surface of mounting body. Finned structures can have any desired design including single fins, branched fins, curved fins and combinations thereof. The finned structures, housing, and mounting body of heatsink 80 can be independently formed of any suitable thermally conductive material.

In some embodiments, the finned structures, housing, and mounting body are formed of a material having thermal conductivity of 3-300 W/m K. In some embodiments, finned structures, housing, and/or mounting body are fabricated from aluminum, steel sheet metal or other metal/alloy. For example, the finned structures, housing, and/or mounting body can be fabricated from aluminum or other metal by die-casting. In some embodiments, the finned structures are fabricated independent of the mounting body and subsequently coupled to the mounting body by one or more techniques including fasteners, soldering, or bonding by adhesive. Such embodiments provide significant design freedom regarding composition and density of the finned structures. Similarly, in some instances, the mounting body and housing of heatsink 80 are fabricated independently from each other, and subsequently coupled or connected by one or more techniques including fasteners, soldering, or bonding by adhesive. In some embodiments, the finned structures, housing, and mounting body are formed of the same material. In other embodiments, the finned structures, housing, and mounting body are formed of differing materials. For example, the finned structures can be an extruded polymeric material or aluminum alloy, the housing a stamped sheet metal, and the mounting body a cast metal. Design and structure of the LED heatsink 80 can be governed by several considerations, including cooling requirements for the LED array and cost factors.

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A lens comprising:
 a light receiving side comprising grooves for receiving light emitting diodes, the grooves arranged in a concentric format and extending continuously between the light emitting diodes in a radial direction and defined by a central refractive region and walls comprising total internal reflection faces; and
 a light extraction side opposite the light receiving side, the light extraction side comprising refractive extraction surfaces, total internal reflection extraction surfaces, or combinations thereof, wherein the refractive extraction surfaces, total internal reflection extraction surfaces or combinations thereof provide a bidirectional light distribution from the lens.

2. The lens of claim 1, wherein the light extraction side comprises facets including the total internal reflection extraction surfaces.

3. The lens of claim 2, wherein the facets comprise a triangular cross-section.

4. The lens of claim 2, wherein the facets are concentric with one another.

5. The lens of claim 2, wherein the facets are parallel to one another.

6. The lens of claim 1, wherein the central refractive region comprises a convex surface.

7. The lens of claim 1, wherein the central refractive region and total internal reflection faces direct light received by the lens to the refractive extraction surfaces and the total internal reflection extraction surfaces.

8. The lens of claim 7, wherein the lighting distribution has a full width at half maximum intensity of 120 degrees to 160 degrees.

9. The lens of claim 7, wherein the lighting distribution has a full width at half maximum intensity greater than 160 degrees.

10. The lens of claim 1, wherein the lighting distribution has a spacing criteria 0.7 to 1.2.

11. The lens of claim 1, wherein the lighting distribution has a spacing criteria 1.2 to 1.6.

12. The lens of claim 1, wherein the lighting distribution has a spacing criteria 1.6 to 2.1.

13. The lens of claim 1, wherein the lighting distribution has a spacing criteria >2.1.

14. A luminaire comprising:
an array of light emitting diodes; and
a lens positioned over the array of light emitting diodes, wherein the lens comprises a light receiving side including grooves for receiving light emitting diodes, the grooves arranged in a concentric format and extending continuously between the light emitting diodes in a radial direction and defined by a central refractive region and walls comprising total internal reflection faces, and a light extraction side opposite the light receiving side, the light extraction side comprising refractive extraction surfaces, total internal reflection extraction surfaces, or combinations thereof, wherein the refractive extraction surfaces, total internal reflection extraction surfaces or combinations thereof provide a bidirectional light distribution from the lens.

15. A lens comprising:
a light receiving side comprising grooves for receiving light emitting diodes, the grooves extending continuously between the light emitting diodes and defined by a central refractive region and walls comprising total internal reflection faces; and
a light extraction side opposite the light receiving side, the light extraction side comprising refractive extraction surfaces, total internal reflection extraction surfaces, or combinations thereof to provide a lighting distribution from the lens, wherein the lighting distribution has a spacing criteria of 0.7 to 2.1.

16. The lens of claim 15, wherein the lighting distribution has a full width at half maximum intensity of 120 degrees to 160 degrees.

17. A lens comprising:
a light receiving side comprising grooves for receiving light emitting diodes, the grooves arranged in a rectilinear format and extending continuously between the light emitting diodes in two or more linear directions and defined by a central refractive region and walls comprising total internal reflection faces; and
a light extraction side opposite the light receiving side, the light extraction side comprising refractive extraction surfaces, total internal reflection extraction surfaces, or combinations thereof, wherein the refractive extraction surfaces, total internal reflection extraction surfaces or combinations thereof provide a bidirectional light distribution from the lens.

18. The lens of claim 17, wherein the light extraction side comprises facets including the total internal reflection extraction surfaces.

19. The lens of claim 17, wherein the central refractive region comprises a convex surface.

20. The lens of claim 17, wherein the central refractive region and total internal reflection faces direct light received by the lens to the refractive extraction surfaces and the total internal reflection extraction surfaces.

* * * * *